US010193072B2

(12) United States Patent
Jeong et al.

(10) Patent No.: US 10,193,072 B2
(45) Date of Patent: Jan. 29, 2019

(54) PYRENE-BASED COMPOUND AND ORGANIC LIGHT-EMITTING DIODE COMPRISING THE SAME

(71) Applicant: Samsung Display Co., Ltd., Yongin, Gyeonggi-do (KR)

(72) Inventors: Eun-Jae Jeong, Yongin (KR); Seok-Hwan Hwang, Yongin (KR); Young-Kook Kim, Yongin (KR); Hye-Jin Jung, Yongin (KR); Jun-Ha Park, Yongin (KR); Eun-Young Lee, Yongin (KR); Jin-O Lim, Yongin (KR); Sang-Hyun Han, Yongin (KR); Soo-Yon Kim, Yongin (KR); Jong-Hyuk Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 866 days.

(21) Appl. No.: 13/959,551

(22) Filed: Aug. 5, 2013

(65) Prior Publication Data
US 2014/0239269 A1 Aug. 28, 2014

(30) Foreign Application Priority Data

Feb. 25, 2013 (KR) .................. 10-2013-0020013

(51) Int. Cl.
*C09K 11/06* (2006.01)
*H01L 51/00* (2006.01)
*H01L 51/50* (2006.01)

(52) U.S. Cl.
CPC .......... *H01L 51/0054* (2013.01); *C09K 11/06* (2013.01); *H01L 51/007* (2013.01); *H01L 51/0067* (2013.01); *H01L 51/0069* (2013.01); *H01L 51/0072* (2013.01); *H01L 51/5072* (2013.01); *H01L 2051/0063* (2013.01)

(58) Field of Classification Search
CPC ......... H01L 2051/0063; H01L 51/0054; H01L 51/0067; H01L 51/0069; H01L 51/007; H01L 51/0072; H01L 51/5072; C09K 11/06
See application file for complete search history.

(56) References Cited

U.S. PATENT DOCUMENTS

| | | | |
|---|---|---|---|
| 5,635,308 A | 6/1997 | Inoue et al. | |
| 5,972,247 A | 10/1999 | Shi et al. | |
| 6,465,115 B2 | 10/2002 | Shi et al. | |
| 6,596,415 B2 | 7/2003 | Shi et al. | |
| 7,851,071 B2 | 12/2010 | Yamamoto et al. | |
| 2001/0019782 A1* | 9/2001 | Igarashi | C07F 15/0033 428/690 |
| 2003/0219625 A1* | 11/2003 | Wolk | C09K 11/06 428/690 |
| 2006/0115681 A1* | 6/2006 | Kambe | H01L 51/004 428/690 |
| 2006/0147747 A1 | 7/2006 | Yamamoto et al. | |
| 2008/0193796 A1* | 8/2008 | Arakane | C09K 11/06 428/690 |
| 2009/0096356 A1* | 4/2009 | Murase | C09K 11/06 313/504 |
| 2011/0315965 A1* | 12/2011 | Takashima | C07D 307/91 257/40 |
| 2014/0183463 A1* | 7/2014 | Lee | H01L 51/0058 257/40 |
| 2015/0069342 A1* | 3/2015 | Lee | H01L 51/0052 257/40 |
| 2015/0090967 A1* | 4/2015 | Lee | C07D 401/14 257/40 |
| 2015/0162540 A1* | 6/2015 | Lim | H01L 51/0058 257/40 |

FOREIGN PATENT DOCUMENTS

| | | |
|---|---|---|
| JP | 08-012600 A | 1/1996 |
| JP | 10-017860 A | 1/1998 |
| JP | 11-087067 A | 3/1999 |
| JP | 2000-003782 A | 1/2000 |
| JP | 2007-208165 A * | 8/2007 |
| JP | 2009-096771 A * | 5/2009 |
| JP | 2010-195708 A * | 9/2010 |
| JP | 2011-204844 A | 10/2011 |
| KR | 10-2009-0072152 A | 7/2009 |
| KR | 10-2010-0009589 A | 1/2010 |
| KR | 10-2010-0054170 A | 5/2010 |
| KR | 10-2012-0083243 A * | 7/2012 |

OTHER PUBLICATIONS

Machine translation for JP 2010-195708 A (publication date Sep. 2010).*
Machine translation for KR publication No. 1020120083243 A (publication date Jul. 2012).*
Machine translation for JP 2009-096771 A (publication date May 2009).*
Machine translation for JP 2009-096771 A (publication date: May 2009) (Year: 2009).*
Johansson et al., "Solid-State Amplified Spontaneous Emission in Some Spiro-Type Molecules: A New Concept for the Design of Solid-State Lasing Molecules," *Adv. Mater.* 1998, 10, No. 14, pp. 1136-1141.
Tao et al., "Sharp green electroluminescence from 1H-pyrazolo[3,4-b]quinoline-based light-emitting diodes," *Appl. Phys. Lett.*, vol. 77, No. 11, Sep. 11, 2000, pp. 1575-1577.

* cited by examiner

*Primary Examiner* — Dawn L Garrett
(74) *Attorney, Agent, or Firm* — Lewis Roca Rothgerber Christie LLP

(57) ABSTRACT

A pyrene-based compound, and an organic light-emitting diode including the pyrene-based compound are provided.

12 Claims, 1 Drawing Sheet

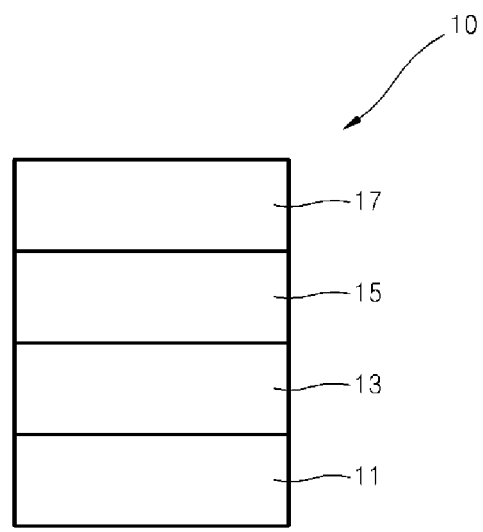

PYRENE-BASED COMPOUND AND ORGANIC LIGHT-EMITTING DIODE COMPRISING THE SAME

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 C.F.R. § 1.57.

This application claims the benefit of Korean Patent Application No. 10-2013-0020013, filed on Feb. 25, 2013, in the Korean Intellectual Property Office, the disclosure of which is incorporated herein by reference.

BACKGROUND

Field

One or more embodiments relate to a compound for organic light-emitting diodes, and an organic light-emitting diode.

Description of the Related Technology

Organic light-emitting diodes (OLEDs), which are self-emitting diodes, have advantages such as wide viewing angles, excellent contrast, quick response, high brightness, excellent driving voltage characteristics, and can provide multicolored images.

A typical OLED has a structure including a substrate, and an anode, a hole transport layer (HTL), an emission layer (EML), an electron transport layer (ETL), and a cathode which are sequentially stacked on the substrate. In this regard, the HTL, the EML, and the ETL are organic thin films comprising organic compounds.

An operating principle of an OLED having the above-described structure is as follows.

When a voltage is applied between the anode and the cathode, holes injected from the anode move to the EML via the HTL, and electrons injected from the cathode move to the EML via the ETL. The holes and electrons recombine in the EML to generate excitons. When the excitons drop from an excited state to a ground state, light is emitted.

SUMMARY

One or more embodiments include a pyrene-based compound having a novel structure, and an organic light-emitting diode including the pyrene-based compound.

Additional aspects will be set forth in part in the description which follows and, in part, will be apparent from the description, or may be learned by practice of the presented embodiments.

According to one or more embodiments, there is provided a pyrene-based compound represented by Formula 1 below:

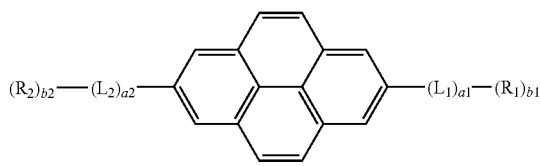

Formula 1 wherein, in Formula 1, $L_1$ and $L_2$ are each independently selected from a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a substituted or unsubstituted $C_2$-$C_{10}$ heterocycloalkenylene group, a substituted or unsubstituted $C_6$-$C_{60}$ arylene group, and a substituted or unsubstituted $C_2$-$C_{60}$ heteroarylene group;

$R_1$ is selected from a substituted or unsubstituted N-containing 5-membered cyclic group, and a substituted or unsubstituted N-containing 5-membered cyclic group fused with a 6-membered ring;

$R_2$ is selected from a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthiol group, a substituted or unsubstituted $C_2$-$C_{60}$ heteroaryl group, —N($Q_1$)($Q_2$), and —Si($Q_3$)($Q_4$)($Q_5$) (where $Q_1$ to $Q_5$ are each independently a $C_1$-$C_{60}$ alkyl group, a $C_1$-$C_{60}$ alkoxy group, a $C_6$-$C_{60}$ aryl group, or a $C_2$-$C_{60}$ heteroaryl group);

a1 and b1 are each independently an integer from 1 to 5; and a2 and b2 are each independently an integer from 0 to 5.

According to one or more embodiments, an organic light-emitting diode includes: a first electrode; a second electrode disposed opposite to the first electrode; and an organic layer disposed between the first electrode and the second electrode and including an emission layer, wherein the organic layer includes a hole transport region between the first electrode and the emission layer, and an electron transport region between the emission layer and the second electrode, and the organic layer includes at least one of the pyrene-based compounds of Formula 1 defined above.

BRIEF DESCRIPTION OF THE DRAWINGS

These and/or other aspects will become apparent and more readily appreciated from the following description of the embodiments, taken in conjunction with the accompanying drawing in which:

The FIGURE is a schematic view of a structure of an organic light-emitting diode according to an embodiment.

DETAILED DESCRIPTION

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the FIGURES, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

According to an embodiment, there is provided a pyrene-based compound represented by Formula 1 below:

Formula 1

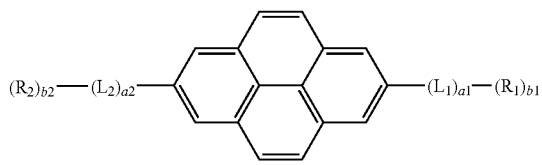

In Formula 1, $L_1$ and $L_2$ may each independently be selected from a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a substituted or unsubstituted $C_2$-$C_{10}$ heterocycloalkenylene group, a substituted or unsubstituted $C_6$-$C_{60}$ arylene group, and a substituted or unsubstituted $C_2$-$C_{60}$ heteroarylene group.

In some embodiments, $L_1$ and $L_2$ may each independently be selected from i) a phenylene group, a pentalenylene group, an indenylene group, a naphthylene group, an azulenylene group, a heptalenylene group, an indacenylene group, an acenaphthylene group, a fluorenylene group, a spiro-fluorenylene group, a phenalenylene group, a phenanthrenylene group, an anthrylene group, a fluoranthenylene group, a triphenylenylene group, a pyrenylene group, a chrysenylene group, a naphthacenylene group, a picenylene group, a perylenylene group, a pentaphenylene group, a hexacenylene group, a pyrrolylene group, an imidazolylene group, a pyrazolylene group, a pyridinylene group, a pyrazinylene group, a pyrimidinylene group, a pyridazinylene group, an isoindolylene group, an indolylene group, an indazolylene group, a purinylene group, a quinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzooxazolylene group, a benzoimidazolylene group, a furanylene group, a benzofuranylene group, a thiophenylene group, a benzothiophenylene group, a thiazolylene group, an isothiazolylene group, a benzothiazolylene group, an isoxazolylene group, an oxazolylene group, a triazolylene group, a tetrazolylene group, an oxadiazolylene group, a triazinylene group, a benzooxazolylene group, a dibenzopuranylene group, a dibenzothiophenylene group, a benzocarbazolylene group, and a dibenzosilolylene group; and ii) a phenylene group, a pentalenylene group, an indenylene group, a naphthylene group, an azulenylene group, a heptalenylene group, an indacenylene group, an acenaphthylene group, a fluorenylene group, a spiro-fluorenylene group, a phenalenylene group, a phenanthrenylene group, an anthrylene group, a fluoranthenylene group, a triphenylenylene group, a pyrenylene group, a chrysenylene group, a naphthacenylene group, a picenylene group, a perylenylene group, a pentaphenylene group, a hexacenylene group, a pyrrolylene group, an imidazolylene group, a pyrazolylene group, a pyridinylene group, a pyrazinylene group, a pyrimidinylene group, a pyridazinylene group, an isoindolylene group, an indolylene group, an indazolylene group, a purinylene group, a quinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzooxazolylene group, a benzoimidazolylene group, a furanylene group, a benzofuranylene group, a thiophenylene group, a benzothiophenylene group, a thiazolylene group, an isothiazolylene group, a benzothiazolylene group, an isoxazolylene group, an oxazolylene group, a triazolylene group, a tetrazolylene group, an oxadiazolylene group, a triazinylene group, a benzooxazolylene group, a dibenzopuranylene group, a dibenzothiophenylene group, a benzocarbazolylene group, and a dibenzosilolylene group, each substituted with at least one selected from a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group, a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof, a $C_6$-$C_{20}$ aryl group and a $C_2$-$C_{20}$ heteroaryl group, and a $C_6$-$C_{20}$ aryl group and a $C_2$-$C_{20}$ heteroaryl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group.

In some embodiments, $L_1$ and $L_2$ may each independently be one of the groups represented by Formulae 2-1 to 2-27 below:

Formula 2-1

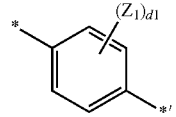

Formula 2-2

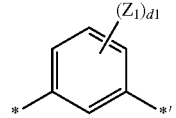

Formula 2-3

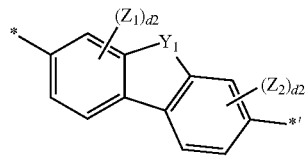

-continued
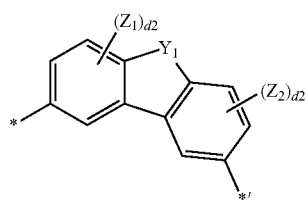
Formula 2-4
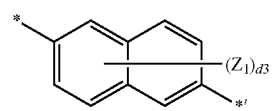
Formula 2-5
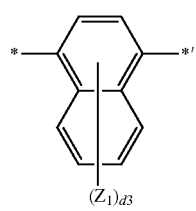
Formula 2-6
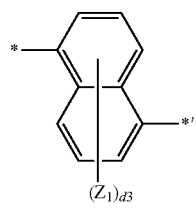
Formula 2-7
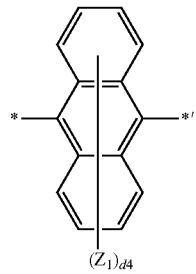
Formula 2-8
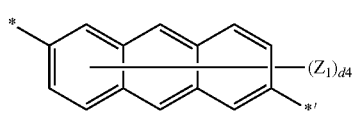
Formula 2-9
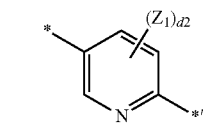
Formula 2-10
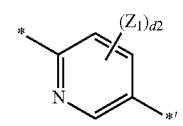
Formula 2-11
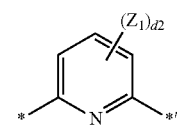
Formula 2-12
-continued
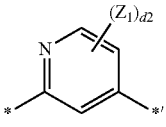
Formula 2-13
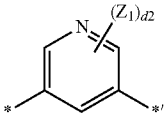
Formula 2-14
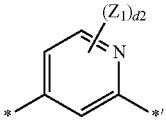
Formula 2-15
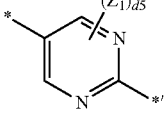
Formula 2-16
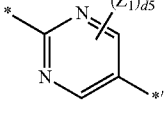
Formula 2-17
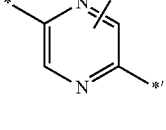
Formula 2-18
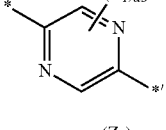
Formula 2-19
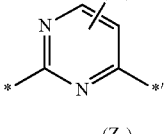
Formula 2-20
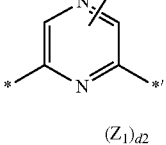
Formula 2-21
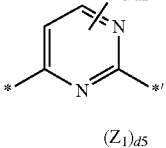
Formula 2-22
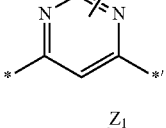
Formula 2-23
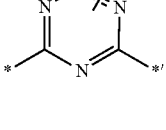
Formula 2-24

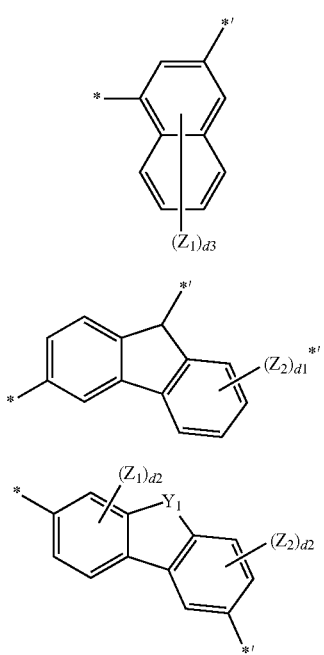

Formula 2-25

Formula 2-26

Formula 2-27

In Formulae 2-1 to 2-27, $Y_1$ may be O, S, $C(Z_3)(Z_4)$, or $N(Z_5)$;

$Z_1$ to $Z_5$ may each independently be selected from a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group, a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof, a $C_6$-$C_{20}$ aryl group and a $C_2$-$C_{20}$ heteroaryl group, a $C_6$-$C_{20}$ aryl group and a $C_2$-$C_{20}$ heteroaryl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group, and —Si($Q_{13}$)($Q_{14}$)($Q_{15}$) (where $Q_{13}$ to $Q_{15}$ are each independently a $C_1$-$C_{20}$ alkyl group, a $C_1$-$C_{20}$ alkoxy group, a $C_6$-$C_{20}$ aryl group, or a $C_2$-$C_{20}$ heteroaryl group);

d1 may be an integer from 1 to 4;
d2 may be an integer from 1 to 3;
d3 may be an integer from 1 to 6;
d4 may be an integer from 1 to 8;
d5 may be 1 or 2;

\* indicates a binding site of pyrene in Formula 1 or a binding site of adjacent $L_1$; and \*' indicates a binding site of adjacent $L_1$ in Formula 1 or a binding site of $R_1$.

In some embodiments, in Formulae 2-1 to 2-27, $Z_1$ to $Z_5$ may each independently be selected from a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group, a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof, a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group, and Si($Q_{13}$)($Q_{14}$)($Q_{15}$) (where $Q_{13}$ to $Q_{15}$ are each independently a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group).

In some other embodiments, $L_1$ and $L_2$ in Formula 1 above may each independently be one of the groups represented by Formulae 3-1 to 3-20:

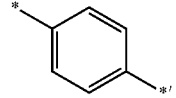

Formula 3-1

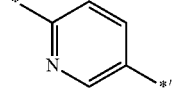

Formula 3-2

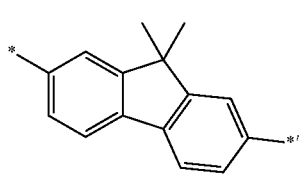

Formula 3-3

-continued

Formula 3-4

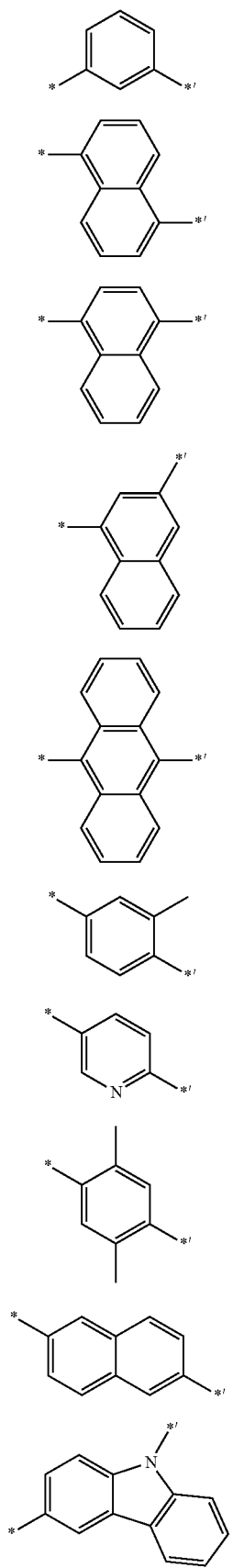

Formula 3-5

Formula 3-6

Formula 3-7

Formula 3-8

Formula 3-9

Formula 3-10

Formula 3-11

Formula 3-12

Formula 3-13

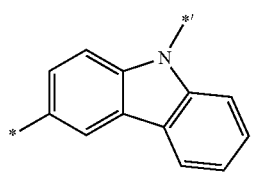

-continued

Formula 3-14

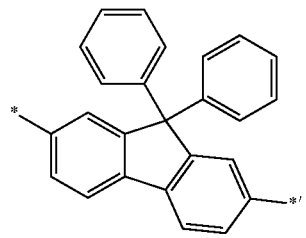

Formula 3-15

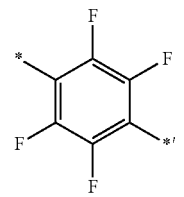

Formula 3-16

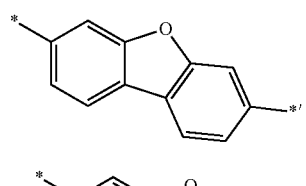

Formula 3-17

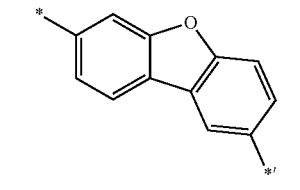

Formula 3-18

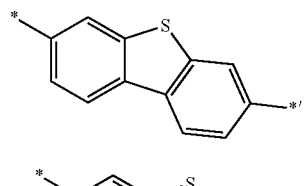

Formula 3-19

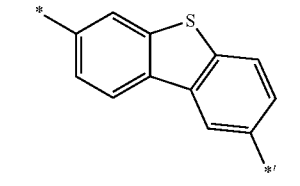

Formula 3-20

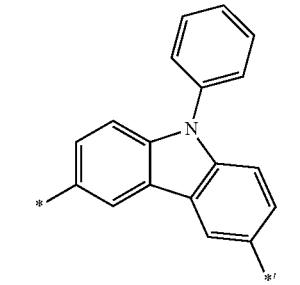

In Formulae 3-1 to 3-20, * may be a binding site of pyrene in Formula 1 or a binding site of adjacent $L_1$; and *' may be a binding site of adjacent $L_1$ in Formula 1 or a binding site of $R_1$.

In Formula 1, a1 indicates the number of $L_1$, and a2 indicates the number of $L_2$s. For example, a1 may be an integer from 1 to 5, and a2 may be an integer from 0 to 5. Since a1 is nonzero, $L_1$ is always present in Formula 1. For example, a1 may be 1 or 2, and a2 may be 0, 1, or 2. When a2 is 0, $R_2$ may be directly bound to the $7^{th}$ carbon of the pyrene core in Formula 1. When a1 is 2 or greater, the two or more $L_1$s may be identical to or differ from each other. When a2 is 2 or greater, the two or more $L_2$s may be identical to or differ from each other.

In Formula 1, $R_1$ may be selected from a substituted or unsubstituted N-containing 5-membered cyclic group, and a substituted or unsubstituted N-containing 5-membered cyclic group fused with a 6-membered ring.

For example, $R_1$ may be one of the groups represented by Formulae 4-1 to 4-10:

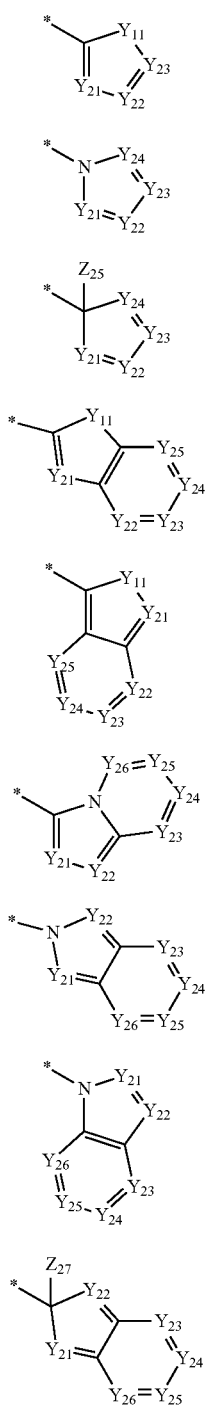

Formula 4-1
Formula 4-2
Formula 4-3
Formula 4-4
Formula 4-5
Formula 4-6
Formula 4-7
Formula 4-8
Formula 4-9

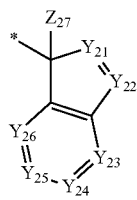

Formula 4-10

In Formulae 4-1 to 4-10,
$Y_{11}$ may be O, S, N($Z_{ii}$), or C($Z_{12}$)($Z_{13}$);
$Y_{21}$ may be N or C($Z_{21}$);
$Y_{22}$ may be N or C($Z_{22}$);
$Y_{23}$ may be N or C($Z_{23}$);
$Y_{24}$ may be N or C($Z_{24}$);
$Y_{25}$ may be N or C($Z_{25}$);
$Y_{26}$ may be N or C($Z_{26}$);
$Z_{11}$ to $Z_{13}$, and $Z_{21}$ to $Z_{27}$ may each independently be selected from a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group, a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof, a $C_6$-$C_{20}$ aryl group and a $C_2$-$C_{20}$ heteroaryl group, a $C_6$-$C_{20}$ aryl group and a $C_2$-$C_{20}$ heteroaryl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group, and —Si(Q13)(Q14)(Q15) (where Q13 to Q15 are each independently a C1-C20 alkyl group, a C1-C20 alkoxy group, a C6-C20 aryl group, or a C2-C20 heteroaryl group); and

* may be a binding site of $L_1$ in Formula 1.

In some embodiments, $Z_{11}$ to $Z_{13}$, and $Z_{21}$ to $Z_{27}$ in Formulae 4-1 to 4-10 may each independently be selected from a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group, a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof, a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group, and —Si($Q_{13}$)($Q_{14}$)($Q_{15}$) (where $Q_{13}$ to $Q_{15}$ are each independently a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group).

In some embodiments, $R_1$ in Formula 1 may be selected from i) a pyrrolyl group, an imidazolyl group, a pyrazolyl group, a triazolyl group, an oxazolyl group, an isoxazolyl group, an oxadiazolyl group, an oxatriazolyl group, a triazolyl group, an isothiazolyl group, a thiazolyl group, a thiatriazolyl group, a benzoimidazolyl group, an imidazopyrimidinyl group, an imidazopyridinyl group, a benzooxazolyl group, and a benzothiazolyl group; and ii) a pyrrolyl group, an imidazolyl group, a pyrazolyl group, a triazolyl group, an oxazolyl group, an isoxazolyl group, an oxadiazolyl group, an oxatriazolyl group, a triazolyl group, an isothiazolyl group, a thiazolyl group, a thiatriazolyl group, a benzoimidazolyl group, an imidazopyrimidinyl group, an imidazopyridinyl group, a benzooxazolyl group, and a benzothiazolyl group, each substituted with at least one selected from a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group, a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof, a $C_6$-$C_{20}$ aryl group and a $C_2$-$C_{20}$ heteroaryl group, a $C_6$-$C_{20}$ aryl group and a $C_2$-$C_{20}$ heteroaryl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group, and —Si($Q_{13}$)($Q_{14}$)($Q_{15}$) (where $Q_{13}$ to $Q_{15}$ are each independently a $C_1$-$C_{20}$ alkyl group, a $C_1$-$C_{20}$ alkoxy group, a $C_6$-$C_{20}$ aryl group or a $C_2$-$C_{20}$ heteroaryl group).

In some other embodiments, $R_1$ in Formula 1 may be selected from i) a pyrrolyl group, an imidazolyl group, a pyrazolyl group, a triazolyl group, an oxazolyl group, an isoxazolyl group, an oxadiazolyl group, an oxatriazolyl group, a triazolyl group, an isothiazolyl group, a thiazolyl group, a thiatriazolyl group, a benzoimidazolyl group, an imidazopyrimidinyl group, an imidazopyridinyl group, a benzooxazolyl group, and a benzothiazolyl group; and ii) a pyrrolyl group, an imidazolyl group, a pyrazolyl group, a triazolyl group, an oxazolyl group, an isoxazolyl group, an oxadiazolyl group, an oxatriazolyl group, a triazolyl group, an isothiazolyl group, a thiazolyl group, a thiatriazolyl group, a benzoimidazolyl group, an imidazopyrimidinyl group, an imidazopyridinyl group, a benzooxazolyl group, and a benzothiazolyl group, each substituted with at least one selected from a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group, a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof, a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group, and —Si($Q_{13}$)($Q_{14}$)($Q_{15}$) (where $Q_{13}$ to $Q_{15}$ are each independently a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group). However, the present embodiments are not limited thereto For example, $R_1$ in Formula 1 may be one of the groups represented by Formulae 4-1(1), 4-1(2), 4-1(3), 4-2(1), 4-4(1), 4-4(2), 4-4(3), 4-6(1), 4-6(2), and 4-8(1):

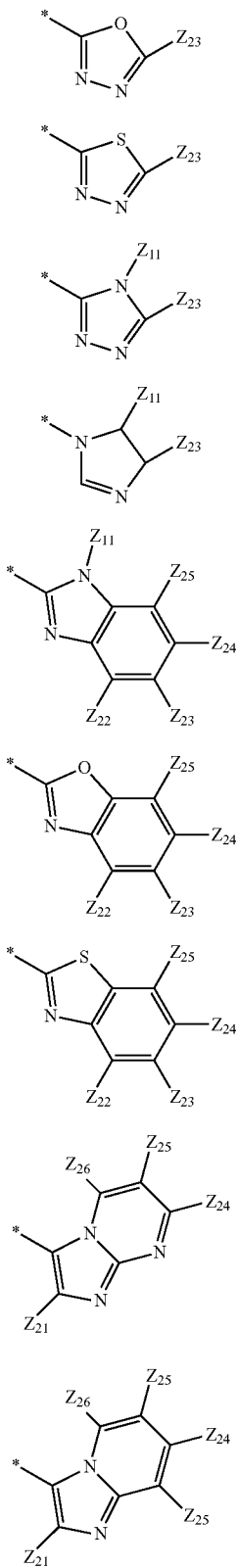

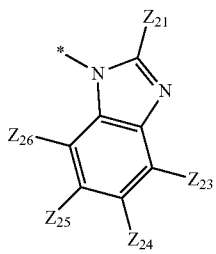

The above-detailed descriptions of $Z_{11}$ and $Z_{21}$, and $Z_{21}$ to $Z_{26}$ may be referred to here as those of $Z_{11}$ and $Z_{21}$, and $Z_{21}$ to $Z_{26}$ in Formulae 4-1(1), 4-1(2), 4-1(3), 4-2(1), 4-4(1), 4-4(2), 4-4(3), 4-6(1), 4-6(2), and 4-8(1).

For example, $Z_{11}$ and $Z_{21}$ to $Z_{26}$ may each independently be selected from a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group, a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof, a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group, and —Si($Q_{13}$)($Q_{14}$)($Q_{15}$) (where $Q_{13}$ to $Q_{15}$ are each independently a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group).

In Formula 1, $R_2$ may be selected from a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthiol group, a substituted or unsubstituted $C_2$-$C_{60}$ heteroaryl group, —N($Q_1$)($Q_2$), and —Si($Q_3$)($Q_4$)($Q_5$) (where $Q_1$ to $Q_5$ are each independently a $C_1$-$C_{60}$ alkyl group, a $C_1$-$C_{60}$ alkoxy group, a $C_6$-$C_{60}$ aryl group, or a $C_2$-$C_{60}$ heteroaryl group).

In some embodiments, $R_2$ in Formula 1 may be selected from a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group, a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof, a $C_6$-$C_{20}$ aryl group and a $C_2$-$C_{20}$ heteroaryl group, a $C_6$-$C_{20}$ aryl group and a $C_2$-$C_{20}$ heteroaryl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group, and —Si($Q_3$)($Q_4$)($Q_5$) (where $Q_3$ to $Q_5$ are each independently a $C_1$-$C_{60}$ alkyl group, a $C_1$-$C_{60}$ alkoxy group, a $C_6$-$C_{60}$ aryl group, or a $C_2$-$C_{60}$ heteroaryl group). However, the present embodiments are not limited thereto.

In some embodiments, $R_2$ in Formula 1 may be selected from a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group, a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof, a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, an isoquinolinyl group, a quinoxalinyl group, a dibenzofuranyl group, and a dibenzothiophenyl group, a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, an isoquinolinyl group, a quinoxalinyl group, a dibenzofuranyl group, and a dibenzothiophenyl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group, and —Si($Q_3$)($Q_4$)($Q_5$) (where $Q_3$ to $Q_5$ are each independently a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group).

In Formula 1, b1 indicates the number of $R_1$s, and b2 indicates the number of $R_2$s. For example, b1 may be an integer from 1 to 5, and b2 may be an integer from 0 to 5. Since b1 is nonzero, $R_1$ is always present in Formula 1. For example, b1 may be 1 or 2, and b2 may be 0, 1, or 2. When b1 is 2 or greater, the two or more $R_1$s may be identical to or differ from each other. When b2 is 2 or greater, the two or more $R_2$s may be identical to or differ from each other.

In some other embodiments, $R_2$ in Formula 1 may be selected from a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group, a $C_1$-$C_{20}$ alkyl group and a $C_1$-$C_{20}$ alkoxy group, each substitute with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof, groups represented by Formulae 5-1 to 5-22 below, and —Si($Q_3$)($Q_4$)($Q_5$) (where $Q_3$ to $Q_5$ are each independently a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group).

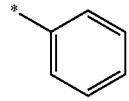

Formula 5-1

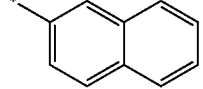

Formula 5-2

-continued
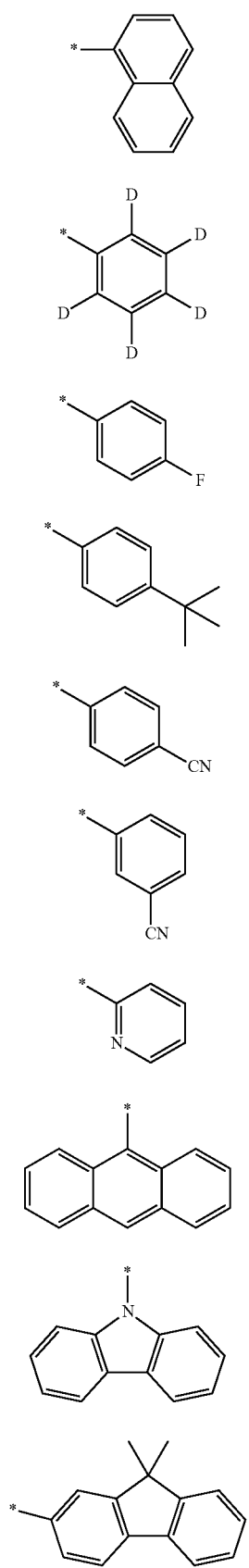
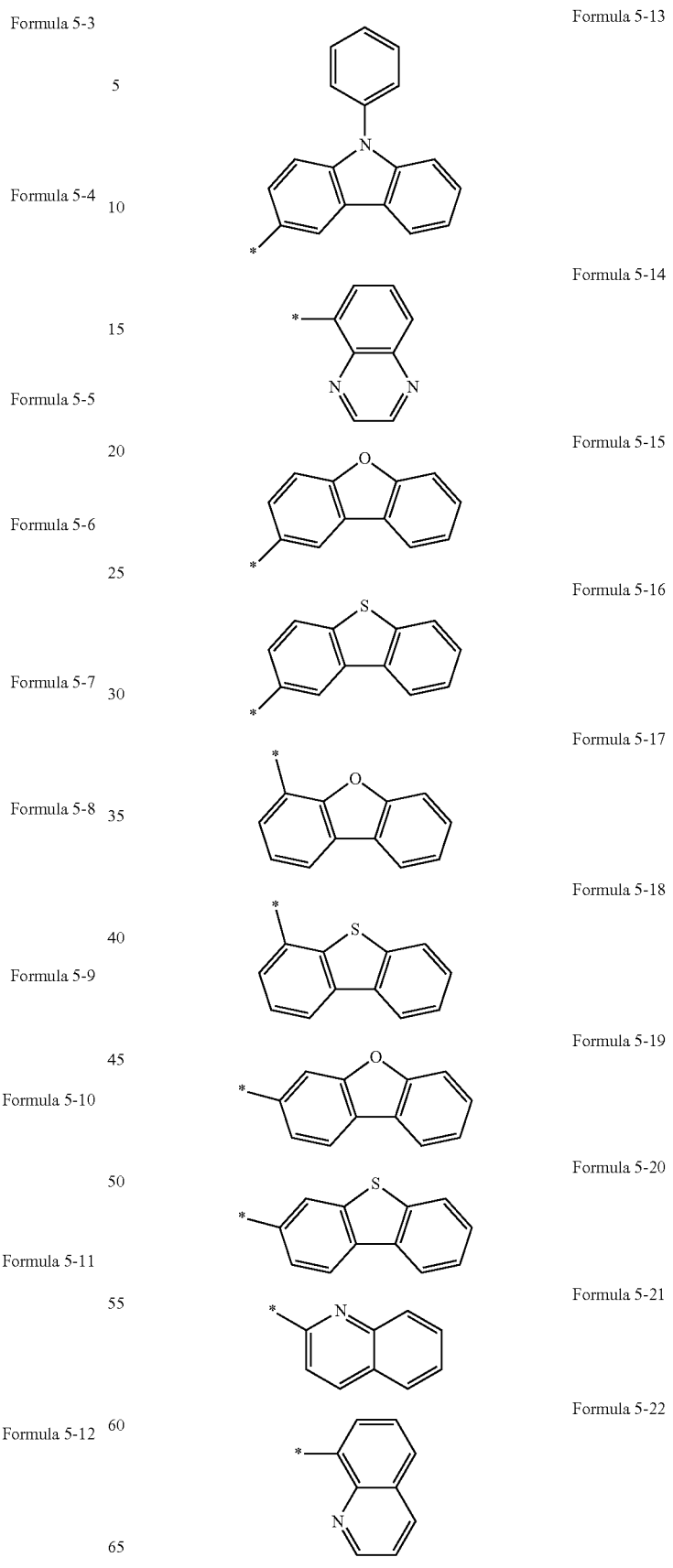

For example, in Formula 1, a1 may be 1, b1 may be 1, a2 may be 0, and b2 may be 1, but the present embodiments are not limited thereto.

In some other embodiments, in Formula 1 above, i) $L_1$ may be one of the groups represented by Formulae 2-1 to 2-27 (for example, one of the groups represented by Formulae 3-1 to 3-20 above);

ii) a1 may be 1 or 2;

iii) $R_1$ may be one of the groups represented by Formulae 4-1 to 4-10 above (for example, one of the groups represented by Formulae 4-1(1), 4-1(2), 4-1(3), 4-2(1), 4-4(1), 4-4(2), 4-4(3), 4-6(1), 4-6(2), and 4-8(1));

iv) b1 may be 1;

v) a2 may be 0 or 1;

vi) $R_2$ may be selected from a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group, a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof, a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, an isoquinolinyl group, a quinoxalinyl group, dibenzopuranyl group, and a dibenzothiophenyl group, a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, an isoquinolinyl group, a quinoxalinyl group, a dibenzopuranyl group, and a dibenzothiophenyl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group, and —Si($Q_3$)($Q_4$)($Q_5$) (where $Q_3$ to $Q_5$ are each independently a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group) (for example, $R_2$ may be selected from the groups represented by Formulae 5-1 to 5-22), and vii) $b_2$ may be 1.

In some embodiments, in Formula 1, $L_1$ and $L_2$ in Formula 1 may each independently be one of the groups represented by Formulae 2-1 to 2-27 (for example, one of the groups represented by Formulae 3-1 to 3-20); $R_1$ and $R_2$ may each independently be one of the groups represented by Formulae 4-1 to 4-10 (for example, one of the groups represented by Formulae 4-1(1), 4-1(2), 4-1(3), 4-2(1), 4-4(1), 4-4(2), 4-4(3), 4-6(1), 4-6(2), and 4-8(1)); and a1, a2, b1, and b2 may each independently be 1 or 2.

In some other embodiments, in Formula 1, $L_1$ may be identical to $L_2$, $R_1$ may be identical to $R_2$, a1 may be identical to a2, and b1 may be identical to b2. In this regards, $L_1$ and $L_2$ may be one of the groups represented by Formulae 2-1 to 2-27 (for example, one of the groups represented by Formulae 3-1 to 3-20 above); $R_1$ and $R_2$ may be one of the groups represented by Formulae 4-1 to 4-10 (for example, one of the groups represented by Formulae 4-1(1), 4-1(2), 4-1(3), 4-2(1), 4-4(1), 4-4(2), 4-4(3), 4-6(1), 4-6(2), and 4-8(1)); and a1, a2, b1, and b2 may be 1.

In some embodiments, the pyrene-based compound of Formula 1 may be one of Compounds 1 to 60 below, but is not limited thereto:

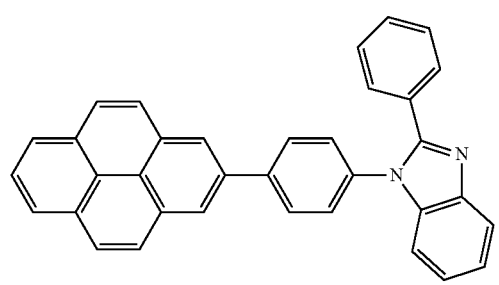

1

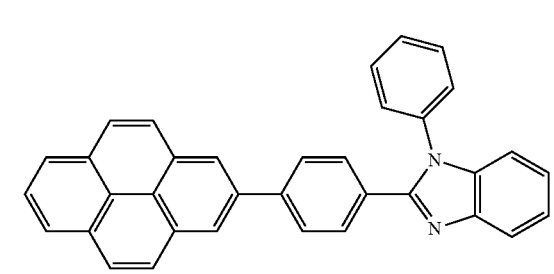

2

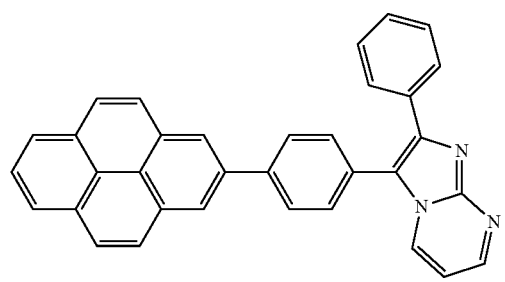

3

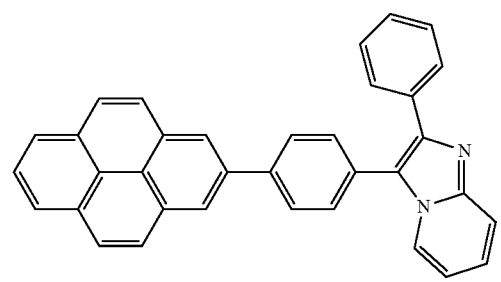

4

-continued
5
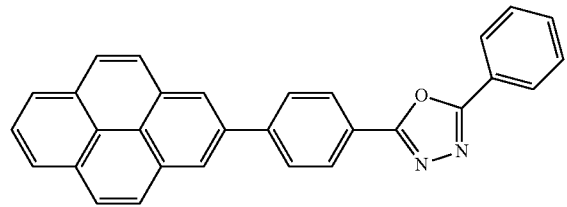
6
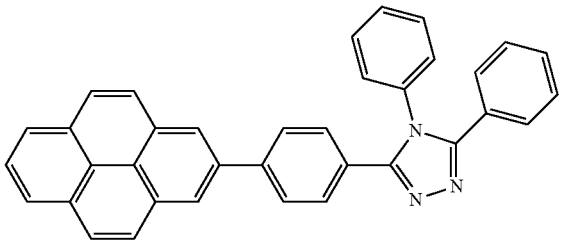
7
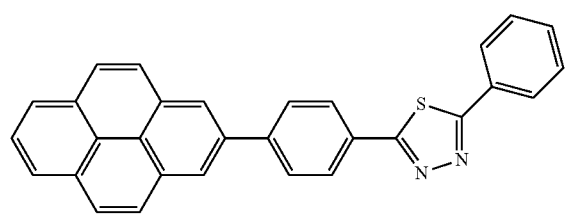
8
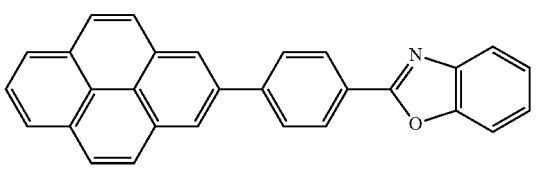
9
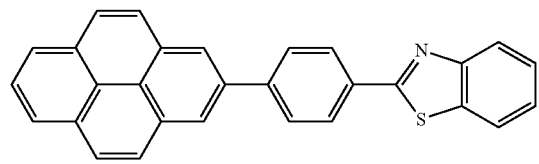
10
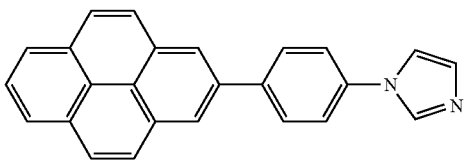
11
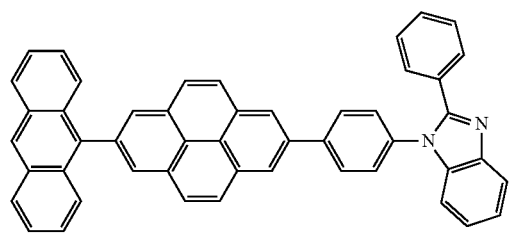
12
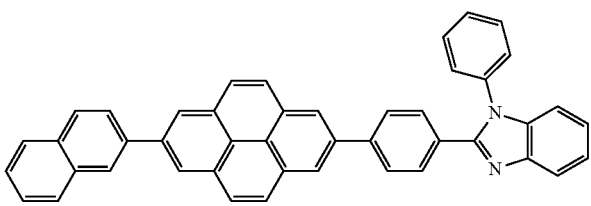
13
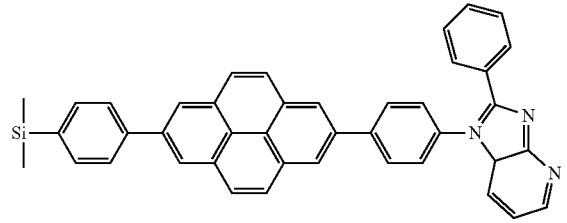
14
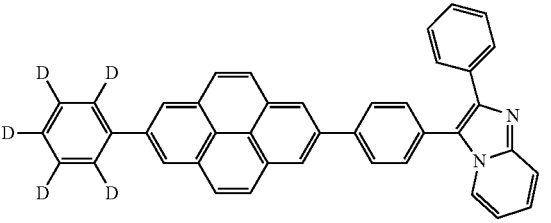
15
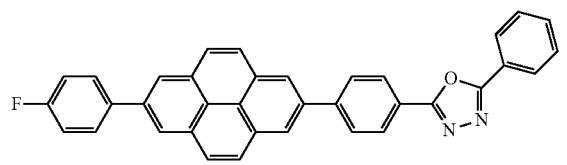
16
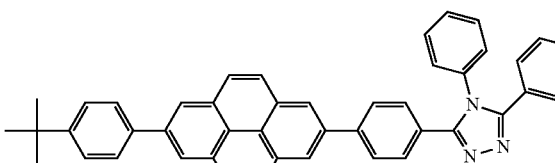
17
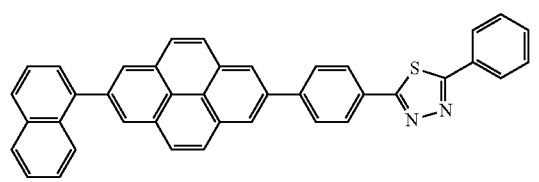
18
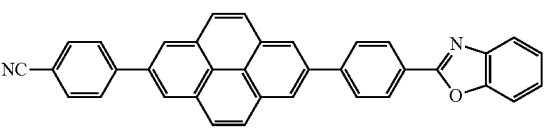

-continued
19
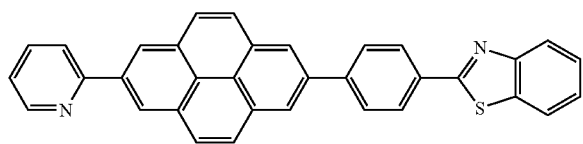
20
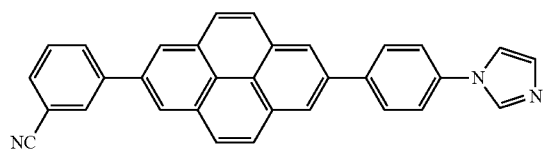
21
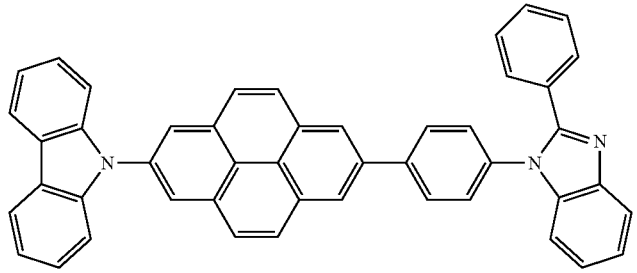
22
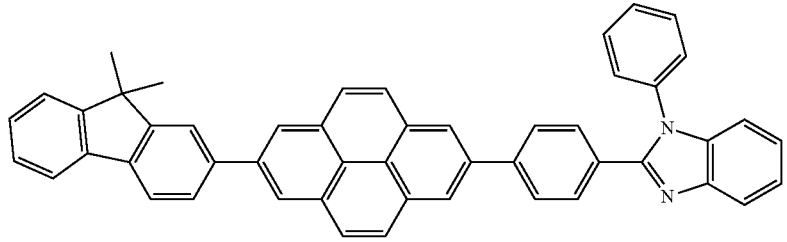
23
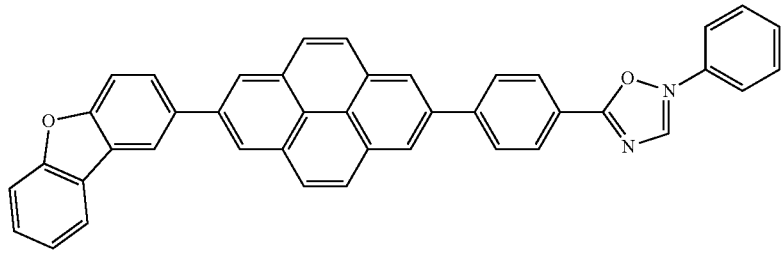
24
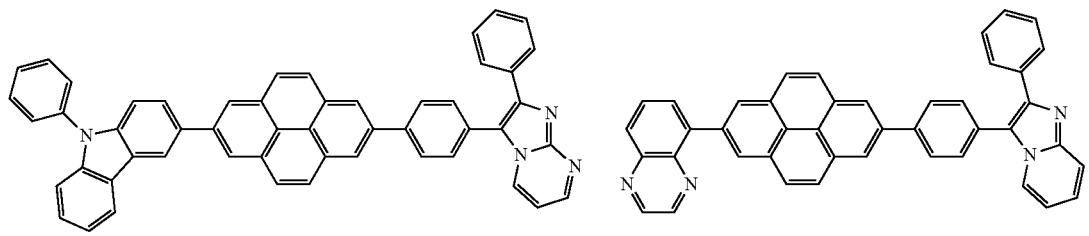
25
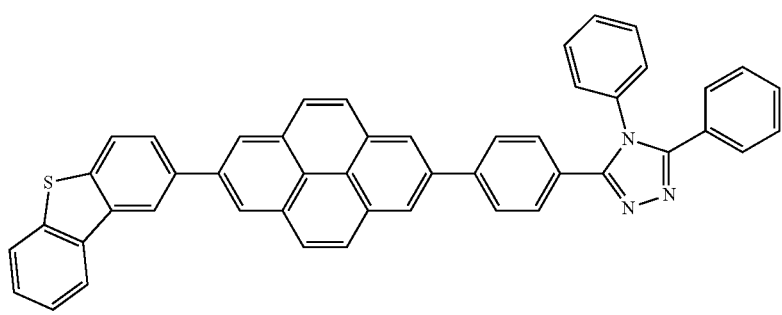
26

-continued
27
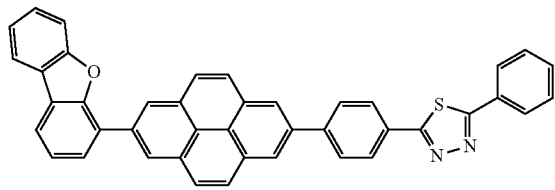
28
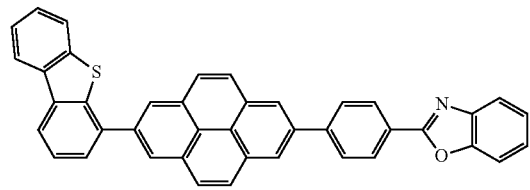
29
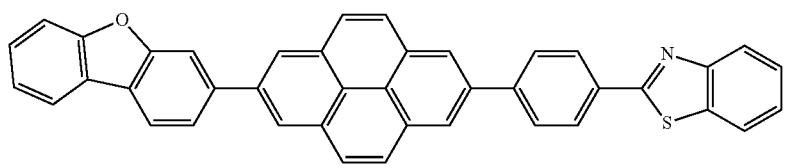
30
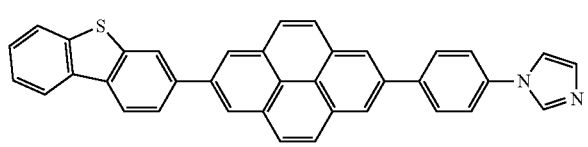
31
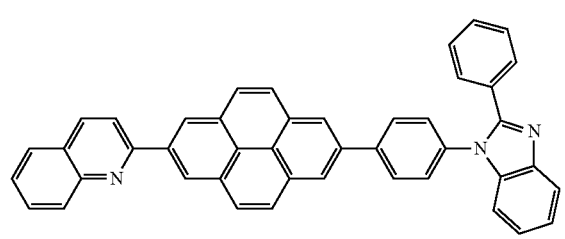
32
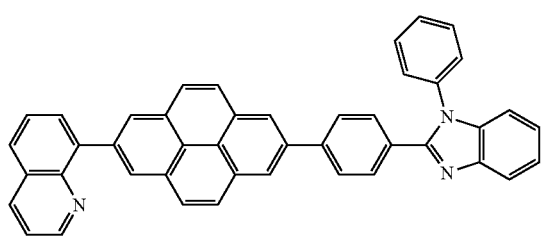
33
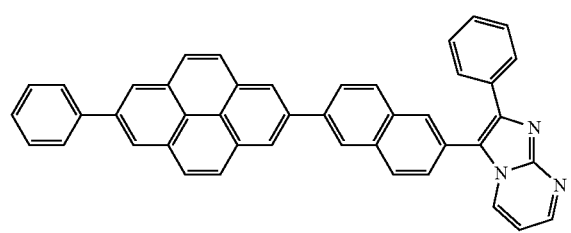
34
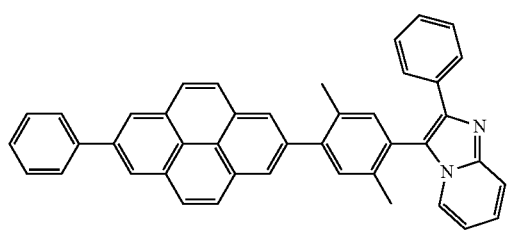
35
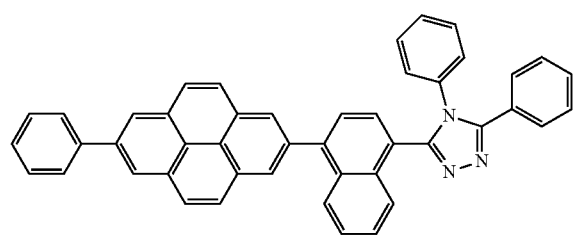
36
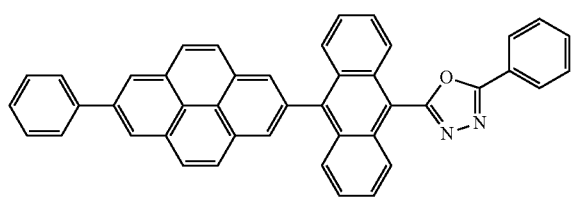
37
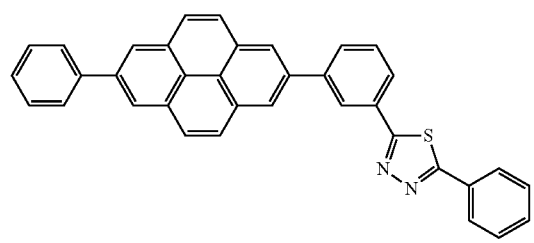
38
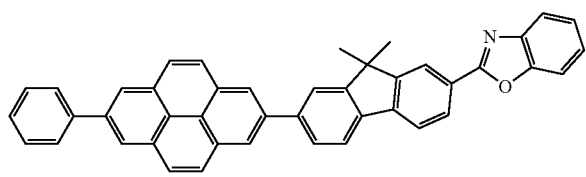
39
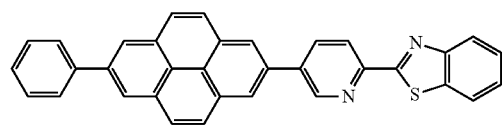

-continued
40
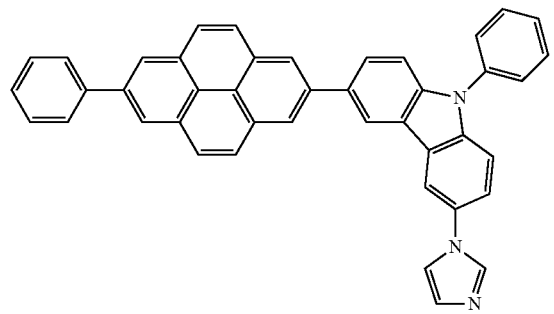
41
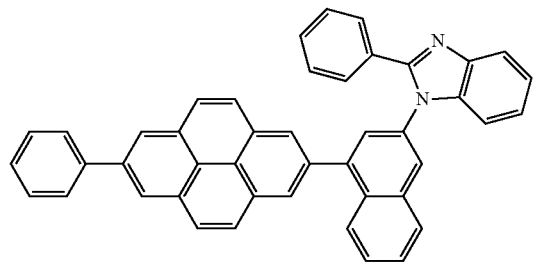
42
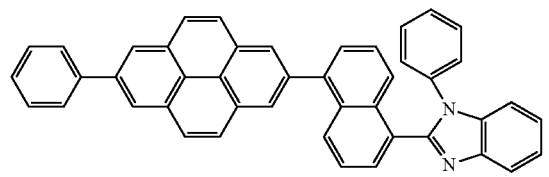
43
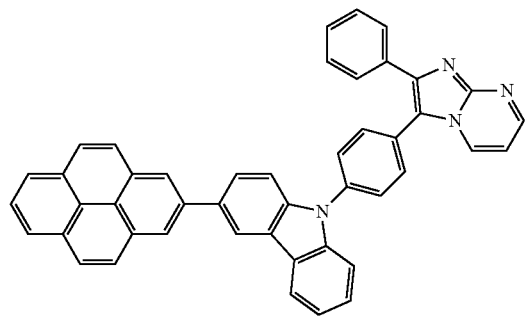
44
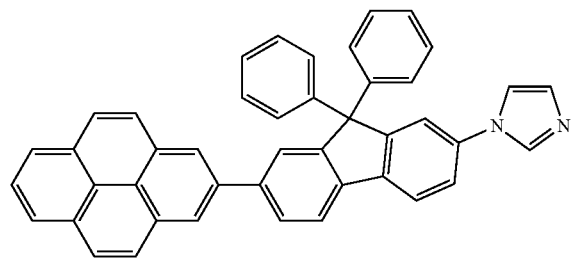
45
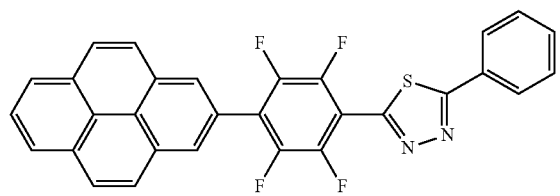
46
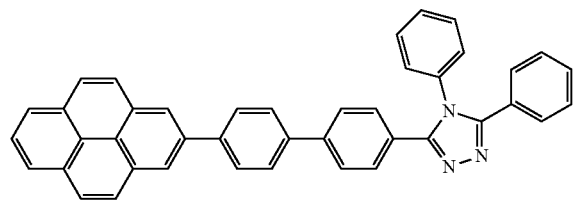
47
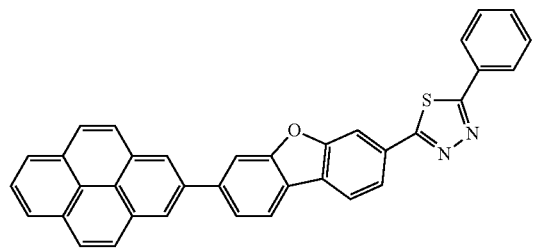
48
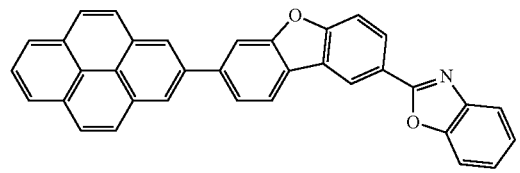
49
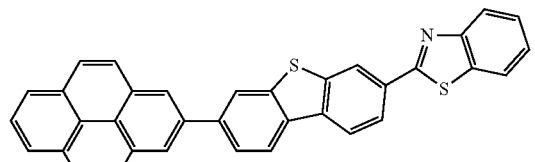
50
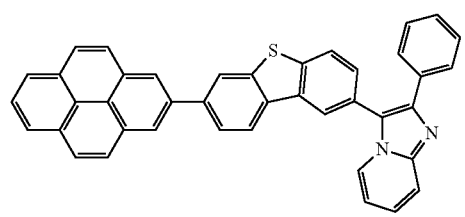
51
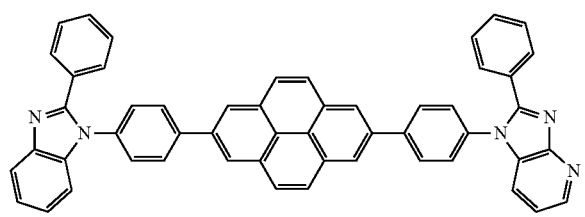

52
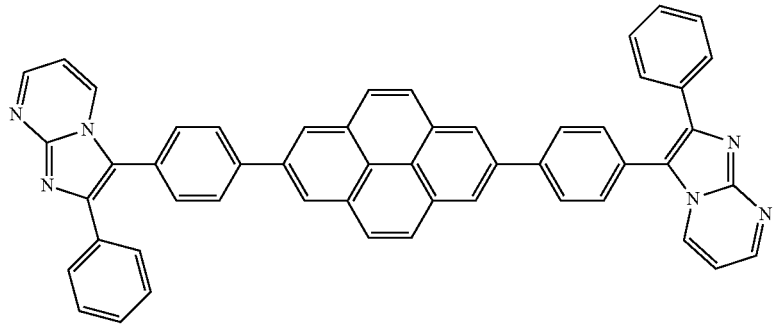
53
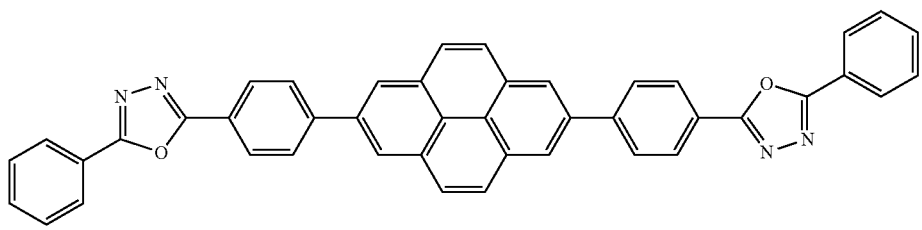
54
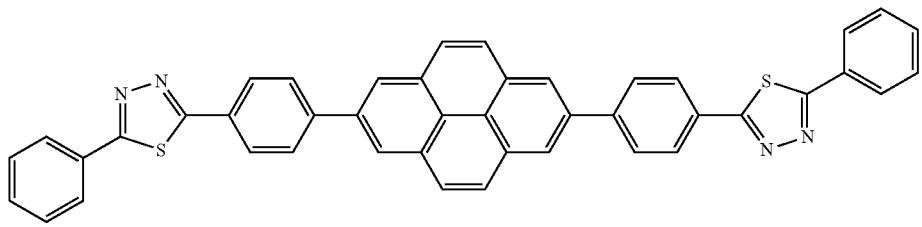
55
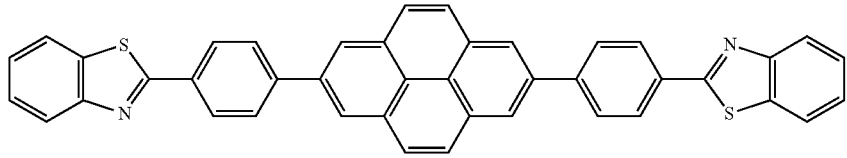
56
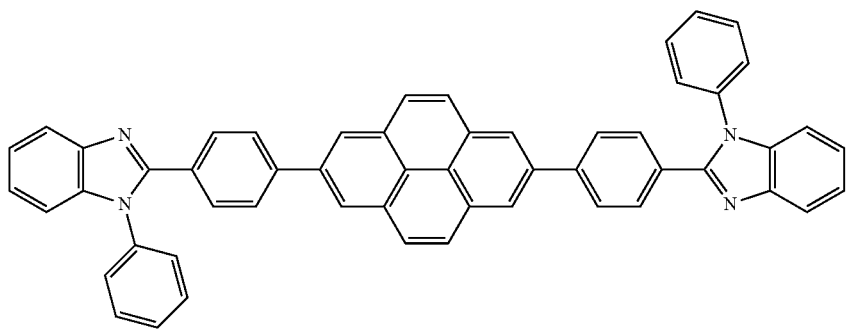
57
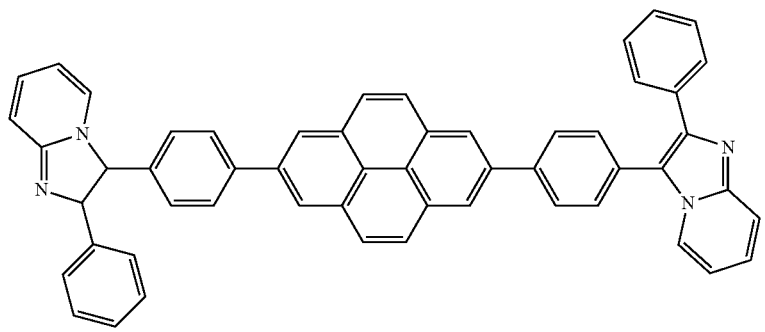

-continued

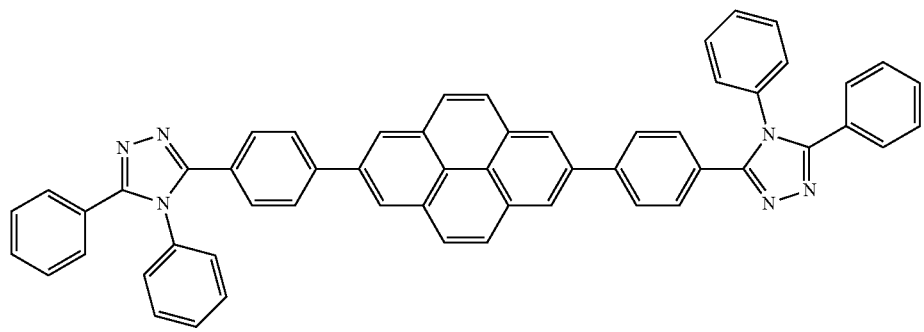

58

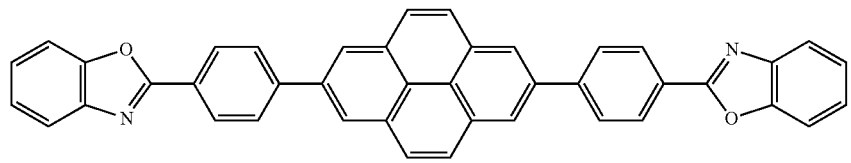

59

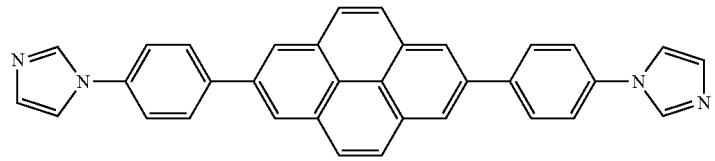

60

At least one of the substituted $C_3$-$C_{10}$ cycloalkylene group, the substituted $C_2$-$C_{10}$ heterocycloalkylene group, the substituted $C_3$-$C_{10}$ cycloalkenylene group, the substituted $C_2$-$C_{10}$ heterocycloalkenylene group, the substituted $C_6$-$C_{60}$ arylene group, the substituted $C_2$-$C_{60}$ heteroarylene group, the substituted $C_3$-$C_{10}$ cycloalkyl group, the substituted $C_2$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_2$-$C_{60}$ heteroaryl group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_6$-$C_{60}$ aryloxy group, and the substituted $C_6$-$C_{60}$ arylthio group may be selected from a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, $C_1$-$C_{60}$ alkyl group, a $C_2$-$C_{60}$ alkenyl group, a $C_2$-$C_{60}$ alkynyl group, and a $C_1$-$C_{60}$ alkoxy group, a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group, and —Si($Q_{13}$)($Q_{14}$)($Q_{15}$) (where $Q_{13}$ to $Q_{15}$ are each independently a $C_1$-$C_{60}$ alkyl group, a $C_1$-$C_{60}$ alkoxy group, a $C_6$-$C_{60}$ aryl group, or a $C_2$-$C_{60}$ heteroaryl group), but the present embodiments are not limited thereto.

In Formula 1, $R_1$ is connected to the $2^{nd}$ carbon of the pyrene core via the linker $L_1$.

As used herein, "$R_1$" may be a N-containing 5-membered cyclic group or a N-containing 5-membered cyclic group fused with a 6-membered ring, so that an organic light-emitting diode including the pyrene-based compound of Formula 1 may have a lower driving voltage.

In the pyrene-based compound of Formula 1, at least one linker $L_1$ is necessarily bound between $R_1$ and the $2^{nd}$ carbon of the pyrene core. Since the electron-rich pyrene core is separated from the electron-deficient $R_1$ by the linker $L_1$, the pyrene-based compound of Formula 1 may have a large gap between the highest occupied molecular orbital (HOMO) and the lowest unoccupied molecular orbital, which consequently may increase a molecular dipole moment. The pyrene-based compound of Formula 1 is apt to be oriented into layers, and thus an organic light-emitting diode including the pyrene-based compound of Formula 1 may have a lower driving voltage and improved lifetime.

Since $R_1$ in Formula 1 is bound to the "$2^{nd}$ carbon of the pyrene core" via the linker $L_1$, an organic light-emitting diode including the pyrene-based compound of Formula 1 may have improved lifetime.

Therefore, an organic light-emitting diode including the pyrene-based compound of Formula 1 above may have a low driving voltage, a high efficiency, a high luminance, and a long lifetime.

The pyrene-based compound of Formula 1 may be synthesized by using organic synthesis. A synthesis method of the pyrene-based compound of Formula 1 may be understood by those of ordinary skill in the art from the examples that will be described below.

The pyrene-based compound of Formula 1 above may be used between a pair of electrodes of an organic light-emitting diode. For example, the pyrene-based compound of Formula 1 may be present in an emission layer and/or an electron transport region between the emission layer and a cathode (for example, a hole blocking layer, an electron injection layer, an electron transport layer, or the like).

According to another embodiment, an organic light-emitting diode includes a first electrode, a second electrode disposed opposite to the first electrode, and an organic layer disposed between the first electrode and the second electrode, wherein the organic layer includes at least one of the pyrene-based compounds of Formula 1 described above. The organic layer may include a hole transport region between the first electrode and an emission layer, and an electron transport region between the emission layer and the second electrode. The pyrene-based compound of Formula 1 may be present in either the electron transport region or the emission layer, or in both the electron transport region and the emission layer. When the pyrene-based compound of Formula 1 is in both the electron transport region and the emission layer, the pyrene-based compounds in the electron transport region and the emission layer may be identical to or differ from each other.

As used herein, "(for example, the organic layer) including at least one pyrene-based compound means that "(the organic layer) including one of the pyrene-based compounds of Formula 1 above, or at least two different pyrene-based compounds of Formula 1 above".

In some embodiments, the organic layer may include only Compound 1 above as the pyrene-based compound. In this regard, the Compound 1 may be present in the electron transport layer of the organic light-emitting diode. In some embodiments, the organic layer may include Compounds 1 and 2 as the pyrene-based compound. In this regard, Compounds 1 and 10 may be present in the same layer (for example, in the electron transport layer) or may be present in different layers (for example, in the electron transport layer and the emission layer, respectively).

A hole transport region in the organic layer may include at least one of a hole injection layer, a hole transport layer, and a functional layer having both hole injection and hole transport capabilities (hereinafter, a H-functional layer), a buffer layer, and an electron blocking layer. The electron transport region in the organic layer may include at least one of a hole blocking layer, and electron transport layer, and an electron injection layer.

The term "organic layer" as used herein refers to a single layer and/or a plurality of layers disposed between the first and second electrodes of the organic light-emitting diode.

The FIGURE is a schematic sectional view of an organic light-emitting diode 10 according to an embodiment. Hereinafter, a structure of an organic light-emitting diode according to an embodiment and a method of manufacturing the same will now be described with reference to the FIGURE.

The substrate 11 may be any substrate that is used in existing organic light-emitting diodes. In some embodiments the substrate 11 may be a glass substrate or a transparent plastic substrate with strong mechanical strength, thermal stability, transparency, surface smoothness, ease of handling, and water resistance.

The first electrode 13 may be formed by depositing or sputtering a first electrode-forming material on the substrate 11. When the first electrode 13 constitutes an anode, a material having a high work function may be used as the first electrode-forming material to facilitate hole injection. The first electrode 13 may be a reflective electrode or a transmission electrode. Transparent and conductive materials such as ITO, IZO, SnO2, and ZnO may be used to form the first electrode 13. The first electrode 13 may be formed as a reflective electrode using magnesium (Mg), aluminum (Al), aluminum-lithium (Al—Li), calcium (Ca), magnesium-indium (Mg—In), magnesium-silver (Mg—Ag), or the like.

The first electrode 13 may have a single-layer structure or a multi-layer structure including at least two layers. For example, the first electrode 13 may have a three-layered structure of ITO/Ag/ITO, but is not limited thereto.

The organic layer 15 may be disposed on the first electrode 13.

The organic layer 15 may include a hole transport region including a hole injection layer (HIL) and a hole transport layer (HTL) that are sequentially stacked upon one another; an emission layer (EML); and an electron transport region including an electron transport layer (ETL) and an electron injection layer (EIL) that are sequentially stacked upon one another.

The HIL may be formed on the first electrode 13 by any of a variety of methods, including vacuum deposition, spin coating, casting, Langmuir-Blodgett (LB) deposition, and the like.

When the HIL is formed using vacuum deposition, vacuum deposition conditions may vary depending on the compound that is used to form the HIL, and the desired structure and thermal properties of the HIL to be formed. For example, vacuum deposition may be performed at a temperature of about 100° C. to about 500° C., a pressure of about $10^{-8}$ torr to about $10^{-3}$ torr, and a deposition rate of about 0.01 to about 100 Å/sec. However, the deposition conditions are not limited thereto.

When the HIL is formed using spin coating, the coating conditions may vary according to the compound that is used to form the HIL, and the desired structure and thermal properties of the HIL to be formed. For example, the coating rate may be in the range of about 2000 rpm to about 5000 rpm, and a temperature at which heat treatment is performed to remove a solvent after coating may be in the range of about 80° C. to about 200° C. However, the coating conditions are not limited thereto.

Non-limiting examples of known hole injecting materials that may be used to form the HIL are N,N'-diphenyl-N,N'-bis-[4-(phenyl-m-tolyl-amino)-phenyl]-biphenyl-4,4'-diamine, (DNTPD), a phthalocyanine compound such as copper phthalocyanine, 4,4',4"-tris(3-methylphenylphenylamino) triphenylamine (m-MTDATA), N,N'-di(1-naphthyl)-N,N'-diphenylbenzidine (NPB), TDATA, 2-TNATA, polyaniline/dodecylbenzenesulfonic acid (Pani/DBSA), poly(3,4-ethylenedioxythiophene)/poly (4-styrenesulfonate) (PEDOT/PSS), polyaniline/camphor sulfonic acid (Pani/CSA), and polyaniline)/poly(4-styrene-sulfonate (PANI/PSS).

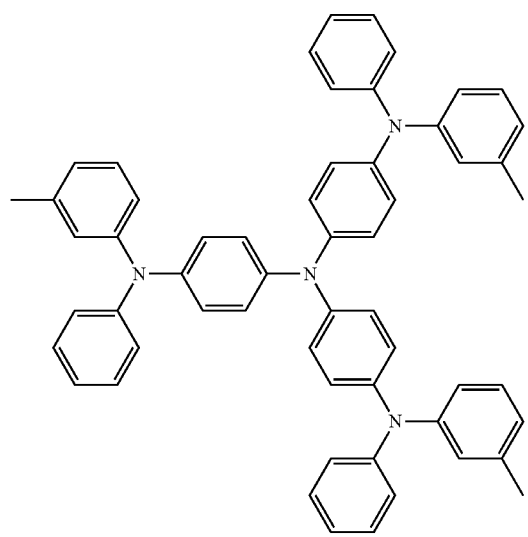

m-MTDATA

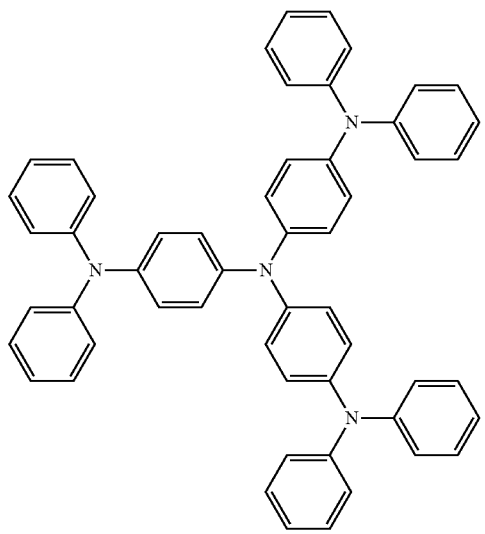

TDATA

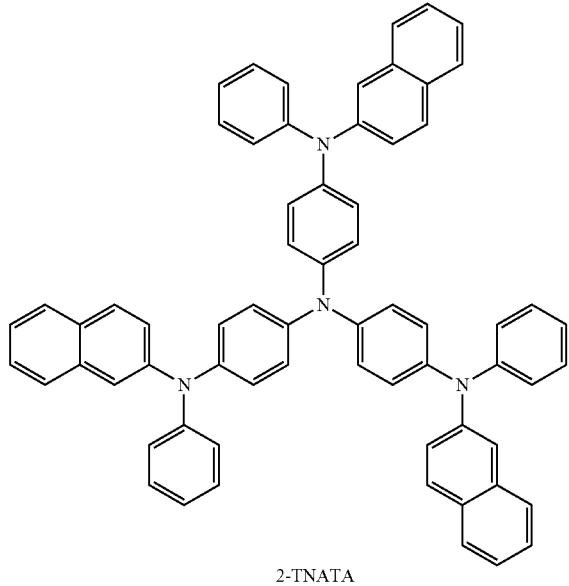

2-TNATA

The thickness of the HIL may be about 100 □ to about 10000 □, and in some embodiments, may be from about 100 □ to about 1000 □. When the thickness of the HIL is within these ranges, the HIL may have good hole injecting ability without a substantial increase in driving voltage.

Then, a HTL may be formed on the HIL by using vacuum deposition, spin coating, casting, Langmuir-Blodgett (LB) deposition, or the like. When the HTL is formed using vacuum deposition or spin coating, the conditions for deposition and coating may be similar to those for the formation of the HIL, though the conditions for the deposition and coating may vary according to the material that is used to form the HTL.

Non-limiting examples of suitable HTL materials are carbazole derivatives, such as N-phenylcarbazole or polyvinylcarbazole, N,N'-bis(3-methylphenyl)-N,N'-diphenyl-[1,1-biphenyl]-4,4'-diamine (TPD), 4,4',4"-tris(N-carbazolyl)triphenylamine (TCTA), and N,N'-di(1-naphthyl)-N,N'-diphenylbenzidine) (NPB).

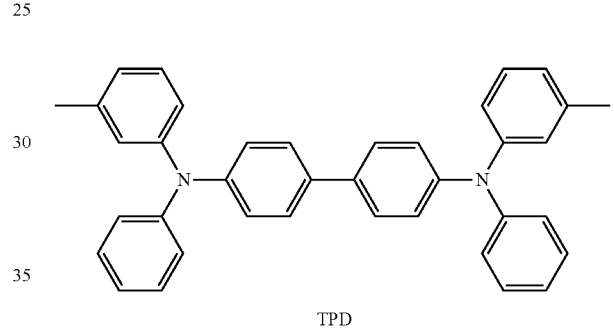

TPD

The thickness of the HTL may be from about 50 Å to about 2000 Å, and in some embodiments, may be from about 100 Å to about 1500 Å. When the thickness of the HTL is within these ranges, the HTL may have good hole transporting ability without a substantial increase in driving voltage.

In some embodiments, the organic light-emitting diode 10 may include the H-functional layer, instead of the HIL and the HTL. The H-functional layer may contain at least one material from each group of the hole injection layer materials and hole transport layer materials. The thickness of the H-functional layer may be from about 100 Å to about 10,000 Å, and in some embodiments, may be from about 100 Å to about 1,000 Å. When the thickness of the H-functional layer is within these ranges, the H-functional layer may have good hole injection and transport capabilities without a substantial increase in driving voltage.

In some embodiments, at least one of the HIL, HTL, and H-functional layer may include at least one of a compound of Formula 300 below and a compound of Formula 301 below:

Formula 300

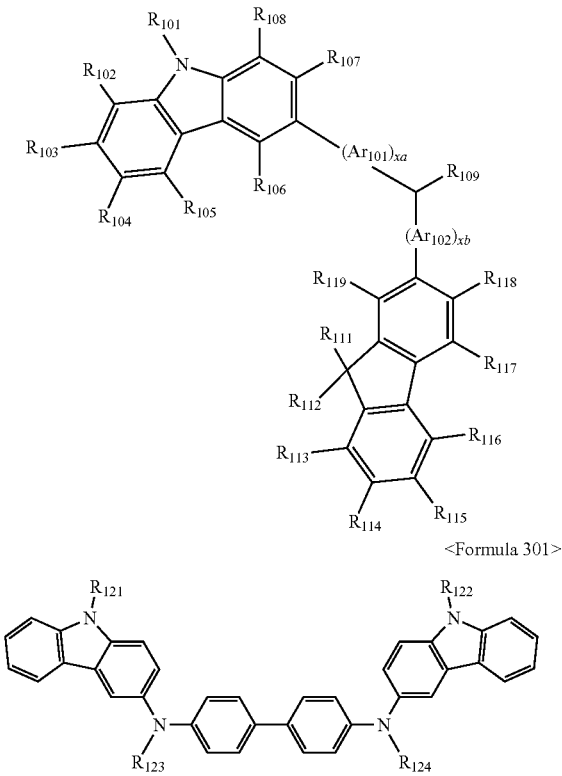

<Formula 301>

In Formula 300, $Ar_{101}$ and $Ar_{102}$ may be each independently a substituted or unsubstituted $C_6$-$C_{60}$ arylene group.

For example, $Ar_{101}$ and $Ar_{102}$ in Formula 300 may each independently be one selected from a phenylene group, a pentalenylene group, an indenylene group, a naphthylene group, an azulenylene group, a heptalenylene group, acenaphthylene group, a fluorenylene group, a phenalenylene group, a phenanthrenylene group, an anthrylene group, a fluoranthenylene group, a triphenylenylene group, a pyrenylene group, a chrysenylene group, a naphthacenylene group, a picenylene group, a perylenylene group, and a pentacenylene group, and a phenylene group, a pentalenylene group, an indenylene group, a naphthylene group, an azulenylene group, a heptalenylene group, acenaphthylene group, a fluorenylene group, a phenalenylene group, a phenanthrenylene group, an anthrylene group, a fluoranthenylene group, a triphenylenylene group, a pyrenylene group, a chrysenylene group, a naphthacenylene group, a picenylene group, a perylenylene group, and a pentacenylene group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group.

In Formula 300, xa and xb may be each independently an integer from 0 to 5, for example, may be 0, 1, or 2. For example, xa may be 1, and xb may be 0, but embodiments are not limited thereto.

In Formulae 300 and 301 above, $R_{101}$ to $R_{108}$, $R_{111}$ to $R_{119}$, and $R_{121}$ to $R_{124}$ may be each independently selected from a hydrogen atom, a deuterium atom, a halogen atom, a hydroxyl group, a cyano group, a nitro group, an amino group, an amidino group, a hydrazine group, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_6$-$C_{60}$ aryl group, a substituted or unsubstituted $C_6$-$C_{60}$ aryloxy group, and a substituted or unsubstituted $C_6$-$C_{60}$ arylthio group.

For example, $R_{101}$ to $R_{108}$, $R_{111}$ to $R_{119}$, and $R_{121}$ to $R_{124}$ may be each independently one selected from a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, a pentyl group, a hexyl group, or the like), and a $C_1$-$C_{10}$ alkoxy group (for example, a methoxy group, an ethoxy group, a propoxy group, a butoxy group, a pentoxy group, or the like), a $C_1$-$C_{10}$ alkyl group and a $C_1$-$C_{10}$ alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof, a phenyl group, a naphthyl group, an anthryl group, a fluorenyl group, and a pyrenyl group, and a phenyl group, a naphthyl group, an anthryl group, a fluorenyl group, and a pyrenyl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{10}$ alkyl group, and a $C_1$-$C_{10}$ alkoxy group, but embodiments are not limited thereto.

In some embodiments, $R_{109}$ in Formula 300 may be one selected from a phenyl group, a naphthyl group, an anthryl group, a biphenyl group, and a pyridinyl group; and a phenyl group, a naphthyl group, an anthryl group, a biphenyl group, and a pyridinyl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{20}$ alkyl group, and a substituted or unsubstituted $C_1$-$C_{20}$ alkoxy group.

For example, the compound of Formula 300 may be a compound represented by Formula 300A below:

Formula 300A
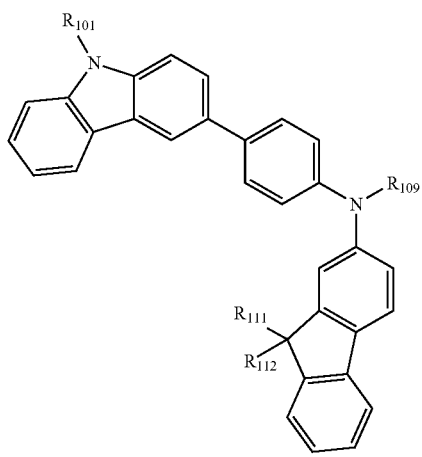
In Formula 300A, $R_{101}$, $R_{111}$, $R_{112}$, and $R_{109}$ may be as defined above.
In some non-limiting embodiments, at least one of the HIL, HTL, and H-functional layer may include at least one of compounds represented by Formulae 301 to 320 below:
301
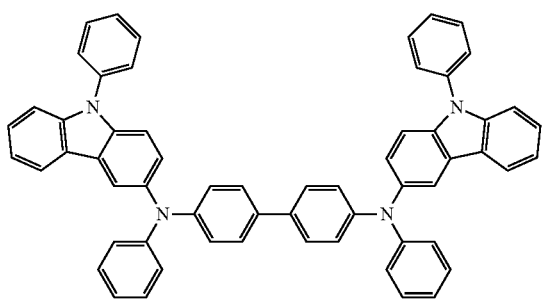
302
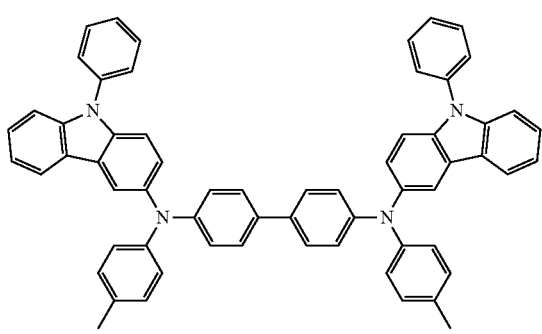
303
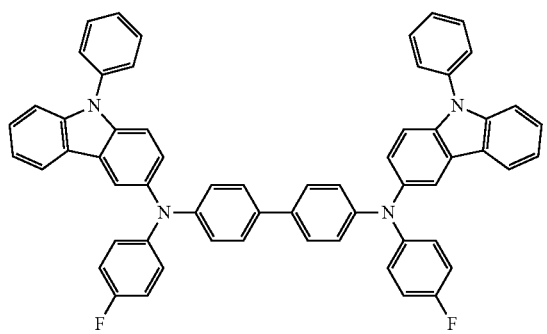
304
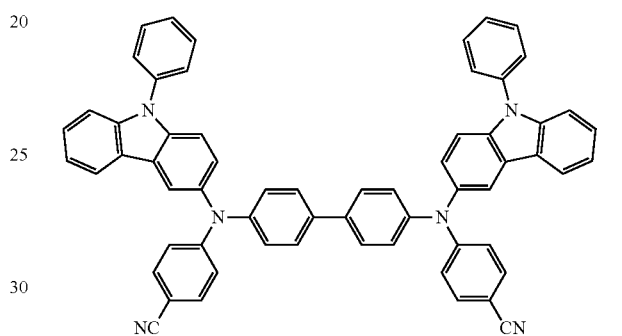
305
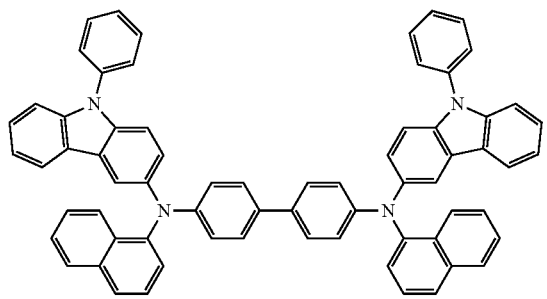
306
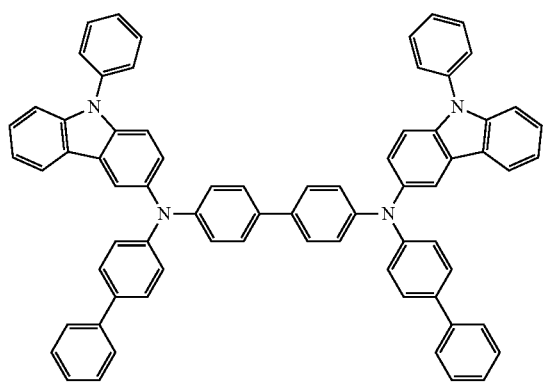

307
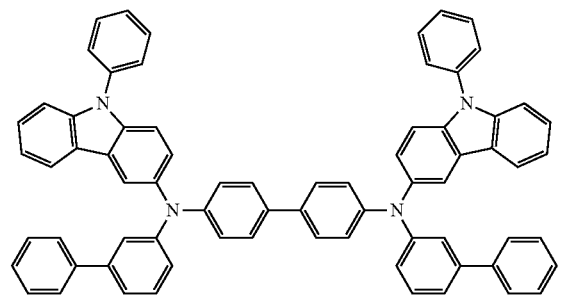
308
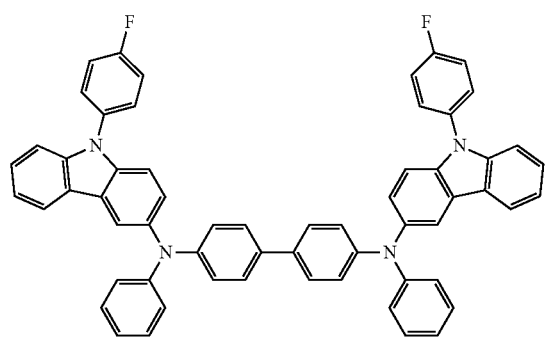
310
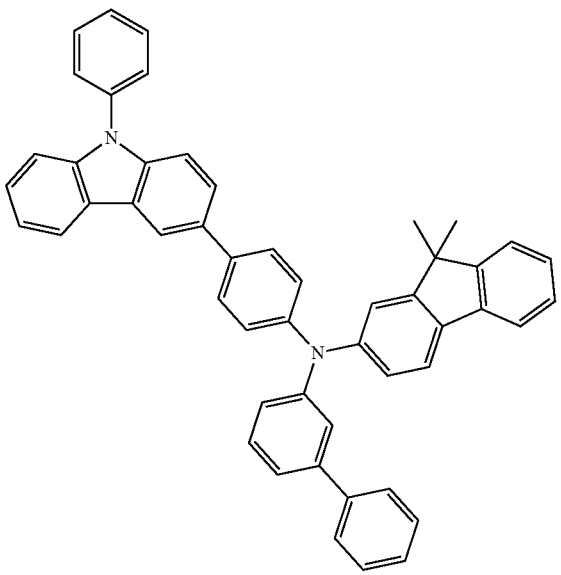
309
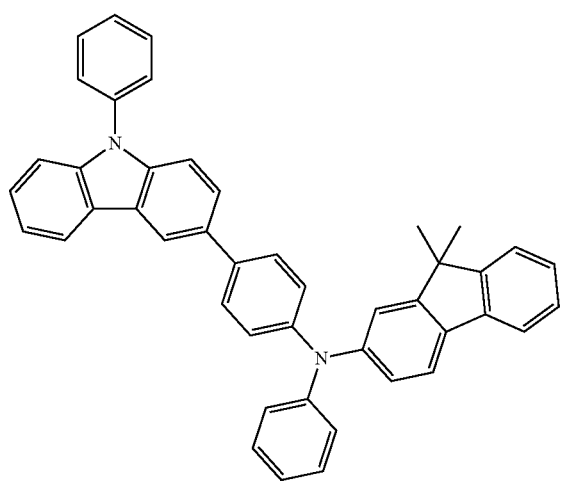
311
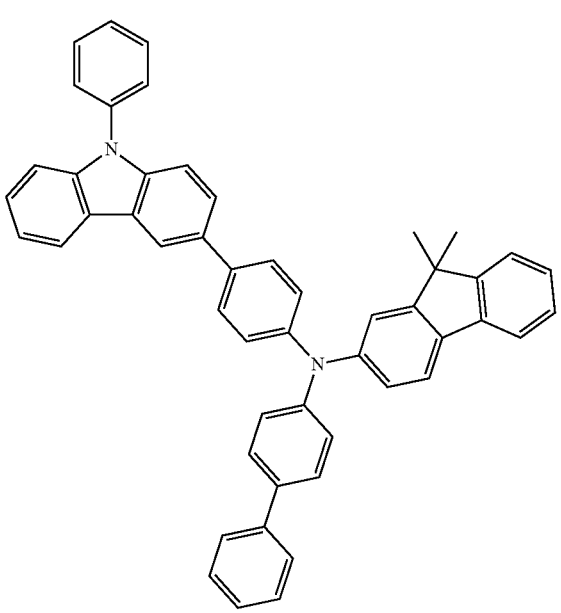

312
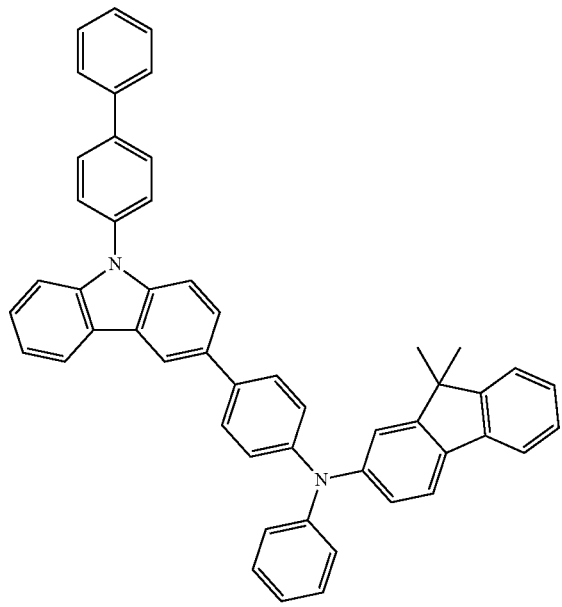
313
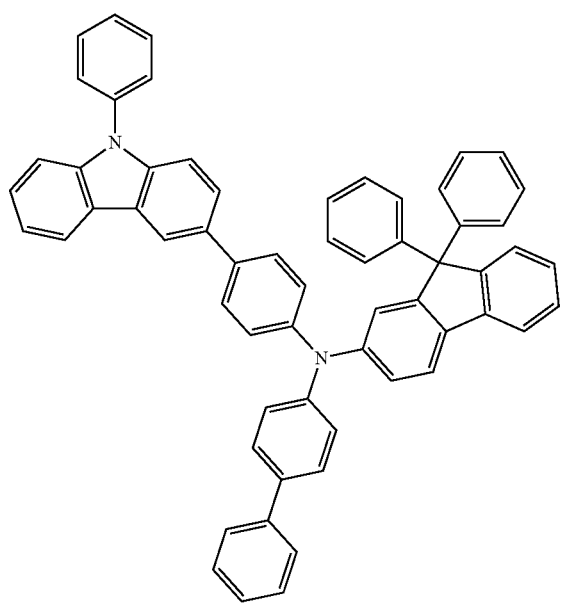
314
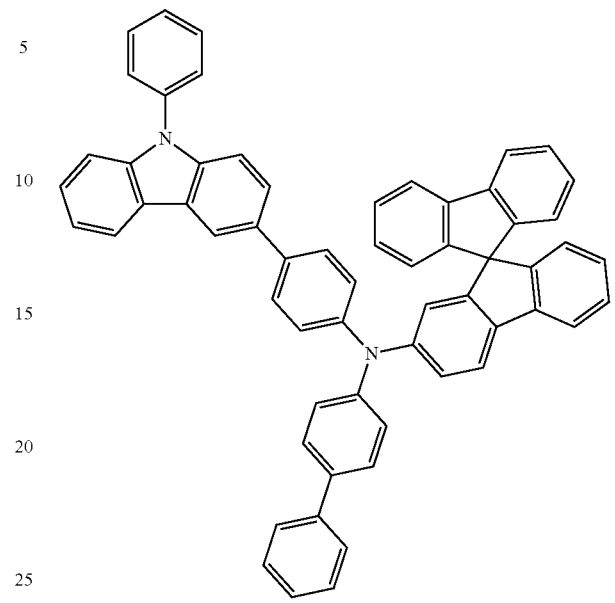
315
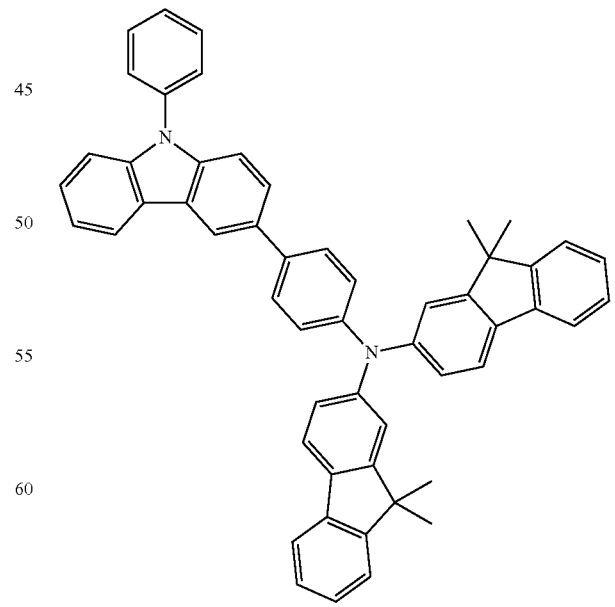

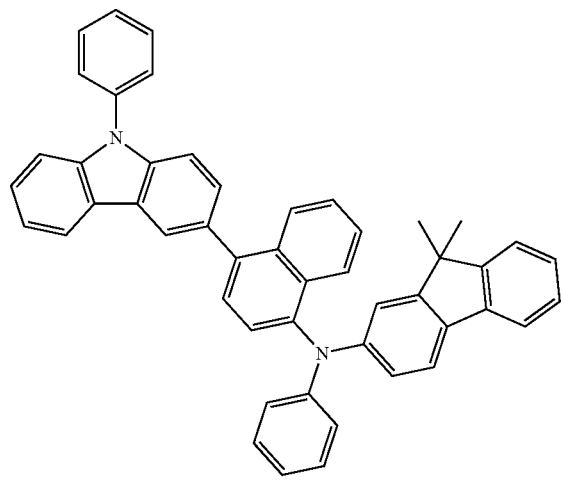

316

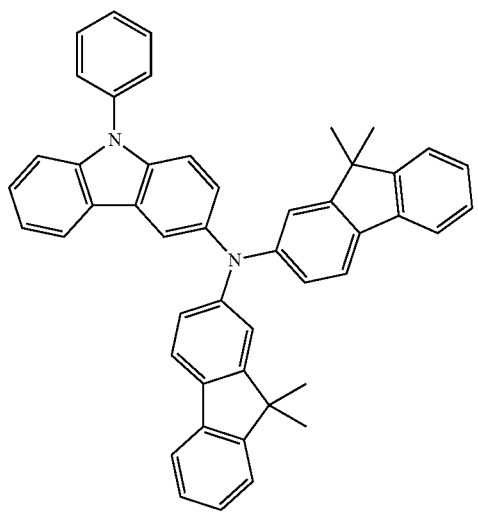

317

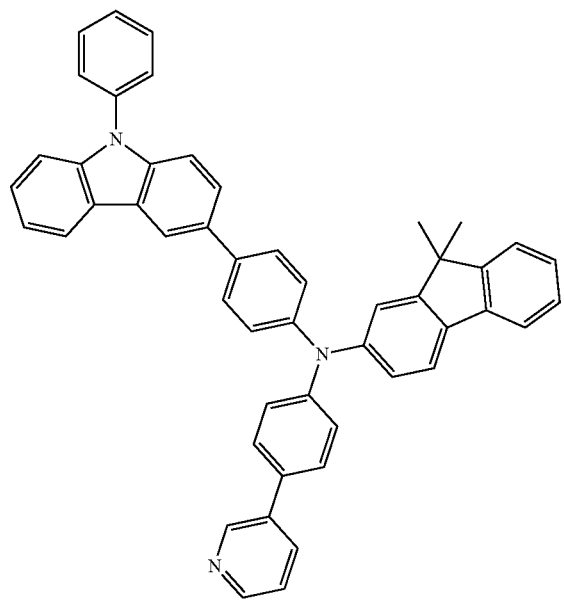

318

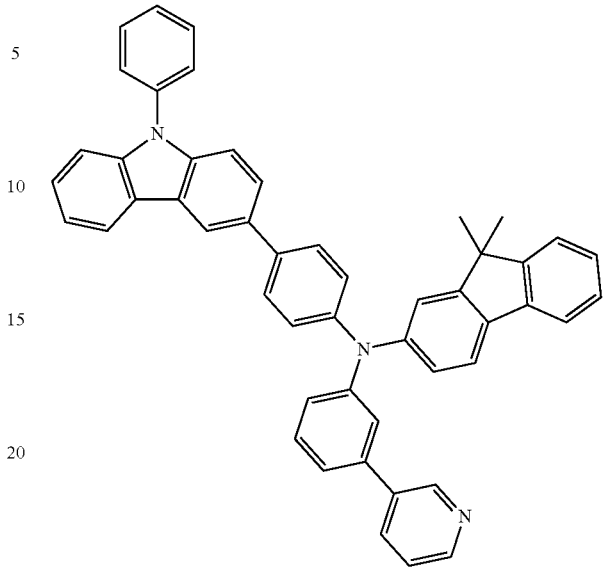

319

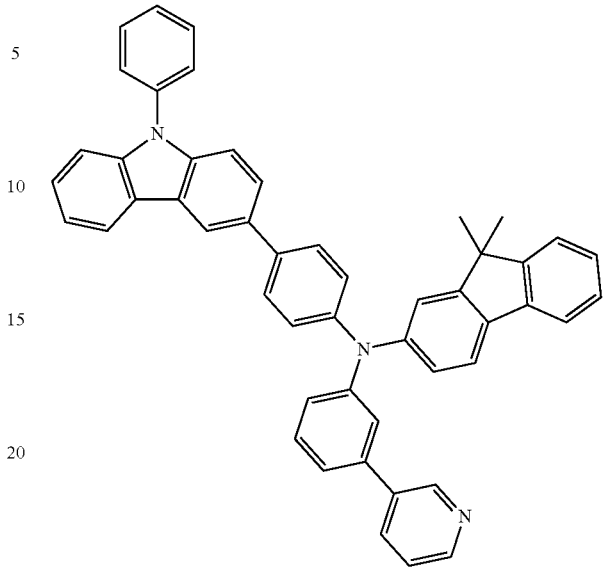

320

The hole transport region may further include a charge-generating material for improving conductivity of layers, in addition to a hole injection material and/or a hole transport material as those described above.

The charge-generating material may be, for example, a p-dopant. The p-dopant may be one of quinine derivatives, metal oxides, and compounds with a cyano group, but are not limited thereto. Non-limiting examples of the p-dopant are quinone derivatives such as tetracyanoquinonedimethane (TCNQ), 2,3,5,6-tetrafluoro-tetracyano-1,4-benzoquinonedimethane (F4-TCNQ), and the like; metal oxides such as tungsten oxide, molybdenum oxide, and the like; and cyano-containing compounds such as Compound 200 below.

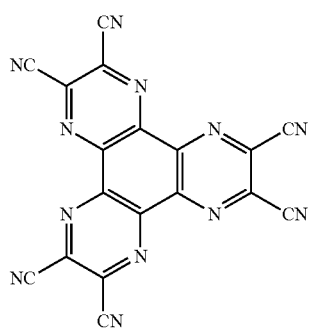

Compound 200

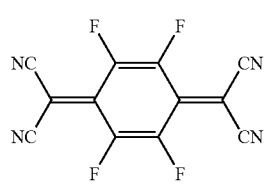

<F4-TCNQ>

When the hole transport region further includes such a charge-generating material as described above, the charge-generating material may be homogeneously dispersed or inhomogeneously distributed in the hole transport region.

The hole transport region may further include a buffer layer between the HTL and the EML (or between the H-functional layer and the EML).

The buffer layer may compensate for an optical resonance distance of light according to a wavelength of the light emitted from the EML, and thus may increase efficiency. The butter layer may include any hole injecting material or hole transporting material that are widely known. In some other embodiments, the buffer layer may include the same material as one of the materials in the HTL (or the H-functional layer) underlying the buffer layer.

Then, the EML may be formed on the hole transport region by using vacuum deposition, spin coating, casting, LB deposition, or the like. When the EML is formed using vacuum deposition or spin coating, the deposition and coating conditions may be similar to those for the formation of the HIL, though the conditions for deposition and coating may vary depending on the material that is used to form the EML.

The EML may include a host, and a dopant.

Non-limiting example of the host are Alq3, 4,4'-N,N'-dicarbazole-biphenyl (CBP), poly(n-vinylcarbazole) (PVK), 9,10-di(naphthalene-2-yl)anthracene (DNA), TCTA, 1,3,5-tris(N-phenylbenzimidazole-2-yl)benzene (TPBI), 3-tert-butyl-9,10-di-2-naphthylanthracene (TBADN), E3, distyry-larylene (DSA), dmCBP (see a formula below), and Compounds 501 to 509 below.

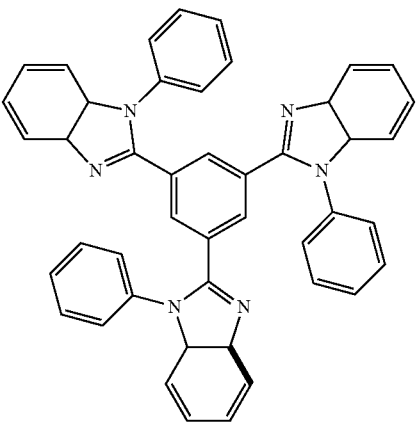

TPBI

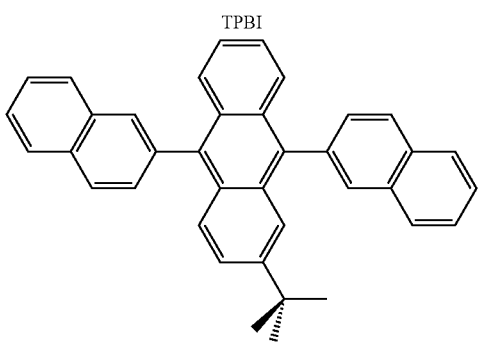

TBADN

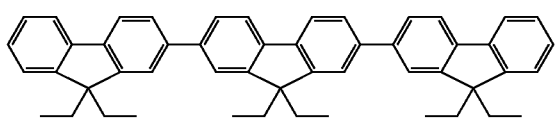

E3

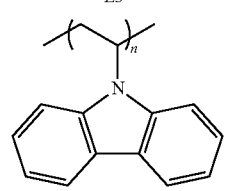

PVK

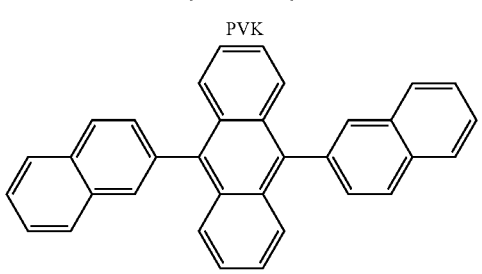

ADN

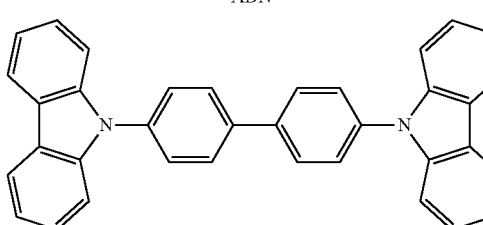

CBP

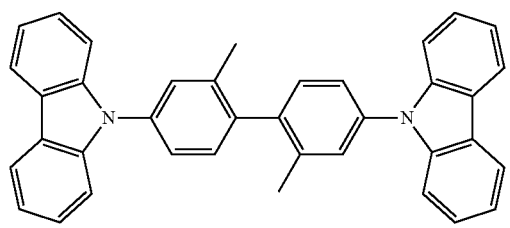
dmCBP
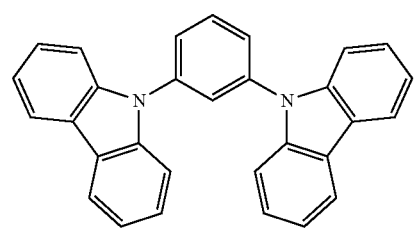
501
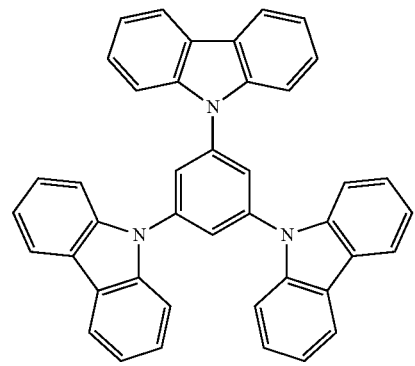
502
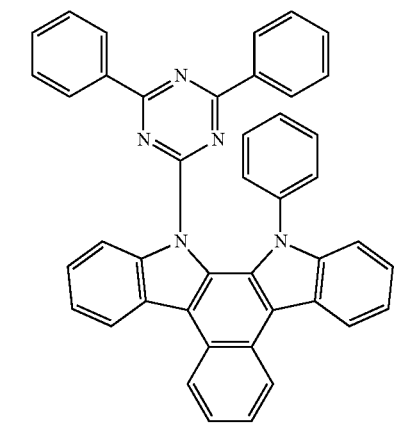
503
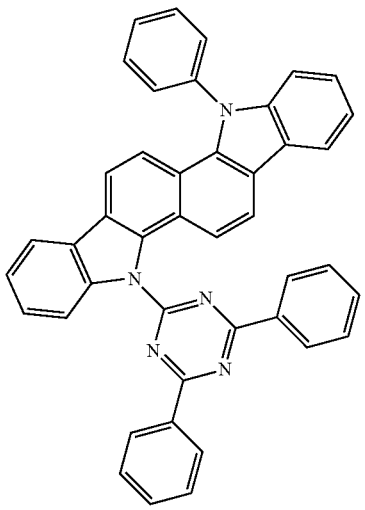
504
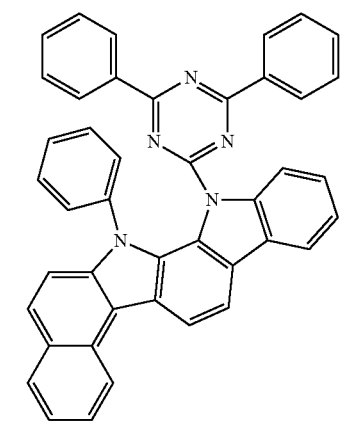
505
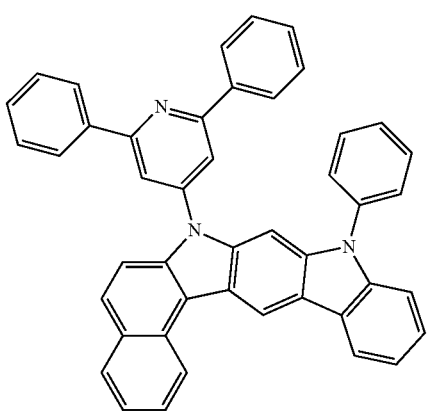
506

-continued

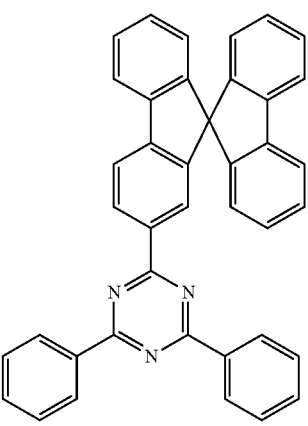
507

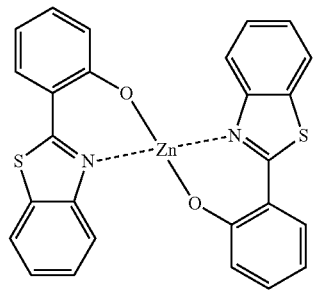
508

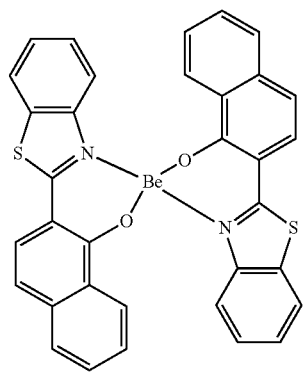
509

In some embodiments, an anthracene-based compound represented by Formula 400 below may be used as the host.

Formula 400

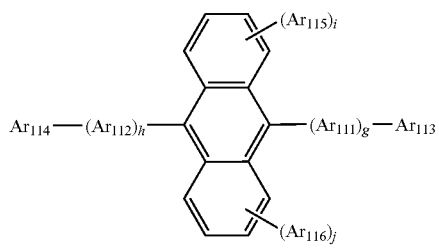

In Formula 400, $Ar_{111}$ and $Ar_{112}$ are each independently a substituted or unsubstituted $C_6$-$C_{60}$ arylene group; $Ar_{113}$ to $Ar_{116}$ are each independently a substituted or unsubstituted $C_1$-$C_{10}$ alkyl group, or a substituted or unsubstituted $C_6$-$C_{60}$ aryl group; and g, h, I, and j are each independently an integer from 0 to 4.

In some embodiments, $Ar_{111}$ and $Ar_{112}$ in Formula 400 may be each independently a phenylene group, a naphthylene group, a phenanthrenylene group, or a pyrenylene group; or a phenylene group, a naphthylene group, a phenanthrenylene group, a fluorenyl group, or a pyrenylene group that are substituted with at least one of a phenyl group, a naphthyl group, and an anthryl group, but are not limited thereto.

In Formula 400 above, g, h, I, and j may be each independently 0, 1, or 2.

In some embodiments, $Ar_{113}$ to $Ar_{116}$ in Formula 400 may each independently be one selected from a $C_1$-$C_{10}$ alkyl group substituted with at least one of a phenyl group, a naphthyl group, and an anthryl group, a phenyl group, a naphthyl group, an anthryl group, a pyrenyl group, a phenanthrenyl group, and a fluorenyl group, a phenyl group, a naphthyl group, an anthryl group, a pyrenyl group, a phenanthrenyl group, and a fluorenyl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a pyrenyl group, a phenanthrenyl group, and a fluorenyl group, and

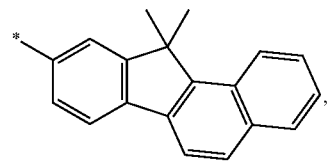 [SMILES: *c1ccc2c(c1)C(C)(C)c1c-2ccc2ccccc12]

but embodiments are not limited thereto.

For example, the anthracene-based compound of Formula 400 may be one of the compounds represented by the following formulae:

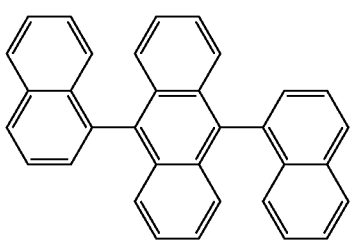

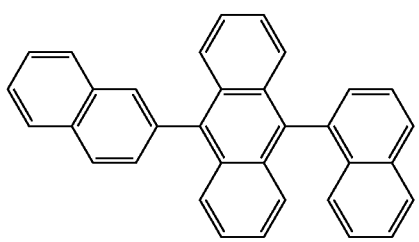

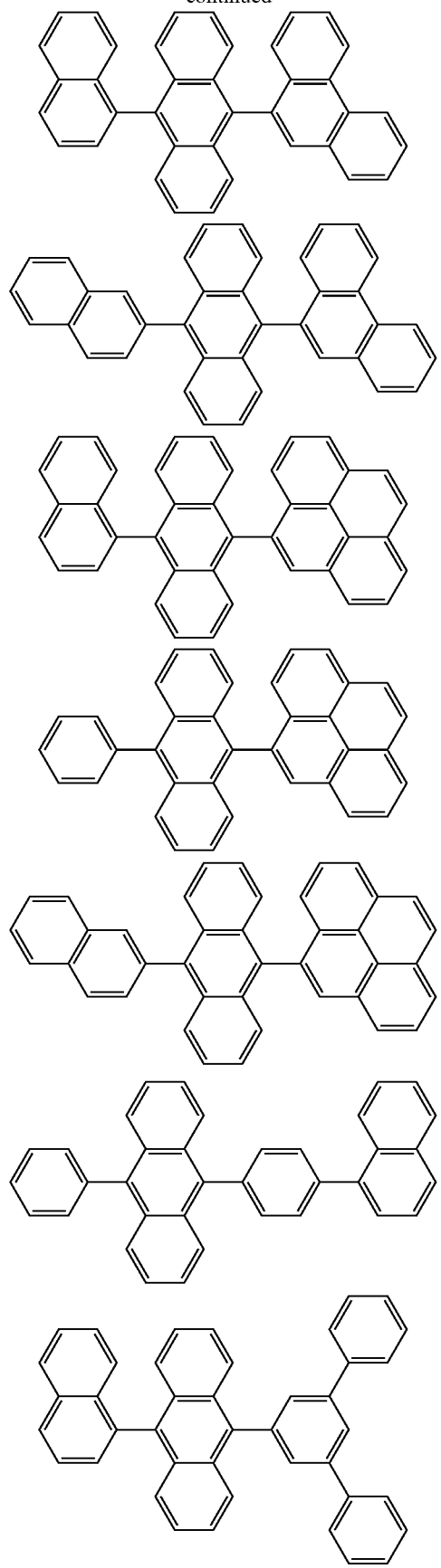
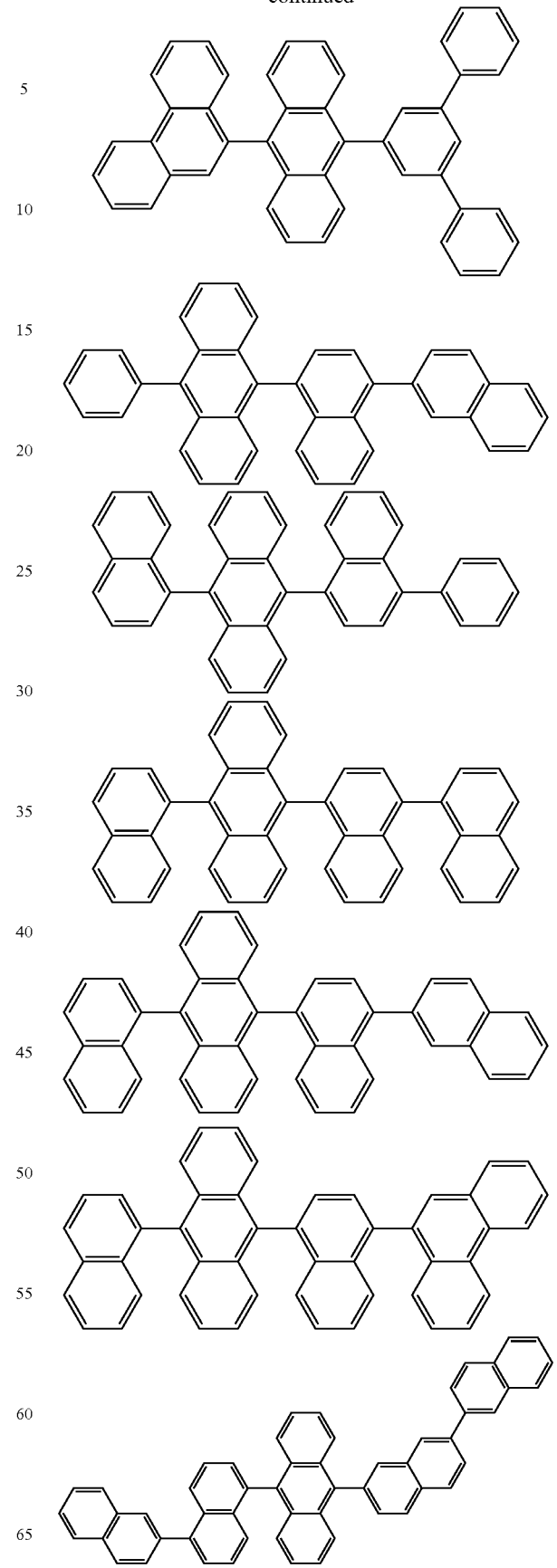

-continued
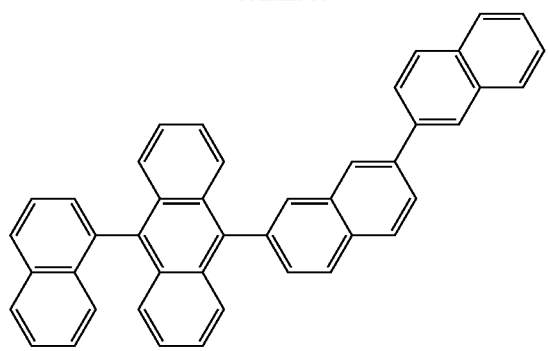
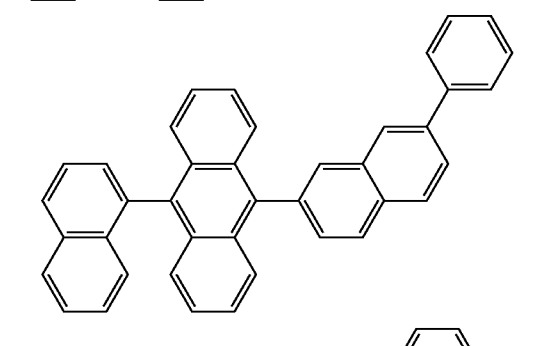
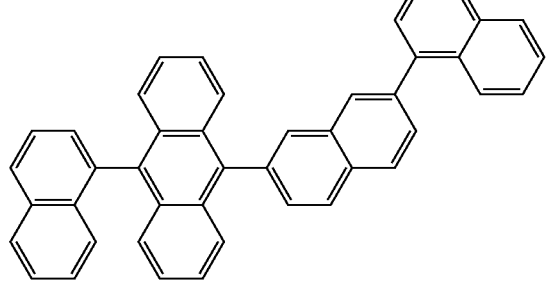
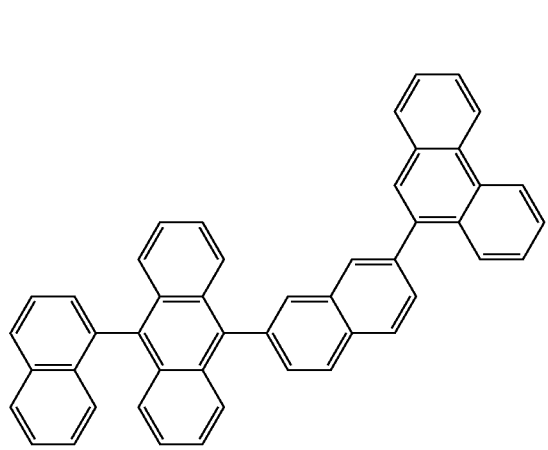
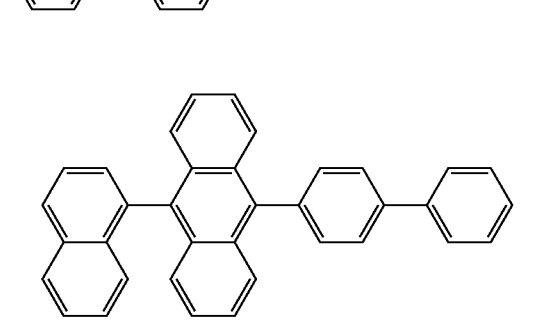
-continued
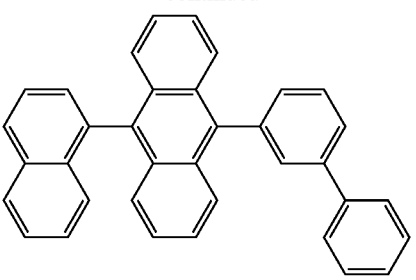
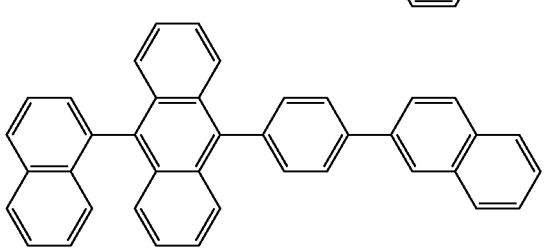
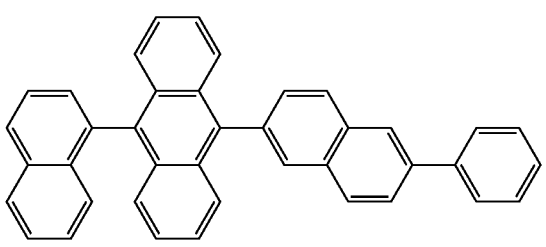
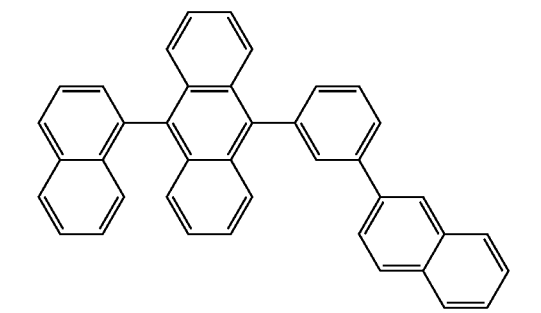
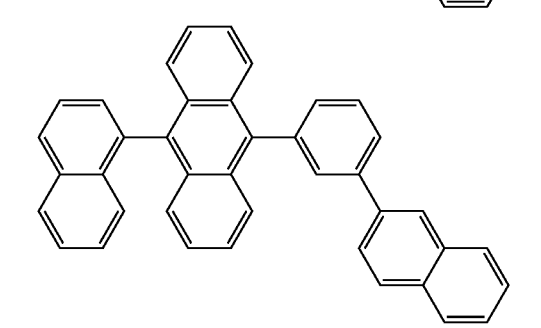
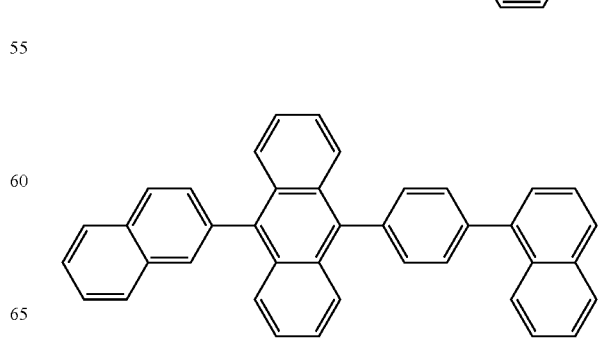

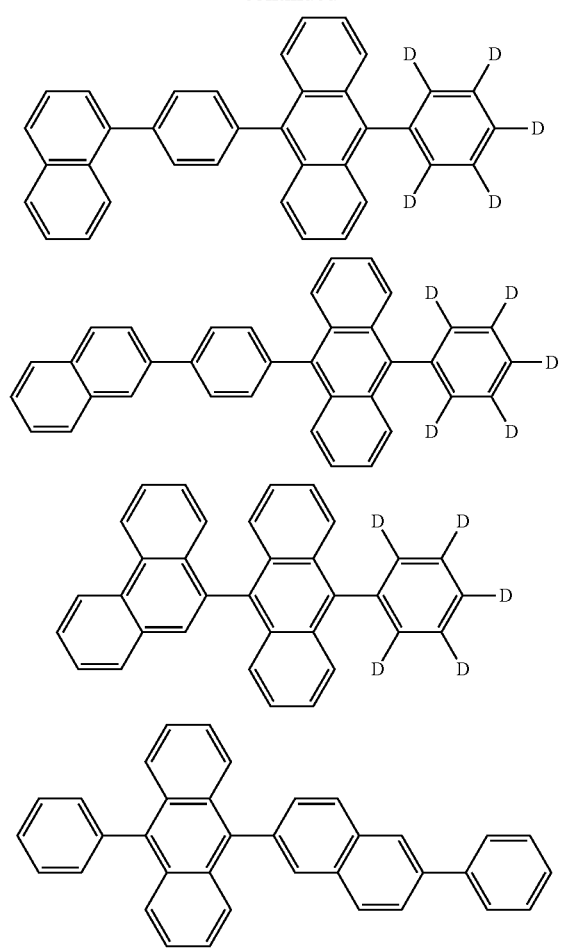
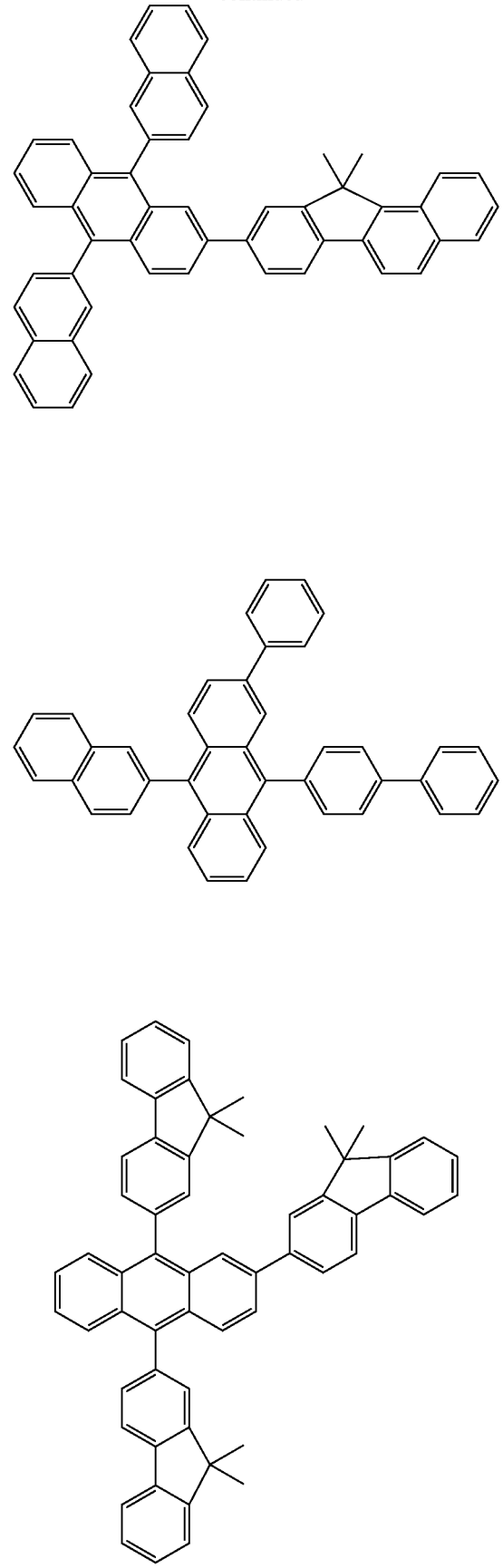

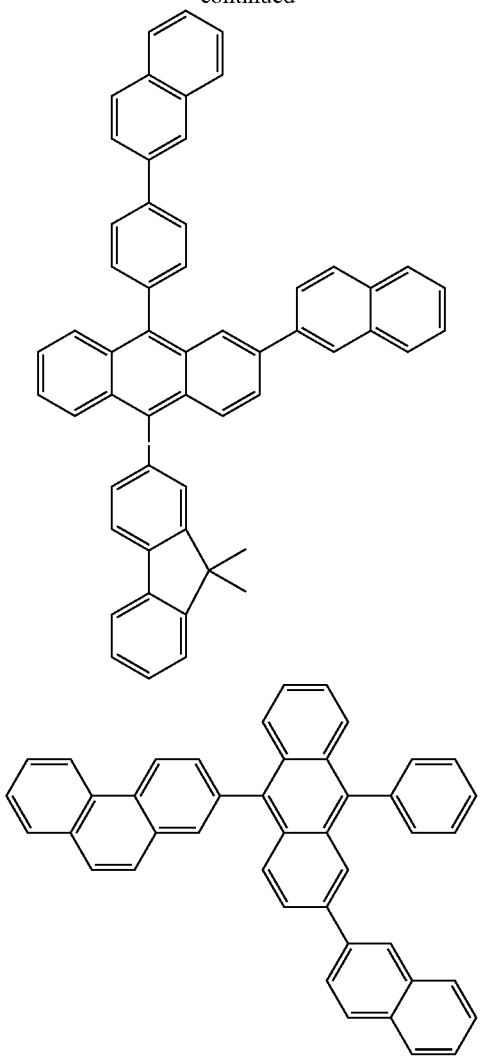

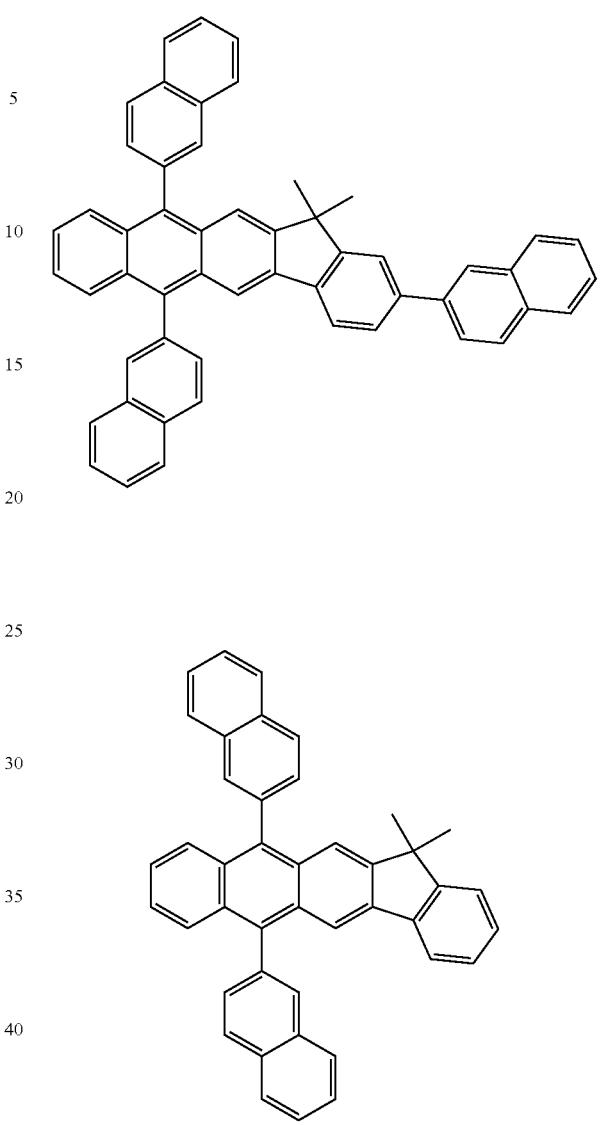

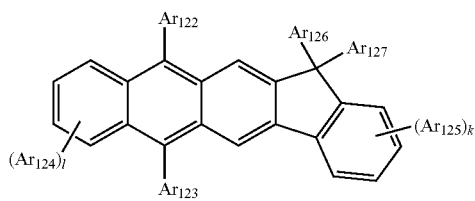

In some embodiments, an anthracene-based compound represented by Formula 401 below may be used as the host.

Formula 401

The detailed descriptions of $Ar_{122}$ to $Ar_{125}$ in Formula 401 may be the same as those described above in conjunction with $Ar_{113}$ in Formula 400.

$Ar_{126}$ and $Ar_{127}$ in Formula 401 above may be each independently a $C_1$-$C_{10}$ alkyl group, for example, a methyl group, an ethyl group, or a propyl group.

In Formula 401, k and l may be each independently an integer from 0 to 4, for example, 0, 1, or 2.

For example, the anthracene compound of Formula 401 above may be one of the compounds represented by the following formulae, but is not limited thereto:

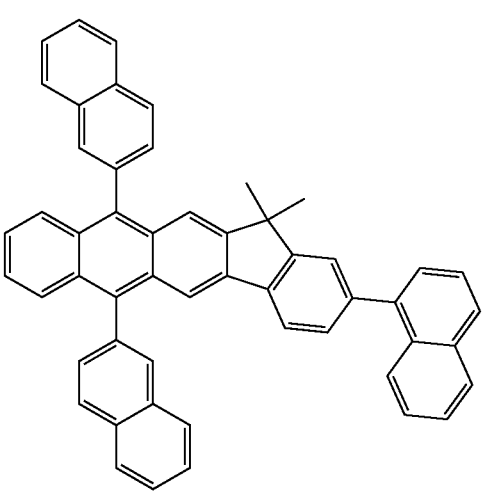

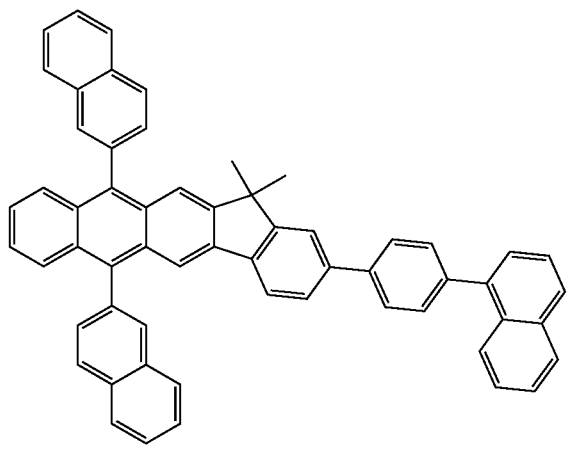 [SMILES: CC1(C)c2cc(-c3ccc(-c4cccc5ccccc45)cc3)ccc2-c2cc3c(-c4ccc5ccccc5c4)c4ccccc4c(-c4ccc5ccccc5c4)c3cc21]

When the organic light-emitting diode is a full color organic light-emitting diode, the emission layer may be patterned into a red emission layer, a green emission layer, and a blue emission layer. In some embodiments, the EML 23 may include a red emission layer, a green emission layer, and/or a blue emission layer that are stacked upon one another to emit white light, but is not limited thereto.

The pyrene-based compound of Formula 1 may be used as a dopant of the EML. The pyrene-based compound of Formula 1 may also serve as a fluorescent dopant emitting light based on fluorescence mechanism. In some embodiments, the pyrene-based compound of Formula 1 may serve as a fluorescent dopant emitting blue light, green light, or bluish green light, but not limited thereto.

Examples of the dopant which can be used with the pyrene-based compound of Formula 1 are as follows.

At least one of the red EML, the green EML, and the blue EML may include a dopant below (ppy=phenylpyridine).

Non-limiting examples of the blue dopant are compounds represented by the following formulae.

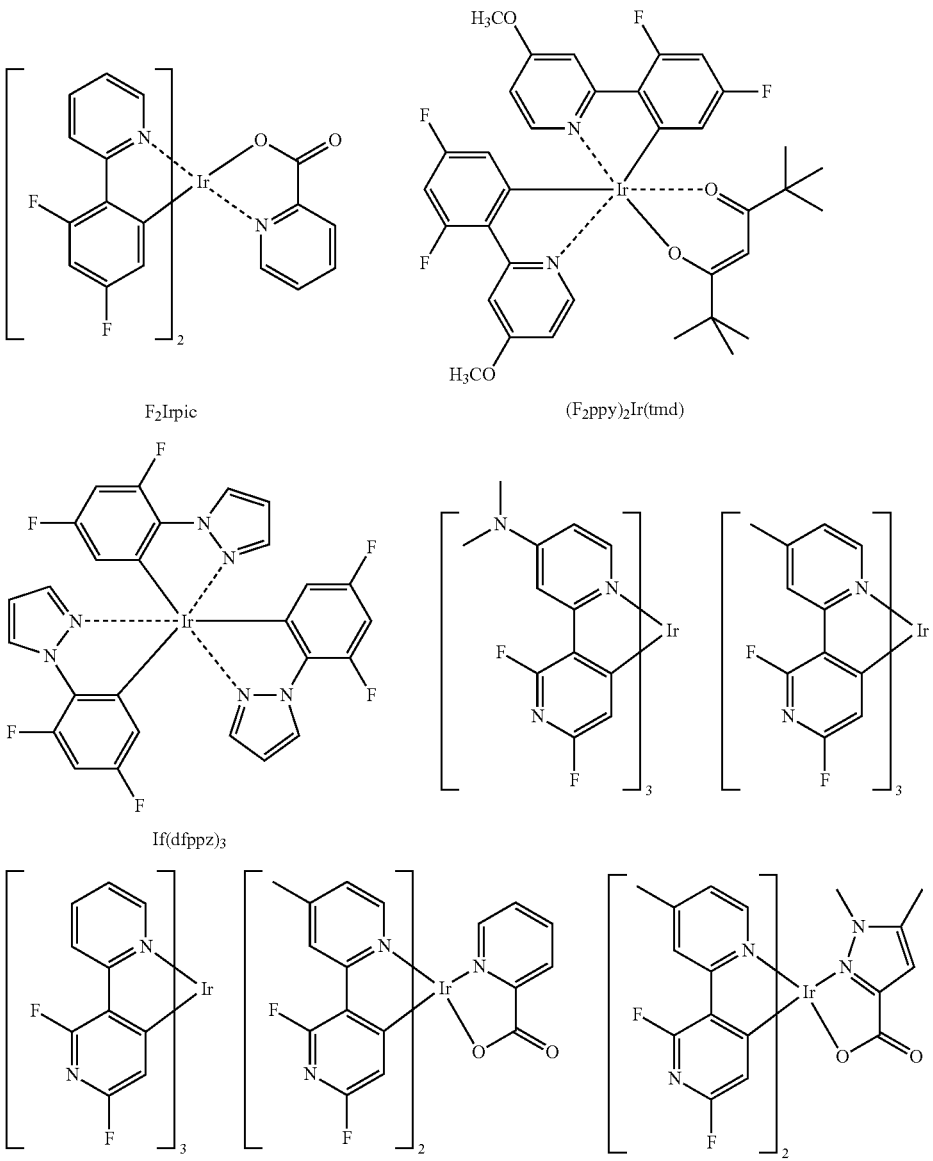

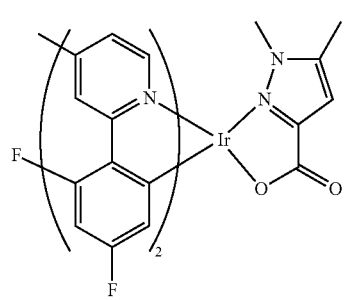 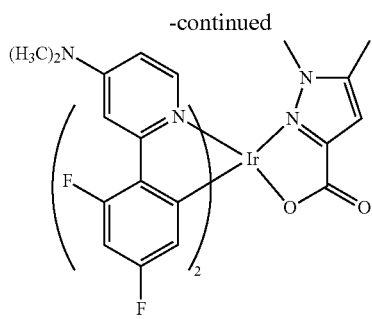
-continued
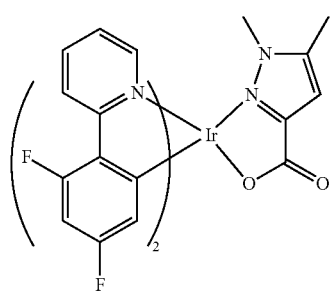 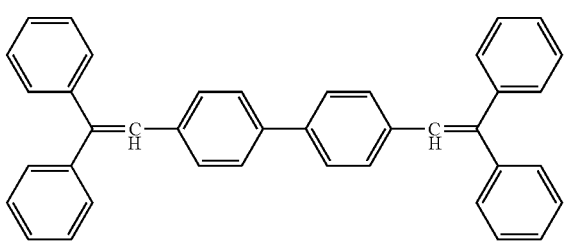
DPVBi
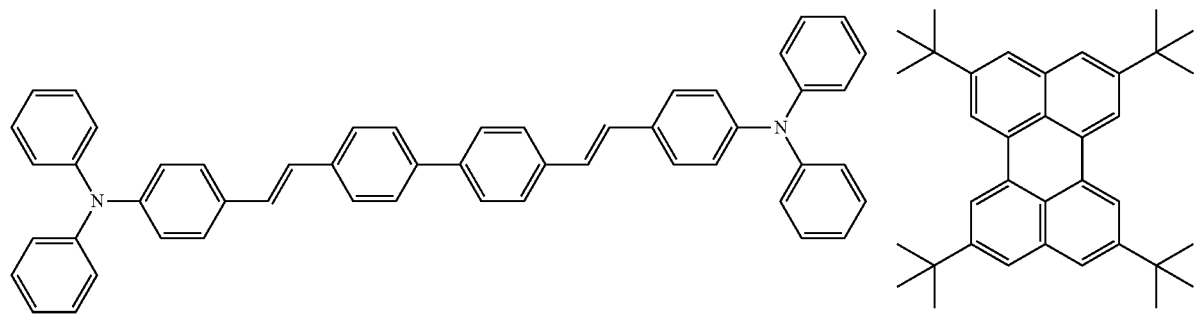
DPAVBi                    TBPe
Non-limiting examples of a red dopant are compounds represented by the following formulae. For example, the red dopant may be DCM or DCJTB, which will be described later.
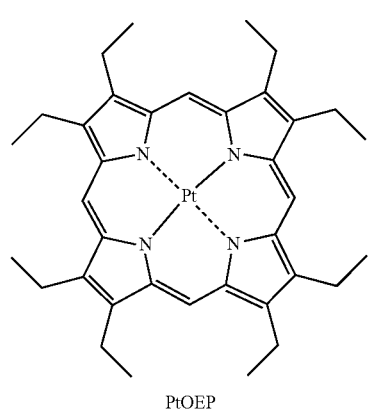
PtOEP
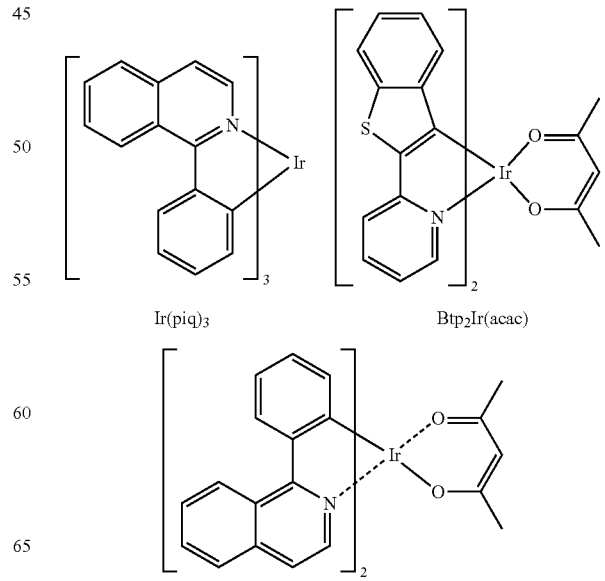
Ir(piq)$_3$     Btp$_2$Ir(acac)

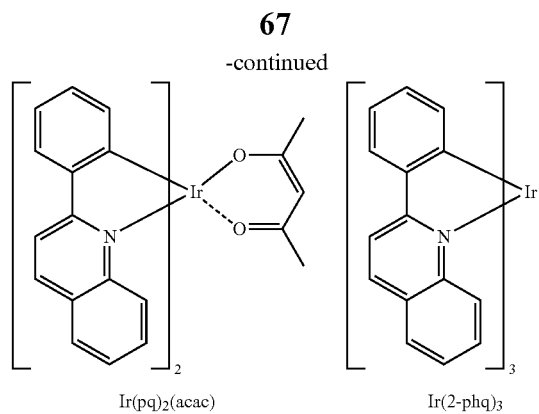
Ir(pq)₂(acac)    Ir(2-phq)₃
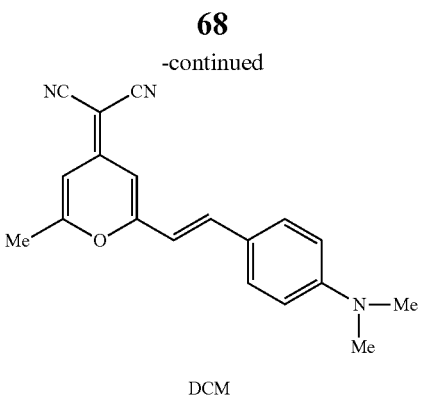
DCM
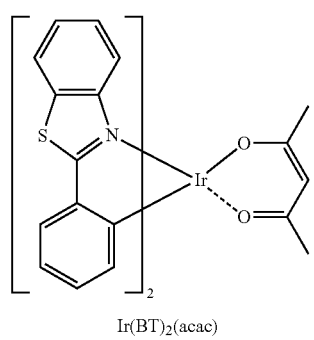
Ir(BT)₂(acac)
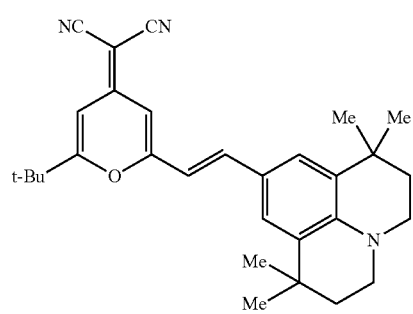
DCJTB
Non-limiting examples of a green dopant are compounds represented by the following formulae. For example, the green dopant may be C545T represented below.
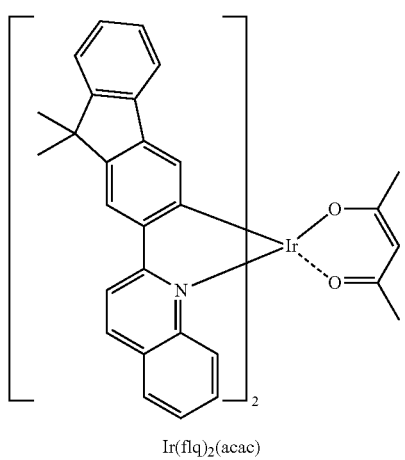
Ir(flq)₂(acac)
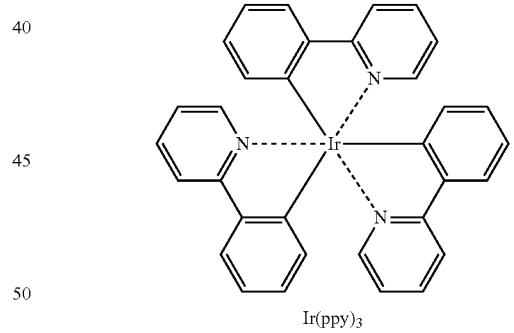
Ir(ppy)₃
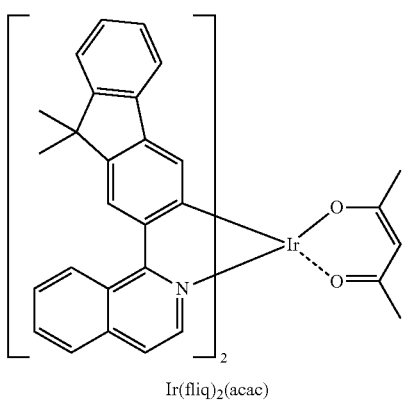
Ir(fliq)₂(acac)
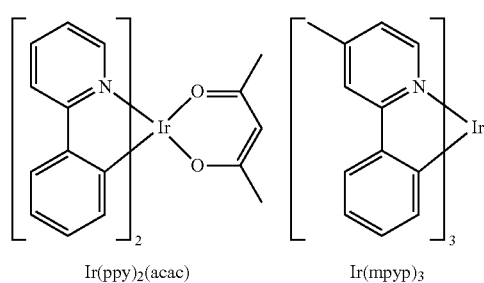
Ir(ppy)₂(acac)    Ir(mpyp)₃

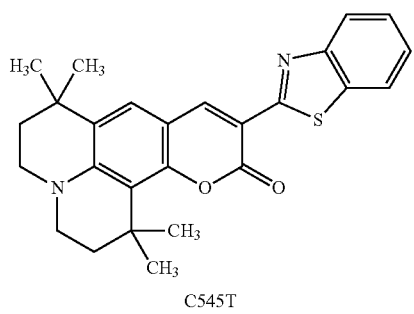
C545T
Non-limiting examples of the dopant for the EML are complexes represented by the following formulae.
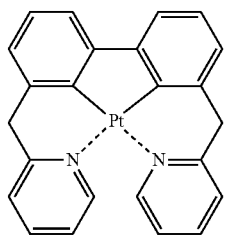
D1
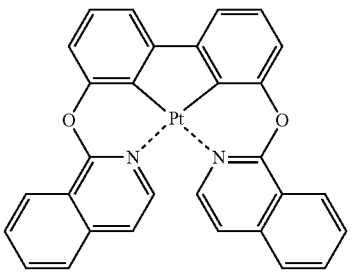
D2
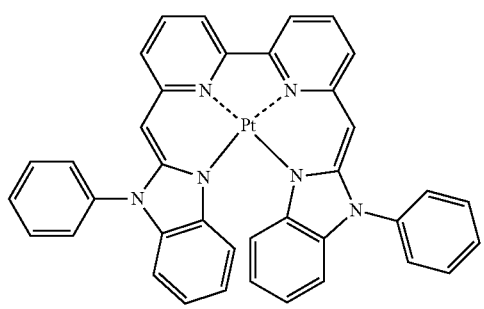
D3
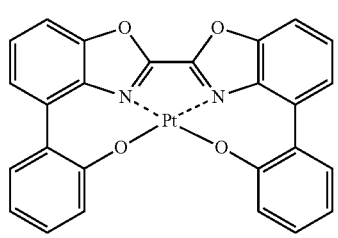
D4
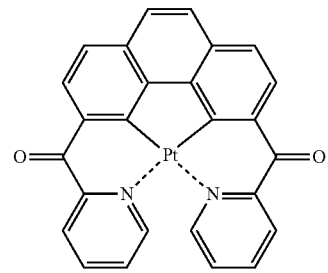
D5
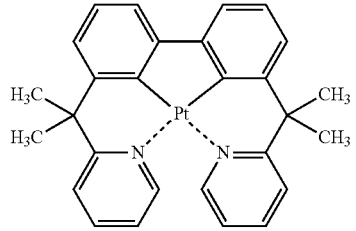
D6
D7
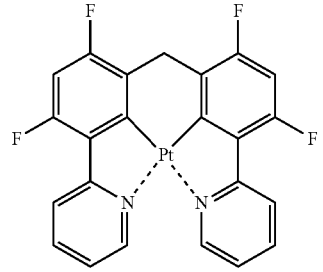
D8
D9
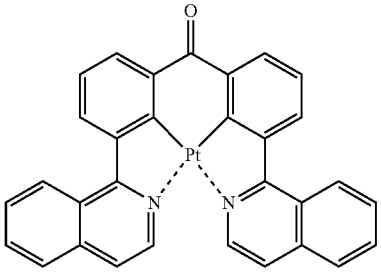
D10

D11 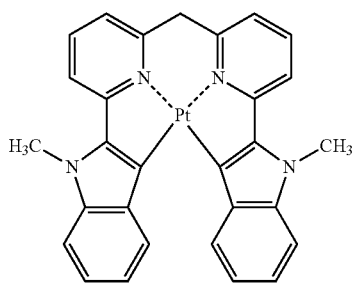
D12 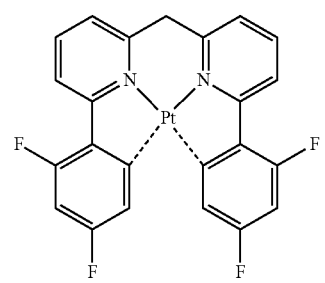
D13 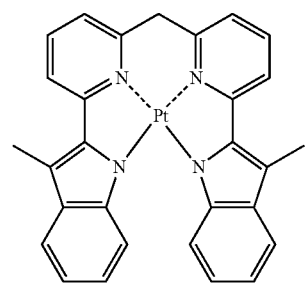
D14 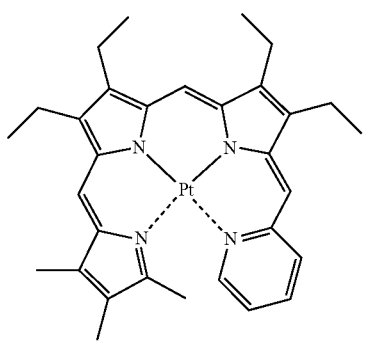
D15 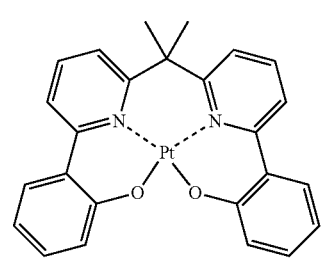
D16 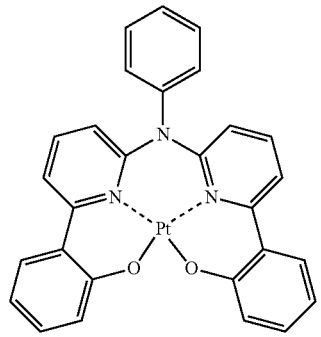
D17 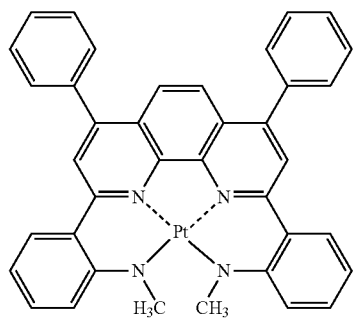
D18 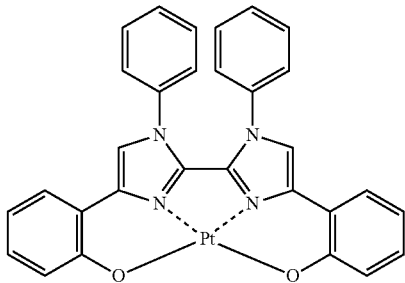
D19 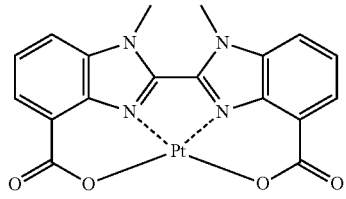
D20 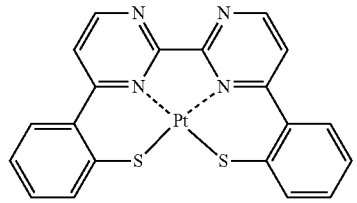

-continued
D21
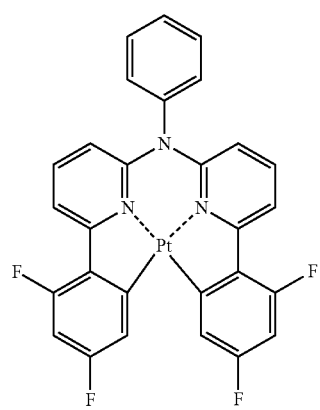
D22
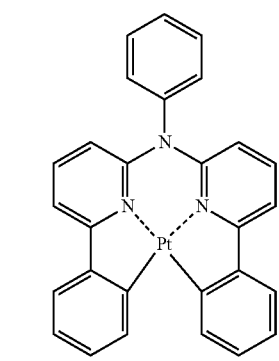
D23
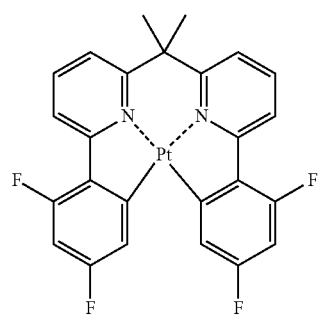
D24
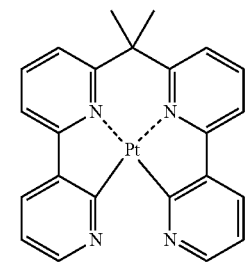
D25
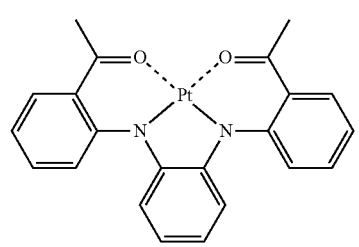
-continued
D26
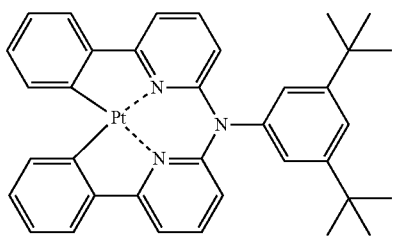
D27
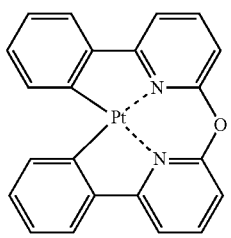
D28
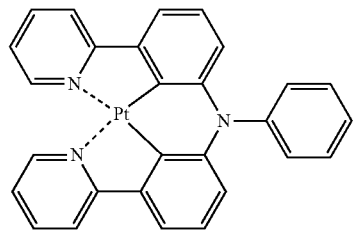
D29
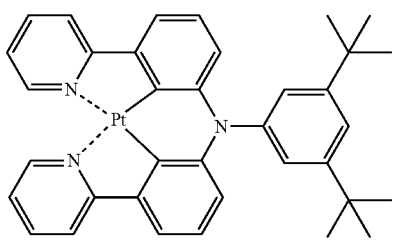
D30
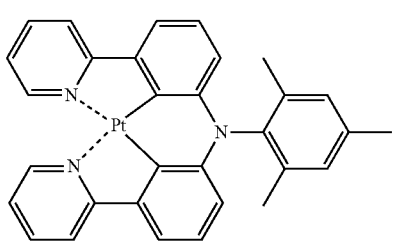
D31
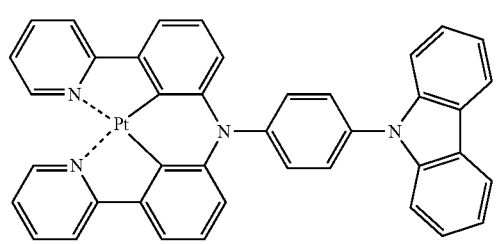

D32
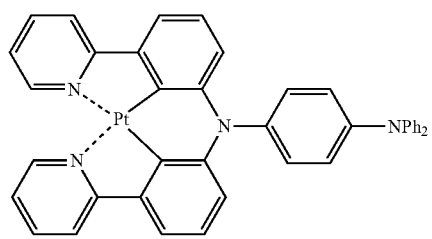
D33
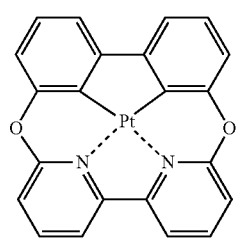
D34
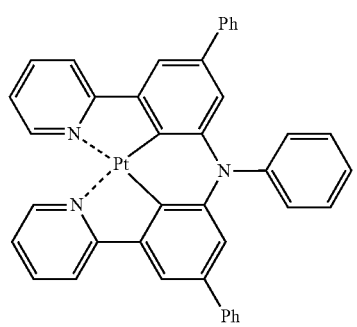
D35
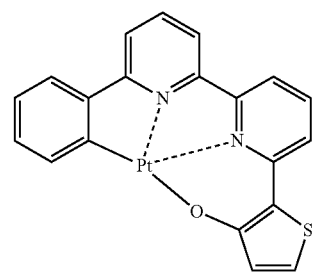
D36
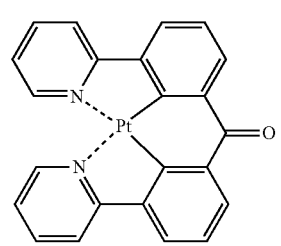
D37
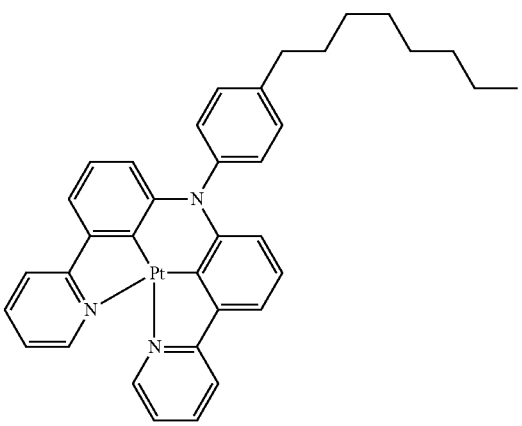
D38
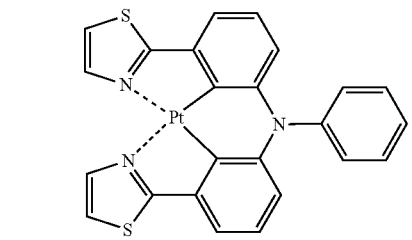
D39
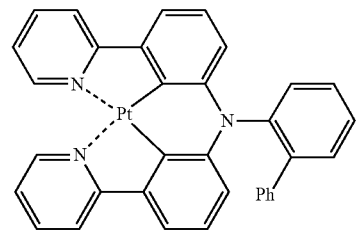
D40
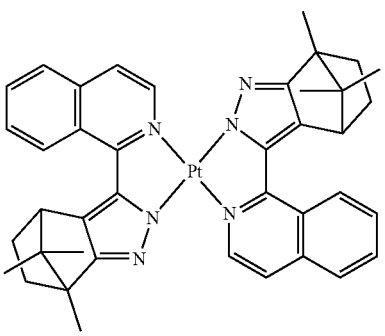
D41
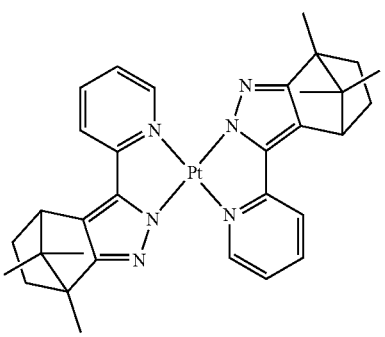

-continued
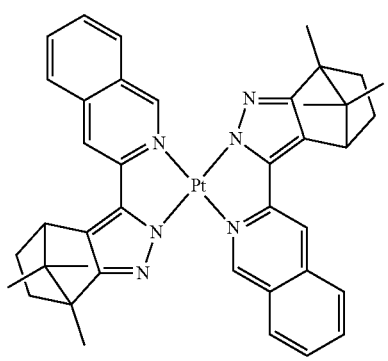
D42
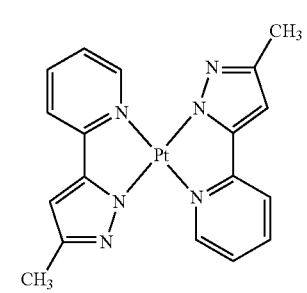
D43
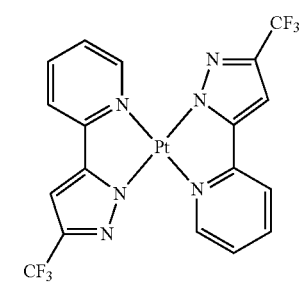
D44
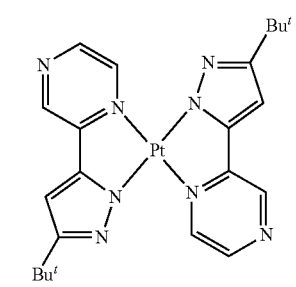
D45
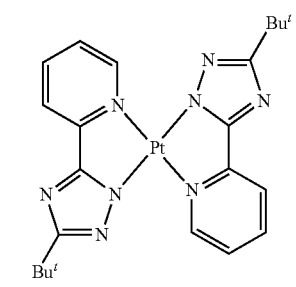
D46
-continued
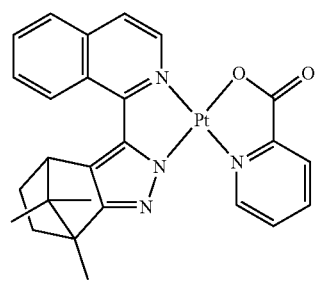
D47
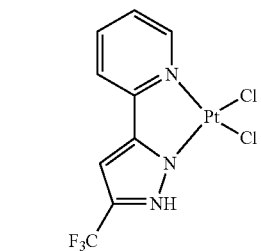
D48
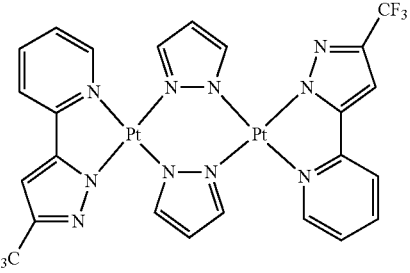
D49
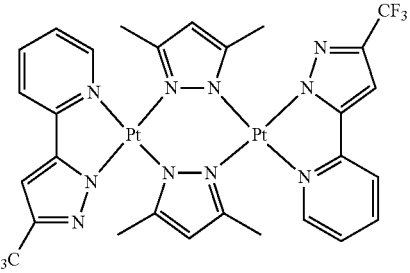
D50
Non-limiting examples of the dopant for the EML are Os complexes represented by the following formulae.
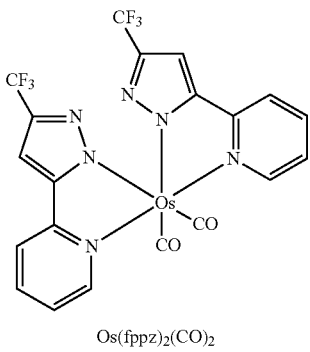
Os(fppz)$_2$(CO)$_2$

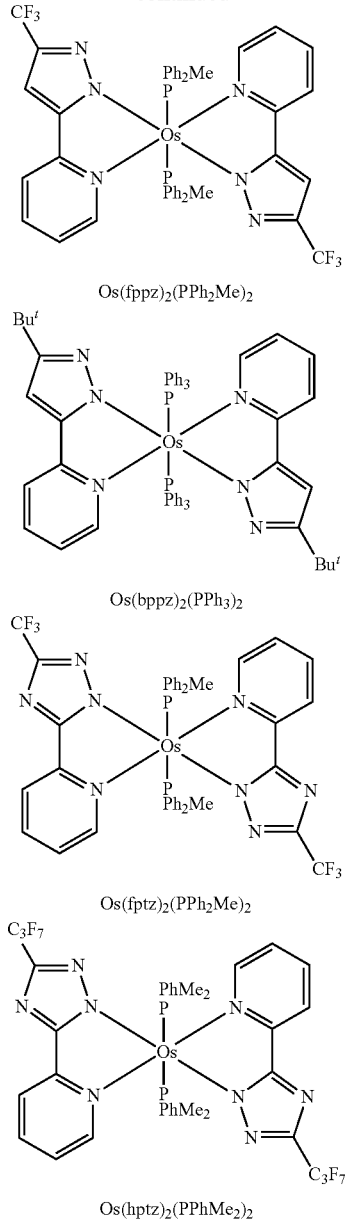

Os(fppz)₂(PPh₂Me)₂

Os(bppz)₂(PPh₃)₂

Os(fptz)₂(PPh₂Me)₂

Os(hptz)₂(PPhMe₂)₂

When the EML includes both a host and a dopant, the amount of the dopant may be from about 0.01 to about 15 parts by weight based on 100 parts by weight of the host. However, the amount of the dopant is not limited to this range.

The thickness of the EML may be about 100 Å to about 1000 Å, and in some embodiments, may be from about 200 Å to about 600 Å. When the thickness of the EML is within these ranges, the EML may have good light emitting ability without a substantial increase in driving voltage.

Then, an ETL may be formed on the EML by vacuum deposition, spin coating, casting, or the like. When the ETL is formed using vacuum deposition or spin coating, the deposition and coating conditions may be similar to those for the formation of the HIL, though the deposition and coating conditions may vary depending on the compound that is used to form the ETL. A material for the ETL may be, for example, the pyrene-based compound of Formula 1 described above.

The thickness of the ETL may be from about 100 Å to about 1,000 Å, and in some embodiments, may be from about 150 Å to about 500 Å. When the thickness of the ETL is within these ranges, the ETL may have satisfactory electron transporting ability without a substantial increase in driving voltage.

In some embodiments the ETL may further include a metal-containing material, in addition to the above-described pyrene-based compound of Formula 1.

The metal-containing material may include a lithium (Li) complex. Non-limiting examples of the Li complex are lithium quinolate (LiQ) and Compound 203 below:

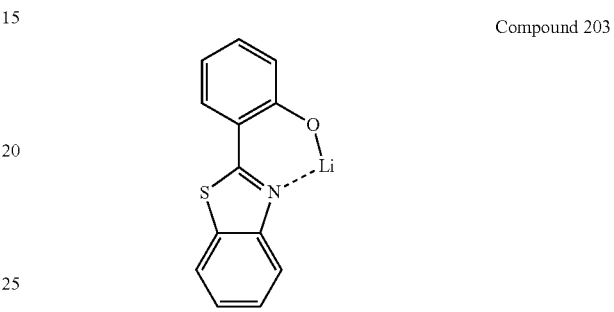

Compound 203

Then, an EIL, which facilitates injection of electrons from the cathode, may be formed on the ETL. Any suitable electron-injecting material may be used to form the EIL.

Non-limiting examples of materials for forming the EIL include LiF, NaCl, CsF, Li₂O, and BaO. The deposition and coating conditions for forming the EIL 18 may be similar to those for the formation of the HIL, though the deposition and coating conditions may vary according to the material that is used to form the EIL 18.

The thickness of the EIL may be from about 1 Å to about 100 Å, and in some embodiments, may be from about 3 Å to about 90 Å. When the thickness of the EIL is within these ranges, the EIL may have satisfactory electron injection ability without a substantial increase in driving voltage.

The second electrode 17 is disposed on the organic layer 15. The second electrode 17 may be a cathode that is an electron injection electrode. A material for forming the second electrode 17 may be a metal, an alloy, an electro-conductive compound, which have a low work function, or a mixture thereof. In this regard, the second electrode 9 may comprise lithium (Li), magnesium (Mg), aluminum (Al), aluminum (Al)-lithium (Li), calcium (Ca), magnesium (Mg)-indium (In), magnesium (Mg)-silver (Ag), or the like, and may be formed as a thin film type transmission electrode. In some embodiments, to manufacture a top-emission light-emitting diode, the transmission electrode may comprise indium tin oxide (ITO) or indium zinc oxide (IZO).

Although the organic light-emitting diode of the FIGURE is described above, the present embodiments are not limited thereto.

When a phosphorescent dopant is used in the EML, a HBL may be formed between the HTL and the EML or between the H-functional layer and the EML by using vacuum deposition, spin coating, casting, Langmuir-Blodgett (LB) deposition, or the like, in order to prevent diffusion of triplet excitons or holes into the ETL. When the HBL is formed using vacuum deposition or spin coating, the conditions for deposition and coating may be similar to those for the formation of the HIL, although the conditions for deposition and coating may vary according to the material that is used to form the HBL. Any known hole-blocking material may be used. Non-limiting examples of hole-blocking materials are oxadiazole derivatives, triazole derivatives, and phenanthroline derivatives. For example, bathocuproine (BCP) represented by the following formula may be used as a material for forming the HBL.

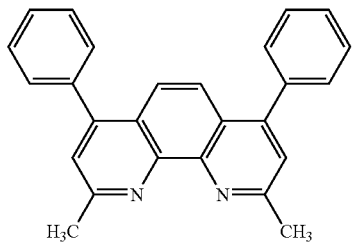 [SMILES: Cc1cc(-c2ccccc2)c2ccc3c(-c4ccccc4)cc(C)nc3c2n1]

BCP

The thickness of the HBL may be from about 20 Å to about 1000 Å, and in some embodiments, may be from about 30 Å to about 300 Å. When the thickness of the HBL is within these ranges, the HBL may have improved hole blocking ability without a substantial increase in driving voltage.

As used herein, the unsubstituted $C_1$-$C_{60}$ alkyl group (or a $C_1$-$C_{60}$ alkyl group) may be a linear or branched C1-C60 alkyl group, including a methyl group, an ethyl group, a propyl group, an isobutyl group, a sec-butyl group, a pentyl group, an iso-amyl group, and a hexyl group. The substituted $C_1$-$C_{60}$ alkyl group may include at least one substituent selected from a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ an alkenyl group, a $C_2$-$C_{60}$ alkynyl group, and a $C_1$-$C_{60}$ alkoxy group; a $C_1$-$C_{60}$ alkyl group, a $C_2$-$C_{60}$ alkenyl group, a $C_2$-$C_{60}$ alkynyl group, and a $C_1$-$C_{60}$ alkoxy group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof; a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group; a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group that are substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group; and —N($Q_{11}$)($Q_{12}$) and —Si($Q_{11}$)($Q_{12}$)($Q_{13}$) (where $Q_{11}$ and $Q_{12}$ may be each independently a $C_6$-$C_{60}$ aryl group, or a $C_2$-$C_{60}$ heteroaryl group, and $Q_{13}$ to $Q_{15}$ may be each independently a $C_1$-$C_{60}$ alkyl group, a $C_1$-$C_{60}$ alkoxy group, a $C_6$-$C_{60}$ aryl group, or a $C_2$-$C_{60}$ heteroaryl group), but is not limited thereto.

As used herein, the unsubstituted $C_1$-$C_{60}$ alkoxy group (or a $C_1$-$C_{60}$ alkoxy group) is represented by —OA (where A indicates a $C_1$-$C_{60}$ alkyl group as described above), and may be, for example, a methoxy group, an ethoxy group, or an isopropoxy group. At least one hydrogen atoms of these alkyl groups may be substituted with those substituents described above in conduction with the substituted $C_1$-$C_{60}$ alkyl group.

As used herein, the unsubstituted $C_2$-$C_{60}$ alkenyl group (or a $C_2$-$C_{60}$ alkenyl group) means as a $C_2$-$C_{60}$ alkyl group as described above with at least one carbon double bond in the middle or terminal thereof. Examples of the alkenyl group are an ethenyl group, a propenyl group, a butenyl group, and the like. At least one hydrogen atom in the unsubstituted $C_2$-$C_{60}$ alkenyl group may be substituted with those substituents described above in conjunction with the substituted $C_1$-$C_{60}$ alkyl group.

The unsubstituted $C_2$-$C_{60}$ alkynyl group is a $C_2$-$C_{60}$ alkyl group having at least one carbon-carbon triple bond in the center or at a terminal thereof. Examples of the unsubstituted $C_2$-$C_{60}$ alkynyl group are an ethenyl group, a propynyl group, and the like. At least one hydrogen atom in the alkynyl group may be substituted with those substituents described above in conjunction with the substituted $C_1$-$C_{60}$ alkyl group.

The unsubstituted $C_6$-$C_{60}$ aryl group is monovalent carbocyclic aromatic system having 6 to 60 carbon atoms including at least one aromatic ring. The unsubstituted $C_6$-$C_{60}$ arylene group is a divalent group having a divalent carbocyclic aromatic system having 6 to 60 carbon atoms including at least one aromatic ring. When the aryl group and the arylene group have at least two rings, they may be fused to each other via a single bond. At least one hydrogen atom in the aryl group and the arylene group may be substituted with those substituents described above in conjunction with the $C_1$-$C_{60}$ alkyl group.

Examples of the substituted or unsubstituted $C_6$-$C_{60}$ aryl group are a phenyl group, a $C_1$-$C_{10}$ alkylphenyl group (e.g., an ethylphenyl group), a $C_1$-$C_{10}$ alkylbiphenyl group (e.g., an ethylbiphenyl group), a halophenyl group (e.g., an o-, m- or p-fluorophenyl group and a dichlorophenyl group), a dicyanophenyl group, a trifluoromethoxyphenyl group, an o-, m- or p-tolyl group, an o-, m- or p-cumenyl group, a mesityl group, a phenoxyphenyl group, a (α,α-dimethylbenzene)phenyl group, a (N,N'-dimethyl)aminophenyl group, a (N,N'-diphenyl)aminophenyl group, a pentalenyl group, an indenyl group, a naphthyl group, a halonaphthyl group (e.g., a fluoronaphthyl group), a $C_1$-$C_{10}$ alkylnaphthyl group (e.g., a methylnaphthyl group), a $C_1$-$C_{10}$ alkoxynaphthyl group (e.g., a methoxynaphthyl group), an anthracenyl group, an azulenyl group, a heptalenyl group, an acenaphthylenyl group, a phenalenyl group, a fluorenyl group, an anthraquinolinyl group, a methylanthryl group, a phenanthryl group, a triphenylenyl group, a pyrenyl group, a chrysenyl group, an ethyl-chrysenyl group, a picenyl group, a perylenyl group, a chloroperylenyl group, a pentaphenyl group, a pentacenyl group, a tetraphenylenyl group, a hexaphenyl group, hexacenyl group, a rubicenyl group, a coronenyl group, a trinaphthylenyl group, a heptaphenyl group, a heptacenyl group, a pyranthrenyl group, and an ovalenyl group. Examples of the substituted $C_6$-$C_{60}$ aryl group may be inferred based on those of the unsubstituted $C_6$-$C_{60}$ aryl group and the substituted $C_1$-$C_{30}$ alkyl group described above. Examples of the substituted or unsubstituted $C_6$-$C_{60}$ arylene group may be inferred based on those examples of the substituted or unsubstituted $C_6$-$C_{60}$ aryl group described above.

The unsubstituted $C_2$-$C_{60}$ heteroaryl group is a monovalent group having at least one aromatic ring having at least one of the heteroatoms selected from the group consisting of N, O, P, and S. The unsubstituted $C_2$-$C_{60}$ heteroarylene group is a divalent group having at least one aromatic ring having at least one of the heteroatoms selected from the group consisting of N, O, P, and S. In this regard, when the heteroaryl group and the heteroarylene group have at least two rings, they may be fused to each other via a single bond. At least one hydrogen atom in the heteroaryl group and the heteroarylene group may be substituted with those substituents described with reference to the $C_1$-$C_{60}$ alkyl group.

Examples of the unsubstituted $C_2$-$C_{60}$ heteroaryl group are a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolinyl group, an isoquinolinyl group, a benzoimidazolyl group, an imidazopyridinyl group and an imidazopyrimidinyl group. Examples of the substituted or unsubstituted $C_2$-$C_{60}$ heteroarylene group may be inferred based on those examples of the substituted or unsubstituted $C_2$-$C_{60}$ arylene group described above.

The substituted or unsubstituted $C_6$-$C_{60}$ aryloxy group indicates —$OA_2$ (where $A_2$ is a substituted or unsubstituted $C_6$-$C_{60}$ aryl group described above). The substituted or unsubstituted $C_5$-$C_{60}$ arylthiol group indicates —$SA_3$ (where $A_3$ is a substituted or unsubstituted $C_6$-$C_{60}$ aryl group described above).

Hereinafter, the present embodiments will be described in detail with reference to the following synthesis examples and other examples. However, these examples are for illustrative purposes only and are not intended to limit the scope of the present embodiments.

EXAMPLES

Synthesis Example 1: Synthesis of Compound 2

Compound 2 was synthesized according to Reaction Scheme 1 below:

Reaction Scheme 1

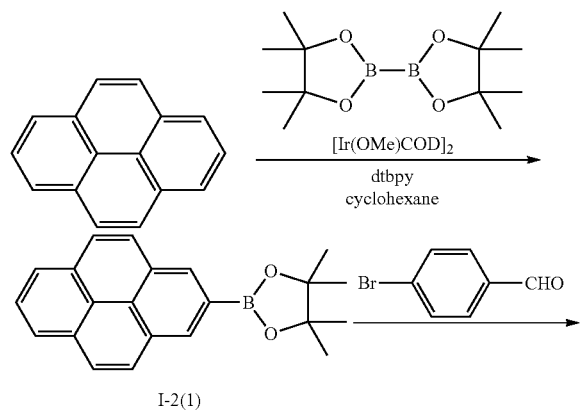

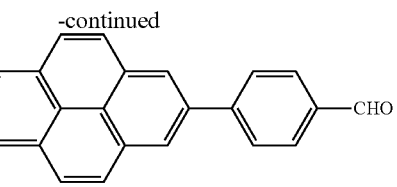

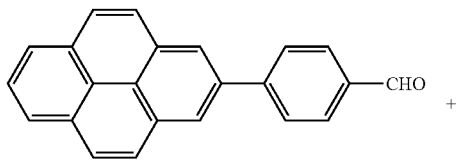

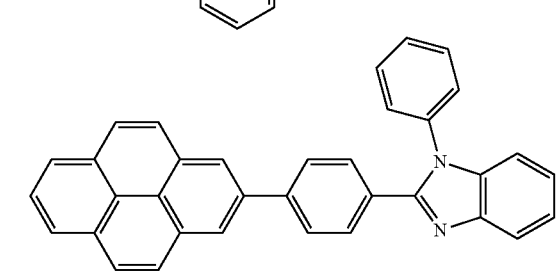

Synthesis of Intermediate I-2(1)

4.04 g (20.0 mmol) of pyrene, 5.59 g (22.0 mmol) of bis(pinacolato)diborane, 0.66 g (1.0 mmol) of 1,5-cyclooctadiene(methoxy)iridium(I) dimmer(Ir(OMe)COD]$_2$), and 0.54 g (2.0 mmol) of 4,4'-di-tert-butyl-2,2'-bipyridine (dtbpy) were mixed with 80 mL of cyclohexane to obtain a mixture, which was then stirred at about 80 □ for about 24 hours. The resulting mixture was cooled down to room temperature, followed by evaporation to remove the solvent. The residue was separated and purified by silica gel column chromatography to obtain 4.26 g of Intermediate I-1 (Yield: 65%). This compound was identified using liquid chromatography-mass spectroscopy (LC-MS).

$C_{22}H_{21}BO_2$ M+ 329.1

Synthesis of Intermediate I-2(2)

3.28 g (10.0 mmol) of Intermediate I-2, 1.85 g (10.0 mmol) of 4-bromobenzaldehyde, 0.58 g (0.5 mmol) of tetrakis(triphenylphosphine)palladium (Pd(PPh$_3$)$_4$), and 4.14 g (30.0 mmol) of K$_2$CO$_3$ were dissolved in 60 mL of a mixed solution of tetrahydrofuran (THF) and H$_2$O (2:1 by volume), and then stirred at about 80 □ for about 5 hours. The reaction solution was cooled down to room temperature, followed by three times of extraction with 60 mL of water and 60 mL of diethyl ether. An organic layer was collected, and was dried using magnesium sulfate to evaporate the solvent. The residue was separated and purified using silica gel column chromatography to obtain 2.14 g of Intermediate I-2(2) (Yield: 70%). This compound was identified using LC-MS.

C$_{23}$H$_{14}$O M+307.1

Synthesis of Compound 2

2.14 g (7.0 mmol) of Intermediate I-2(2) and 1.29 g (7 mmol) of N-phenyl-1,2-diaminobenzene were mixed with 50 mL of toluene and 10 mL of acetic acid, and then heated while stirring for about 24 hours. The reaction solution was cooled down to room temperature, followed by adding distilled water to obtain a precipitate, which was then filtered. An organic layer was collected and was dried using magnesium sulfate to evaporate the solvent. The residue was separated and purified using silica gel column chromatography to obtain 2.47 g of Compound 2 (Yield: 75%). This compound was identified using mass spectroscopy/fast atom bombardment (MS/FAB) and proton nuclear magnetic resonance ($^1$H NMR).

C$_{35}$H$_{22}$N$_2$ cal. 470.18. found 471.18.

$^1$H NMR (400 MHz, CDCl$_3$) δ=8.30 (s, 2H), 8.23 (d, 2H), 8.09-8.01 (m, 3H), 7.84-7.71 (m, 7H), 7.66 (d, 1H), 7.58-7.55 (m, 2H), 7.45-7.35 (m, 3H), 7.32-7.20 (m, 2H)

Synthesis Example 2

Synthesis of Compound 6

Compound 2 was synthesized according to Reaction Scheme 2 below:

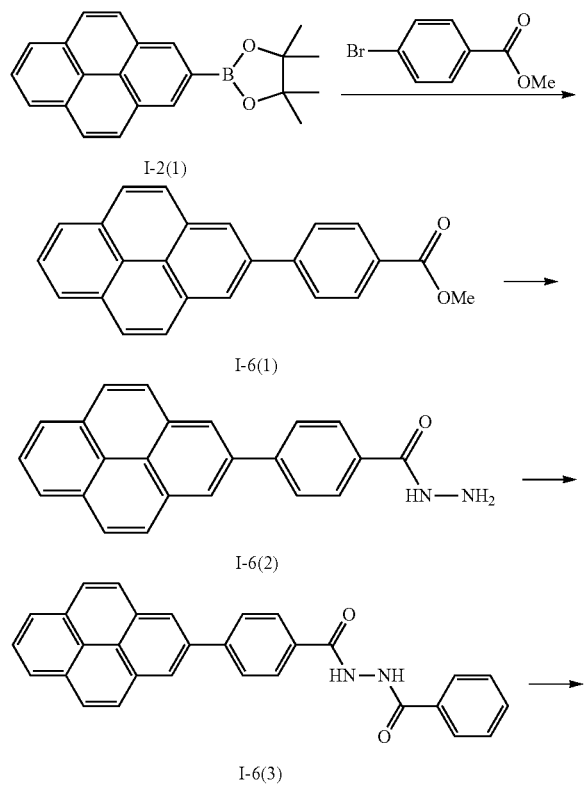

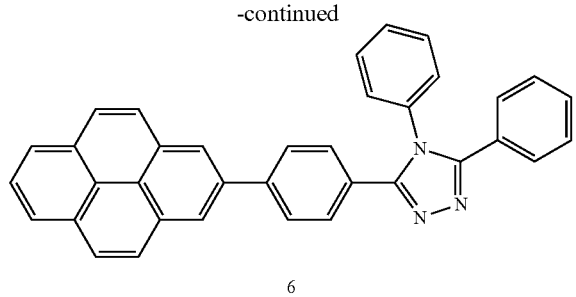

6

Synthesis of Intermediate I-6(1)

3.56 g (20.0 mmol) of Intermediate I-2, 3.70 g (20.0 mmol) of 4-bromobenzoic acid methylester, 1.16 g (1 mmol) of tetrakis(triphenylphosphine)palladium (Pd(PPh$_3$)$_4$), and 8.28 g (60.0 mmol) of K$_2$CO$_3$ were dissolved in 150 mL of a mixed solution of THF and H$_2$O (2:1 by volume), and then stirred at about 80 □ for about 5 hours. The reaction solution was cooled down to room temperature, followed by three times of extraction with 60 mL of water and 100 mL of diethyl ether. An organic phase was collected, and was dried using magnesium sulfate to evaporate the solvent. The residue was separated and purified using silica gel column chromatography to obtain 5.04 g of Intermediate I-6(1) (Yield: 75%). This compound was identified using LC-MS.

C$_{24}$H$_{16}$O$_2$ M+ 337.1

Synthesis of Intermediate i-6(2)

5.04 g (15 mmol) of Intermediate I-6(1) was dissolved in 3 mL (60 mmol) of hydrazine monohydrate were dissolved in 100 mL of methanol, and then stirred at room temperature for about 2 hours and further at about 80° C. for about 20 hours. The reaction solution was cooled down to room temperature to precipitate a white solid, which was then filtered, washed with methanol, and dried to obtain 4.54 g of Intermediate I-6(2) (Yield: 90%). This compound was identified using LC-MS.

C$_{23}$H$_{16}$N$_2$O M+337.1

Synthesis of Intermediate I-6(3)

After 4.54 g (13.5 mmol) of Intermediate I-6(3) and 4.6 mL (26.4 g) of diisopropylethylamine were dissolved in 50 mL of xylene, 2.4 mL (20.25 mmol) of benzoyl chloride was dropwise added thereinto at about 0 □, After 20 minutes the solution was reacted at about 140 □, followed by cooling to room temperature to precipitate a white solid, which was then filtered, washed, and then dried to obtain 4.3 g of Intermediate I-6(3) (Yield: 73%). This compound was identified using LC-MS.

C$_{30}$H$_2$ON$_2$O$_2$ M+441.1

Synthesis of Compound 6

After 3.96 g (9 mmol) of Intermediate I-6(3), 4.70 g (54 mmol) of aniline were dispersed in 1,2-dichlorobenzene, 0.84 mL (9 mmol) of POCl$_3$ was slowly dropwise added thereto. The reaction solution was stirred at about 180 □ for about 4 hours for reaction, followed by cooling to room temperature to precipitate a white solid, which was then filtered. The resulting solid was dispersed in a 2M NaOH solution, and then heated at about 70 □ while stirring, followed by filtering to obtain a solid, which was then washed with water and dried to obtain 3.05 g of Compound 6 (Yield: 68%). This compound was identified using MS/FAB and $^1$H NMR.

$C_{36}H_{23}N_3$ cal. 497.19. found 498.29.

$^1$H NMR (400 MHz, CDCl$_3$) δ=8.30 (s, 2H), 8.23 (d, 2H), 8.09-8.01 (m, 5H), 7.90 (d, 2H), 7.82 (d, 2H), 7.69-7.65 (m, 2H), 7.58-7.50 (m, 3H), 7.42-7.39 (m, 2H), 7.37-7.28 (m, 3H)

Synthesis Example 3: Synthesis of Compound 8

Compound 8 was synthesized according to Reaction Scheme 3 below:

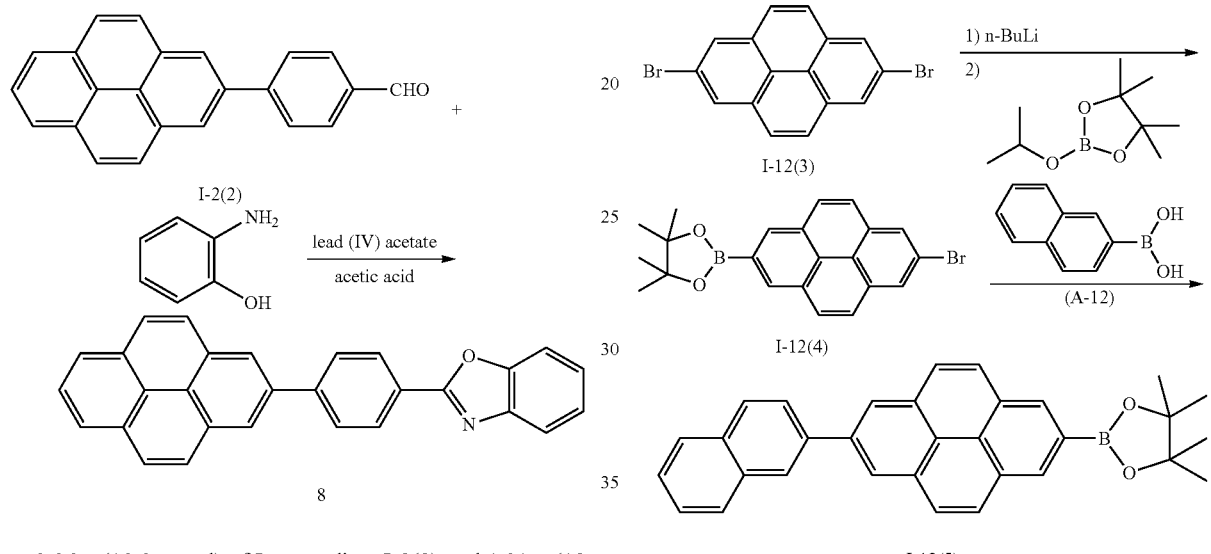

Reaction Scheme 3

3.06 g (10.0 mmol) of Intermediate I-2(2) and 1.31 g (12 mmol) of 2-aminophenol were dissolved in 80 mL of acetic acid, and then stirred at room temperature for about 30 minutes. 5.32 g (12 mmol) of lead(IV) acetate was added into the mixture, and stirred at 50° C. for 1 hour. The resulting reaction product was added with water, followed by extraction with ethyl acetate and evaporation under reduced pressure to remove the solvent. The residue was purified by column separation, and dried to obtain 1.97 g of Compound 8 as white solid (Yield: 50%). This compound was identified using MS/FAB and $^1$H NMR.

$C_{29}H_{17}NO$ cal. 395.13. found 396.23.

$^1$H NMR (400 MHz, CDCl$_3$) δ=8.32-8.29 (m, 4H), 8.22 (d, 2H), 8.13-8.01 (m, 5H), 7.82 (d, 2H), 7.72 (d, 1H), 7.43 (d, 2H), 7.30-7.23 (m, 1H)

Synthesis Example 4: Synthesis of Compound 12

Intermediate I-12(5) was synthesized according to Reaction Scheme 4 below:

Reaction Scheme 4

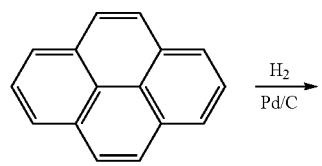

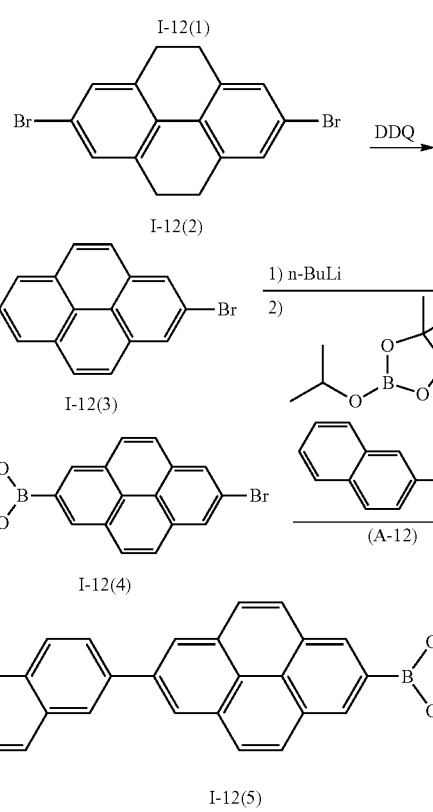

Synthesis of Intermediate I-12(1)

4.04 g (20 mmol) of pyrene was dissolved in 50 mL of methyl chloroform (MC) to obtain a reaction solution, which was then added with 100 mg (0.2 mmol) of 10% palladium. The reaction solution was stirred in a hydrogen atmosphere for about 12 hours, and then filtered through Celite to obtain palladium precipitate, followed by drying in a vacuum to remove the solvent and obtain 3.50 g of Intermediate I-12(1) (Yield: 85%). This compound was identified using LC-MS.

$C_{16}H_{14}$ M+207.1

Synthesis of Intermediate I-12(2)

3.56 g (20 mmol) of N-bromosuccinimide (NBS) was completely dissolved in 50 mL of dimethylformamide (DMF) to obtain a solution, which was then added with 2.06 g (10 mmol) of Intermediate I-12(1) and stirred at room temperature for about 24 hours. The reaction solution was extracted twice with 50 mL of water and 50 mL of dichloromethane. An organic layer was collected and dried using magnesium sulfate to evaporate the solvent. The residue was separated and purified using silica gel column chromatography to obtain 2.51 g of Intermediate I-12(2) (Yield: 69%). This compound was identified using LC-MS.

$C_{16}H_{12}Br_2$ M+362.9

Synthesis of Intermediate I-12(3)

3.64 g (10 mmol) of Intermediate I-12(2) was dissolved in 50 mL of MC to obtain a reaction solution, which was then added with 2.50 g (11 mmol) of 2,3-dichloro-5,6-dicyano-p-quinone. The reaction solution was stirred for about 12 hours, and then filtered through Celite to obtain palladium precipitate, followed by drying in a vacuum to remove the solvent and obtain 2.74 g of Intermediate I-12(3) (Yield: 76%). This compound was identified using LC-MS.

$C_{16}H_8Br_2$ M+358.9

Synthesis of Intermediate I-12(4)

3.64 g (10 mmol) of intermediate I-12(3) and 6.25 mL (10 mmol) of n-BuLi (1.60M hexane solution) were reacted with THF at about −78 □ for 3 hours. The reaction solution was added at about −78 □ with 2.04 g (12 mmol) of 2-isopropylboronic acid pinacol ester, and then stirred at room temperature for about 12 hours, followed by adding 5 mL of a 1N HCl aqueous solution into the reaction solution. After an organic layer was separated from the reaction solution, the remaining aqueous layer was extracted twice with 100 mL of dichloromethane to obtain the organic layer. The organic layer was dried using magnesium sulfate to evaporate the solvent. The residue was separated and purified using silica gel column chromatography to obtain 3.20 g of Intermediate I-12(4) (Yield: 78%). This compound was identified using LC-MS.

$C_{22}H_{20}BBrO_2$ M+407.0

Synthesis of Intermediate I-12(5)

4.11 g (10 mmol) of Intermediate I-12(4), 2.58 g (15 mmol) of 2-naphthyl boronic acid (Compound A-12), 0.29 g (0.25 mmol) of tetrakis(triphenylphosphine)palladium (Pd (PPh₃)₄), and 0.62 g (4.48 mmol) of K₂CO₃ were dissolved in 60 mL of a mixed solution of THF and H₂O (2:1 by volume), and then stirred at about 70 □ for about 5 hours. The reaction solution was cooled down to room temperature, and 40 mL of water was added thereto, followed by three times of extraction with 50 mL of ethylether. An organic layer was collected, and was dried using magnesium sulfate to evaporate the solvent. The residue was separated and purified using silica gel column chromatography to obtain 3.39 g of Intermediate I-12(5) (Yield: 74%). This compound was identified using LC-MS.

$C_{32}H_{27}BO_2$ M+455.2

Synthesis of Compound 12

Compound 12 was synthesized in the same manner as in Synthesis Example 1, except that Intermediate I-12(5) instead of Intermediate I-2(1) was used. This compound was identified using MS/FAB and ¹H NMR.

$C_{45}H_{28}N_2$ cal. 596.23. found 597.23.

¹H NMR (400 MHz, CDCl₃) δ=8.37 (s, 2H), 8.31 (s, 2H), 8.24 (s, 1H), 8.02-7.92 (m, 7H), 7.86 (d, 1H), 7.80-7.72 (m, 5H), 7.66 (d, 1H), 7.62-7.49 (m, 4H), 7.44-7.36 (m, 3H), 7.32-7.21 (m, 2H)

Synthesis Example 5: Synthesis of Compound 16

Synthesis of Intermediate I-16

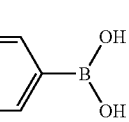
(A-16)

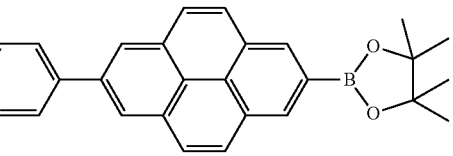
I-16

Intermediate I-16 was synthesized in the same manner as in the synthesis of Intermediate I-12(5) in Synthesis Example 4, except that Compound A-16 instead of Compound A-12 was used. This compound was identified using LC-MS.

$C_{32}H_{33}BO_2$ M+461.2

Synthesis of Compound 16

Compound 16 was synthesized in the same manner as in Synthesis Example 2, except that Intermediate I-16 instead of Intermediate I-2(1) was used. This compound was identified using MS/FAB and ¹H NMR.

$C_{46}H_{35}N_3$ cal. 629.28. found 629.28.

¹H NMR (400 MHz, CDCl₃) δ=8.31 (s, 2H), 8.24 (s, 2H), 8.07 (d, 2H), 7.94 (d, 4H), 7.89 (d, 2H), 7.70-7.65 (m, 2H), 7.62-7.51 (m, 5H), 7.42-7.40 (m, 2H), 7.37-7.28 (m, 5H), 1.39 (s, 9H)

Synthesis Example 6: Synthesis of Compound 18

Synthesis of Intermediate I-18

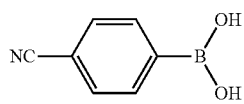
(A-18)

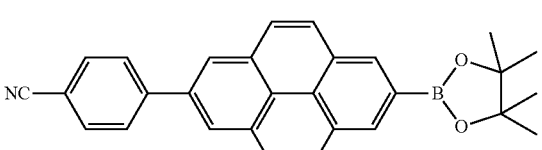
I-18

Intermediate I-18 was synthesized in the same manner as in the synthesis of Intermediate I-12(5) in Synthesis Example 4, except that Compound A-18 instead of Compound A-12 was used. This compound was identified using LC-MS.

$C_{29}H_{24}BNO_2$ M+430.2

Synthesis of Compound 18

Compound 18 was synthesized in the same manner as in Synthesis Example 3, except that Intermediate I-18 instead of Intermediate I-2(1) was used. This compound was identified using MS/FAB and $^1$H NMR.

C$_{36}$H$_{20}$N$_2$O cal. 496.16. found 497.16.

$^1$H NMR (400 MHz, CDCl$_3$) δ=8.32-8.29 (m, 6H), 8.12 (d, 2H), 7.94 (s, 4H), 7.77 (d, 2H), 7.71 (d, 1H) 7.65 (d, 2H), 7.43 (d, 2H), 7.29-7.23 (m, 1H)

Synthesis Example 7: Synthesis of Compound 22

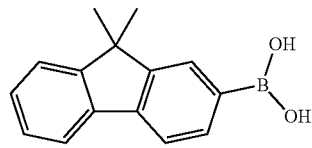

A-22

Compound 22 was synthesized in the same manner as in Synthesis Example 4, except that Compound A-22 instead of Compound A-12 in the synthesis of Intermediate I-12(5) was used. This compound was identified using MS/FAB and $^1$H NMR.

C$_{50}$H$_{34}$N$_2$ cal. 662.27. found 663.29.

$^1$H NMR (400 MHz, CDCl$_3$) δ=8.31 (s, 2H), 8.14 (s, 2H), 8.00-7.92 (m, 5H), 7.81-7.71 (m, 8H), 7.66 (d, 1H), 7.58-7.53 (m, 2H), 7.44-7.28 (m, 5H), 7.25-7.21 (m, 1H), 7.15-7.09 (m, 2H), 1.57 (s, 6H)

Synthesis Example 8: Synthesis of Compound 26

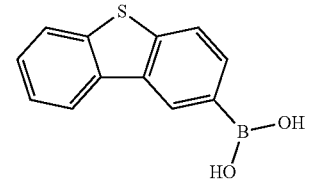

A-26

Compound 26 was synthesized in the same manner as in Synthesis Example 5, except that Compound A-26 instead of Compound A-16 in the synthesis of Intermediate I-16 was used. This compound was identified using MS/FAB and $^1$H NMR.

C$_{48}$H$_{29}$N$_3$S cal. 679.21. found 680.23.

$^1$H NMR (400 MHz, CDCl$_3$) δ=8.57-8.55 (m, 1H), 8.31 (s, 2H), 8.22 (s, 2H), 8.11-8.05 (m, 3H), 8.00-7.88 (m, 8H), 7.79 (d, 1H), 7.70-7.63 (m, 2H), 7.58-7.50 (m, 4H), 7.46-7.28 (m, 6H)

Synthesis Example 9: Synthesis of Compound 28

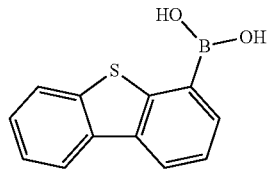

A-28

Compound 28 was synthesized in the same manner as in Synthesis Example 6, except that Compound A-28 instead of Compound A-18 in the synthesis of Intermediate I-18 was used. This compound was identified using MS/FAB and $^1$H NMR.

C$_{41}$H$_{23}$NOS cal. 577.15. found 578.25.

$^1$H NMR (400 MHz, CDCl$_3$) δ=8.32-8.29 (m, 6H), 8.17-8.10 (m, 4H), 7.98-7.84 (m, 6H), 7.72 (d, 1H), 7.57-7.53 (m, 1H), 7.45-7.37 (m, 4H), 7.29-7.23 (m, 1H)

Synthesis Example 10: Synthesis of Compound 32

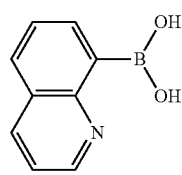

A-32

Compound 32 was synthesized in the same manner as in Synthesis Example 4, except that Compound A-32 instead of Compound A-12 in the synthesis of Intermediate I-12(5) was used. This compound was identified using MS/FAB and $^1$H NMR.

C$_{44}$H$_{27}$N$_3$ cal. 597.22. found 598.32.

$^1$H NMR (400 MHz, CDCl$_3$) δ=8.99 (m, 1H), 8.39-8.06 (m, 15H), 7.84-7.59 (m, 4H), 7.41-7.22 (m, 7H)

Synthesis Example 11: Synthesis of Compound 5

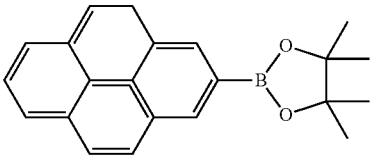

I-2(1)

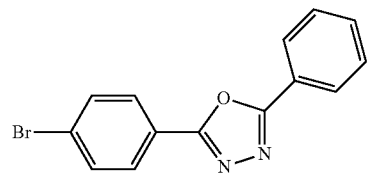

A-5

3.28 g (10.0 mmol) of Intermediate I-2(1), 3.01 g (10.0 mmol) of Compound A-5, 0.58 g (0.5 mmol) of tetrakis(triphenylphosphine)palladium (Pd(PPh$_4$)$_4$), and 4.14 g (30.0 mmol) of K$_3$CO$_3$ were dissolved in 60 mL of a mixed solution of THF and H$_2$O (2:1 by volume), and then stirred at about 80 □ for about 5 hours. The reaction solution was cooled down to room temperature, followed by three times of extraction with 60 mL of water and 60 mL of diethyl ether. An organic layer was collected, and was dried using magnesium sulfate to evaporate the solvent. The residue was separated and purified using silica gel column chromatography to obtain 2.95 g of Compound 5 (Yield: 70%). This compound was identified using MS/FAB and $^1$H NMR.

C$_{30}$H$_{18}$N$_2$O cal. 422.14. found 423.15.

$^1$H NMR (400 MHz, CDCl$_3$) δ=8.29 (s, d, m, 4H), 8.09-8.00 (m, 5H), 7.82 (d, 2H), 7.60-7.52 (m, 3H)

Synthesis Example 12: Synthesis of Compound 13

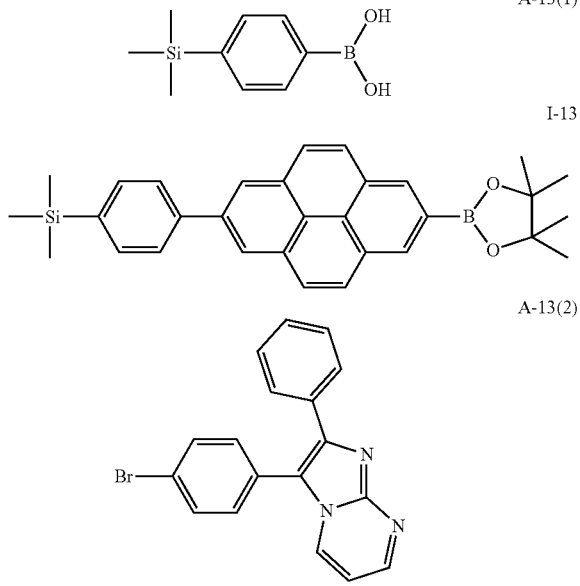

A-13(1)

I-13

A-13(2)

Synthesis of Intermediate I-13

Intermediate I-13 was synthesized in the same manner as in the synthesis of Intermediate I-12(4) in Synthesis Example 4, except that Compound A-13(1) instead of Compound A-12 was used. This compound was identified using LC-MS.

$C_{32}H_{33}BO_2$ M+461.2

Synthesis of Compound 13

Compound 13 was synthesized in the same manner as in the synthesis of Compound 5 in Synthesis Example 11, except that Intermediate I-13 and Compound A-13(2) instead of Intermediate I-2(1) and Compound A-5, respectively, were used. This compound was identified using MS/FAB and $^1$H NMR.

$C_{43}H_{37}SiN_3O$ cal. 619.24. found 620.24.

$^1$H NMR (400 MHz, CDCl$_3$) δ=9.07 □□d, 1H), 8.60 (d, 1H), 8.31 (s, 2H), 8.15 (s, 2H), 7.96 (s, 4H), 7.94 (s, 4H), 7.85 (d, 2H), 7.67 (d, 2H), 7.56, (d, 2H), 7.45-7.37 (m, 3H), 7.18-7.15 (m, 1H), 0.35 (s, 9H)

Synthesis Example 13: Synthesis of Compound 19

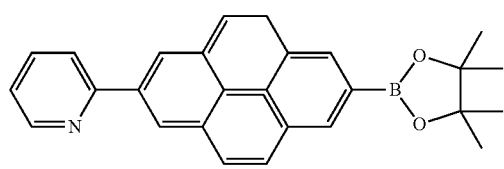

I-19(5)

-continued

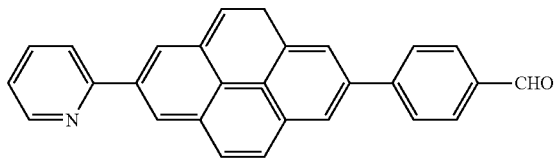

I-19(6)

Synthesis of Intermediate I-19(5)

Intermediate I-19(5) was synthesized in the same manner as in the synthesis of Intermediate I-12(5) in Synthesis Example 4, except that 2-pyridine boronic acid instead of Compound A-12 was used.

Synthesis of Intermediate I-19(6)

Intermediate I-19(6) was synthesized in the same manner as in the synthesis of Intermediate I-2(2) in Synthesis Example 1, except that Intermediate I-19(5) instead of Intermediate I-2(1) was used.

Synthesis of Compound 19

Compound 19 was synthesized in the same manner as in the synthesis of Compound 8 in Synthesis Example 3, except that Intermediate I-19(6) and 2-aminothiophenol instead of Intermediate I-2(2) and 2-aminophenol, respectively, were used. This compound was identified using MS/FAB and $^1$H NMR.

$C_{33}H_{21}SN_2$ cal. 488.13. found 489.15.

$^1$H NMR (400 MHz, CDCl$_3$) δ=8.67 □□dd, 1H), 8.51 (s, 2H), 8.31 (s, 2H), 8.28-8.25 (m, 2H), 8.18 (d, 2H), 8.04-7.99 (m, 3H), 7.89-7.82 (m, 4H), 7.77-7.73 (m, 1H), 7.47-7.27 (m, 3H)

Synthesis Example 14: Synthesis of Compound 31

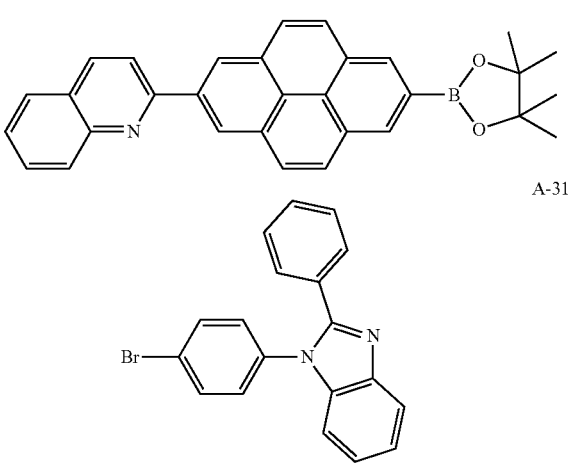

I-31

A-31

Compound 31 was synthesized in the same manner as in the synthesis of Compound 5 in Synthesis Example 11, except that Intermediate I-31 and Compound A-31 instead of Intermediate I-2(1) and Compound A-5, respectively, were used. This compound was identified using MS/FAB and $^1$H NMR.

$C_{34}H_{27}N_3$ cal. 597.22. found 598.32.
$^1$H NMR (400 MHz, CDCl$_3$) δ=8.61 □□s, 2H), 8.28 (s, 2H), 8.25-8.19 (m, 4H), 8.08-7.99 (m, 5H), 7.86-7.63 (m, 7H), 7.41-7.20 (m, 7H)

Synthesis Example 15: Synthesis of Compound 34

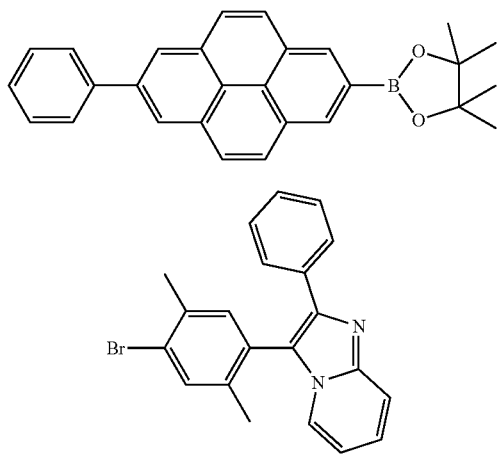

Compound 34 was synthesized in the same manner as in the synthesis of Compound 5 in Synthesis Example 11, except that Intermediate I-34 and Compound A-34 instead of Intermediate I-2(1) and Compound A-5, respectively, were used. This compound was identified using MS/FAB and $^1$H NMR.

$C_{43}H_{30}N_2$ cal. 574.24. found 575.34.
$^1$H NMR (400 MHz, CDCl$_3$) δ=8.72 □□d, 1H), 8.29 (s, 2H), 7.98-7.69 (m, 4H), 7.89-7.82 (m, 4H), 7.77-7.72 (m, 2H), 7.66 (d, 1H), 7.48-7.34 (m, 9H), 6.90 (t, 1H), 2.29 (s, 3H), 2.19 (s, 3H)

Synthesis Example 16: Synthesis of Compound 43

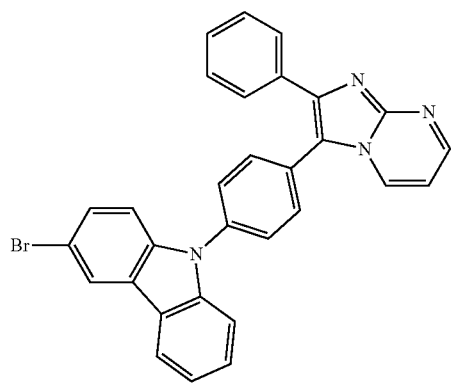

Compound 43 was synthesized in the same manner as in the synthesis of Compound 5 in Synthesis Example 11, except that Compound A-43 instead of Intermediate A-5 was used. This compound was identified using MS/FAB and $^1$H NMR.

$C_{46}H_{28}N_4$ cal. 636.23. found 637.25.
$^1$H NMR (400 MHz, CDCl$_3$) δ=9.07 □□d, 1H), 8.60 (d, 1H), 8.34 (s, 2H), 8.24-8.20 (m, 4H), 8.09-8.01 (m, 3H), 7.87-7.83 (m, 4H), 7.77-7.71 (m, 2H), 7.51-7.18 (m, 10H), 6.97 (t, 1H)

Synthesis Example 17: Synthesis of Compound 44

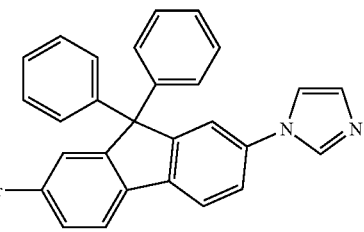

Compound 44 was synthesized in the same manner as in the synthesis of Compound 5 in Synthesis Example 11, except that Compound A-44 instead of Compound A-5 was used. This compound was identified using MS/FAB and $^1$H NMR.

$C_{46}H_{28}N_4$ cal. 584.23. found 585.34.
$^1$H NMR (400 MHz, CDCl$_3$) δ=8.23-8.21 (m, 4H), 8.09-8.1 (m, 3H), 7.93 (d, 1H), 7.87-7.82 (m, 3H), 7.69 (d, 1H), 7.56 (d, 1H), 7.34-7.27 (m, 4H), 7.22 (m, 2H), 7.15-7.06 (m, 9H)

Synthesis Example 18: Synthesis of Compound 47

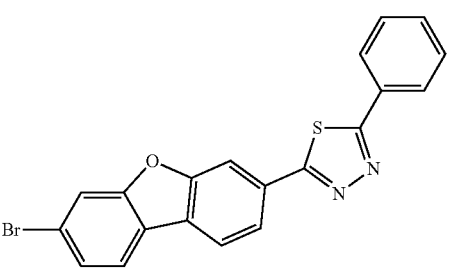

Compound 47 was synthesized in the same manner as in the synthesis of Compound 5 in Synthesis Example 11, except that Compound A-47 instead of Compound A-5 was used. This compound was identified using MS/FAB and $^1$H NMR.

$C_{36}H_{20}SON_2$ cal. 528.13. found 529.25.
$^1$H NMR (400 MHz, CDCl$_3$) δ=8.41 (s, 2H), 8.23-8.20 (m, 5H), 8.13-8.01 (m, 6H), 7.96 (d, 1H), 7.87 (s, 1H), 7.84 (s, 1H), 7.73 (m, 1H), 7.58-7.53 (m, 2H), 7.46-7.41 (m, 1H)

Synthesis Example 19: Synthesis of Compound 53

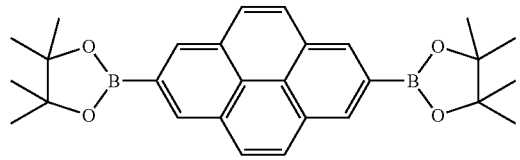

Compound 53 was synthesized in the same manner as in the synthesis of Compound 5 in Synthesis Example 11, except that Intermediate I-57 instead of Intermediate I-2(1), and 2 equivalents of Compound A-5 were used. This compound was identified using MS/FAB and $^1$H NMR.

$C_{44}H_{24}O_2N_4$ cal. 642.21. found 643.21.

$^1$H NMR (400 MHz, CDCl$_3$) δ=8.31 (s, 4H), 8.18-8.12 (m, 8H), 8.04-8.00 (m, 4H), 7.94 (s, 4H), 7.60-7.52 (m, 6)

Example 1

To manufacture an anode, a corning 15 Ω/cm$^2$ (1200 □) ITO glass substrate was cut to a size of 50 mm×50 mm×0.7 mm and then sonicated in isopropyl alcohol and pure water each for five minutes, and then cleaned by irradiation of ultraviolet rays for 30 minutes and exposure to ozone. The resulting glass substrate was loaded into a vacuum deposition device.

2-TNATA was deposited on the ITO layer (anode) to form an HIL having a thickness of about 600 □, and then NPB was deposited on the HIL to form a HTL having a thickness of about 300 □.

9,10-di-naphthalene-2-yl-anthracene (ADN, host) and DPAVBi (dopant) were co-deposited on the HTL in a weight ratio of about 98:2 to form an EML having a thickness of about 300 □.

Then, Compound 2 was deposited on the EML to form an ETL having a thickness of about 300 □, and then LiF was deposited on the ETL to form an EIL having a thickness of about 10 □. Then, Al was deposited on the EIL to form a second electrode (cathode) having a thickness of about 3000 □, thereby completing the manufacture of an organic light-emitting diode.

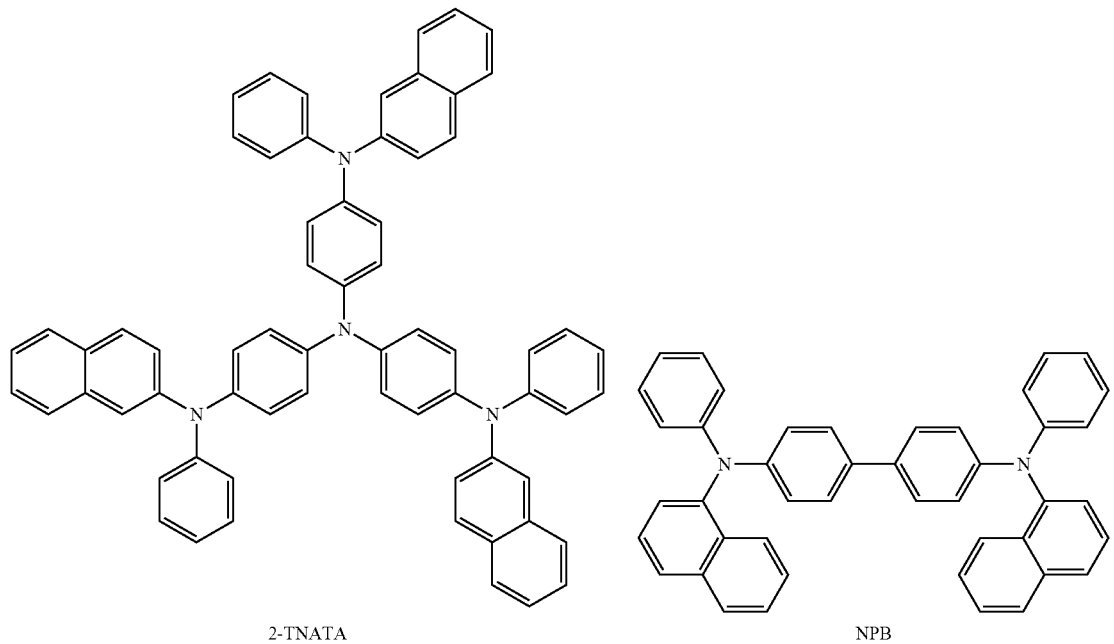

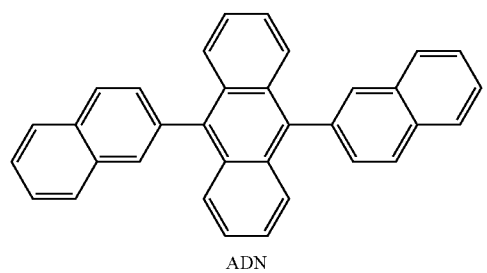

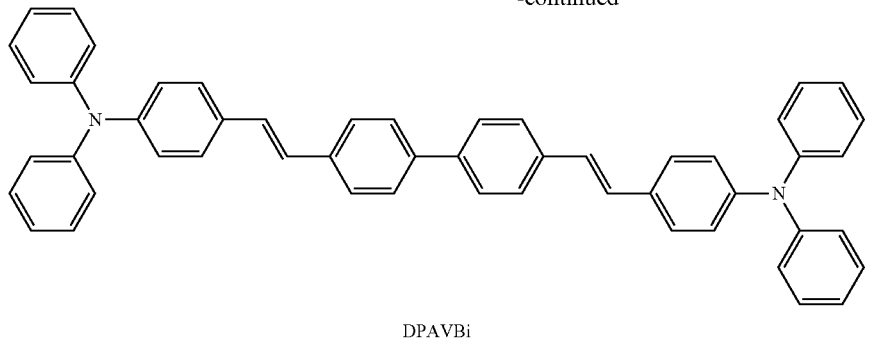

DPAVBi

Example 2

An organic light-emitting diode was manufactured in the same manner as in Example 1, except that Compound 8 instead of Compound 2 was used to form the ETL.

Example 3

An organic light-emitting diode was manufactured in the same manner as in Example 1, except that Compound 12 instead of Compound 2 was used to form the ETL.

Example 4

An organic light-emitting diode was manufactured in the same manner as in Example 1, except that Compound 16 instead of Compound 2 was used to form the ETL.

Example 5

An organic light-emitting diode was manufactured in the same manner as in Example 1, except that Compound 18 instead of Compound 2 was used to form the ETL.

Example 6

An organic light-emitting diode was manufactured in the same manner as in Example 1, except that Compound 19 instead of Compound 2 was used to form the ETL.

Example 7

An organic light-emitting diode was manufactured in the same manner as in Example 1, except that Compound 31 instead of Compound 2 was used to form the ETL.

Example 8

An organic light-emitting diode was manufactured in the same manner as in Example 1, except that Compound 43 instead of Compound 2 was used to form the ETL.

Example 9

An organic light-emitting diode was manufactured in the same manner as in Example 1, except that Compound 44 instead of Compound 2 was used to form the ETL.

Example 10

An organic light-emitting diode was manufactured in the same manner as in Example 1, except that Compound 53 instead of Compound 2 was used to form the ETL.

Comparative Example 1

An organic light-emitting diode was manufactured in the same manner as in Example 1, except that Compound A instead of Compound 2 was used to form the ETL.

Compound A

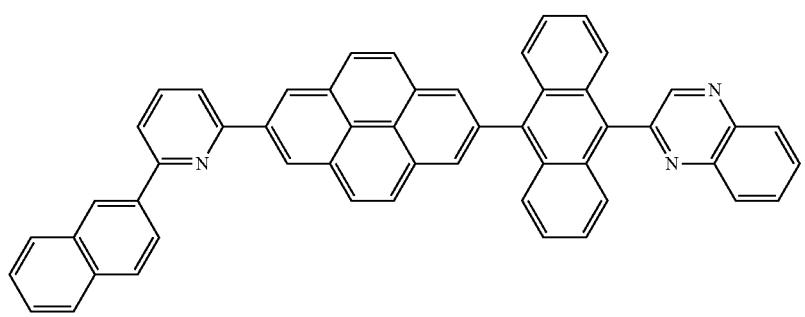

Comparative Example 2

An organic light-emitting diode was manufactured in the same manner as in Example 1, except that Compound B instead of Compound 2 was used to form the ETL.

Compound B

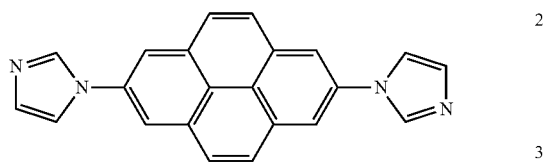

Comparative Example 3

An organic light-emitting diode was manufactured in the same manner as in Example 1, except that Compound C instead of Compound 2 was used to form the ETL.

Compound C

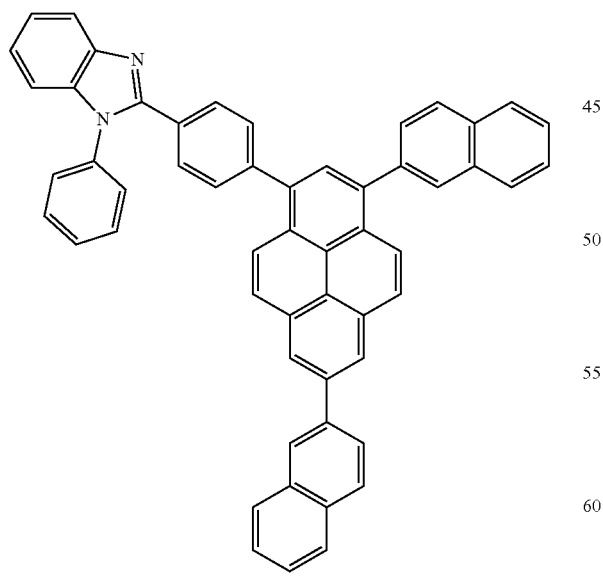

Driving voltages, current densities, luminances, emission colors, efficiencies, and half-life spans (@50 mA/cm$^2$) of the organic light-emitting diodes of Examples 1 to 10 and Comparative Examples 1 to 3 were evaluated using a PR650 (Spectroscan) Source Measurement Unit (available from Photo Research, Inc.). The results are shown in Table 1 below.

TABLE 1

| | ETL material | Dopant | Driving voltage (V) | Current density (mA/cm$^2$) | Luminance (cd/m$^2$) | Efficiency (cd/A) | Emission color | Half-lifespan (hr) |
|---|---|---|---|---|---|---|---|---|
| Example 1 | Compound 2 | DPAVBi | 5.43 | 50 | 3,075 | 6.15 | Blue | 320 |
| Example 2 | Compound 8 | DPAVBi | 5.21 | 50 | 3,025 | 6.05 | Blue | 330 |
| Example 3 | Compound 12 | DPAVBi | 6.05 | 50 | 3,380 | 6.76 | Blue | 290 |
| Example 4 | Compound 16 | DPAVBi | 5.95 | 50 | 3,105 | 6.21 | Blue | 370 |
| Example 5 | Compound 18 | DPAVBi | 6.12 | 50 | 3,450 | 6.90 | Blue | 280 |
| Example 6 | Compound 19 | DPAVBi | 5.20 | 50 | 2,880 | 5.76 | Blue | 260 |
| Example 7 | Compound 31 | DPAVBi | 5.54 | 50 | 2,940 | 5.88 | Blue | 310 |
| Example 8 | Compound 43 | DPAVBi | 5.33 | 50 | 2,950 | 5.90 | Blue | 260 |
| Example 9 | Compound 44 | DPAVBi | 5.90 | 50 | 3,160 | 6.32 | Blue | 305 |
| Example 10 | Compound 53 | DPAVBi | 5.30 | 50 | 3,225 | 6.45 | Blue | 280 |
| Comparative Example 1 | Compound A | DPAVBi | 7.35 | 50 | 2,065 | 4.12 | Blue | 145 h |
| Comparative Example 2 | Compound B | DPAVBi | 6.95 | 50 | 2,575 | 5.15 | Blue | 130 h |
| Comparative Example 3 | Compound C | DPAVBi | 6.83 | 50 | 2,660 | 5.32 | Blue | 143 h |

Referring to Table 1, the organic light-emitting diodes of Examples 1 to 10 were found to have lower driving voltages, higher luminances, higher efficiencies, higher color purities, and better lifetime characteristics as compared to the organic light-emitting diodes of Comparative Examples 1 to 3.

As described above, according to the one or more of the above embodiments, an organic light-emitting diode including any of the pyrene-based compounds of Formula 1 may have a low driving voltage, a high luminance, a high efficiency, and a long lifetime.

It should be understood that the example embodiments described therein should be considered in a descriptive sense only and not for purposes of limitation. Descriptions of features or aspects within each embodiment should typically be considered as available for other similar features or aspects in other embodiments.

What is claimed is:

1. A pyrene-based compound represented by Formula 1; or a pyrene-based compound being one of Compounds 5, 7, 15, 17, 36, 37, and 45 below:

Formula 1

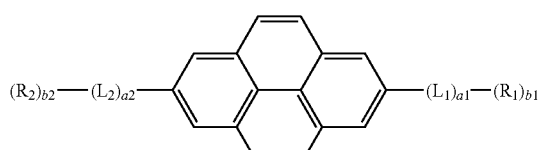

5

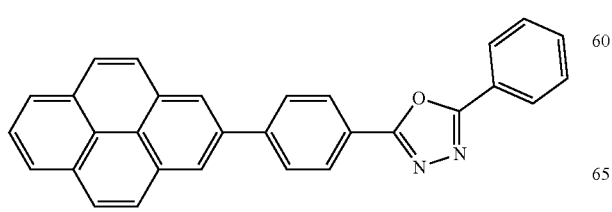

-continued

7

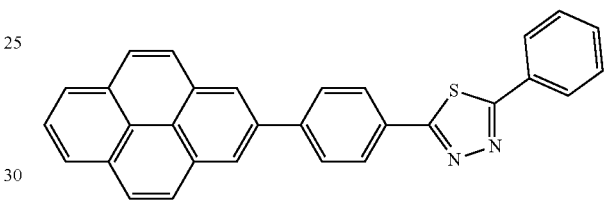

15

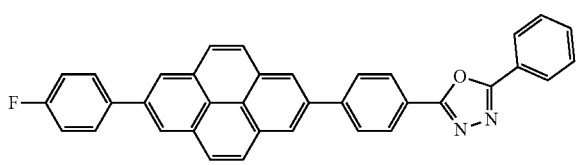

17

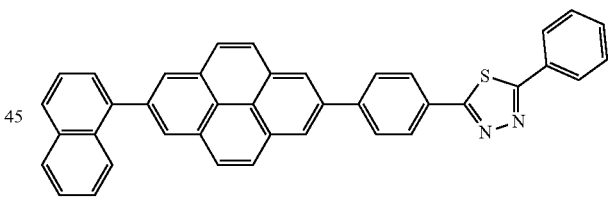

36

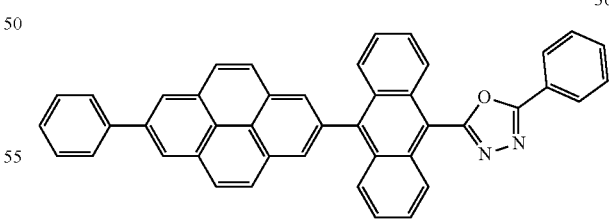

-continued

37

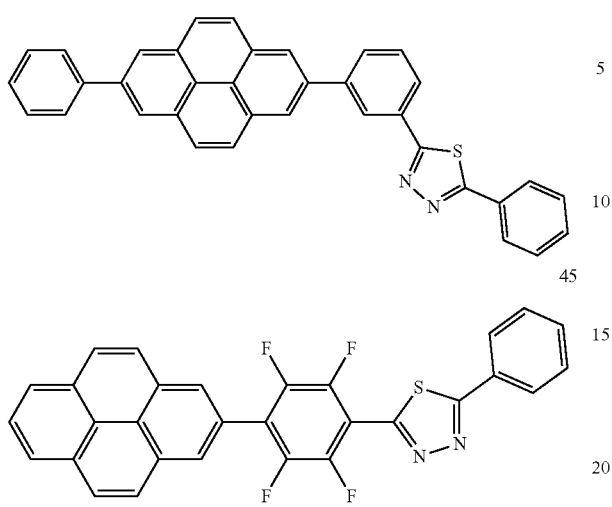

45 wherein, in Formula 1,

L1 and L2 are each independently selected from a phenylene group, a pentalenylene group, an indenylene group, a naphthylene group, an azulenylene group, a heptalenylene group, an indacenylene group, an acenaphthylene group, a fluorenylene group, a spiro-fluorenylene group, a phenalenylene group, a phenanthrenylene group, an anthrylene group, a fluoranthenylene group, a triphenylenylene group, a pyrenylene group, a chrysenylene group, a naphthacenylene group, a picenylene group, a perylenylene group, a pentaphenylene group, a hexacenylene group, a pyrrolylene group, an imidazolylene group, a pyrazolylene group, a pyridinylene group, a pyrazinylene group, a pyrimidinylene group, a pyridazinylene group, an isoindolylene group, an indolylene group, an indazolylene group, a purinylene group, a quinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzooxazolylene group, a furanylene group, a benzofuranylene group, a thiophenylene group, a benzothiophenylene group, a thiazolylene group, an isothiazolylene group, a benzothiazolylene group, an isoxazolylene group, an oxazolylene group, a tetrazolylene group, a triazinylene group, a benzooxazolylene group, a benzocarbazolylene group, and a dibenzosilolylene group; each optionally substituted with at least one selected from a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group, a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof, a $C_6$-$C_{20}$ aryl group, and a $C_6$-$C_{20}$ aryl group each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a pyridinyl group, a pyrimidinyl group, a pyrazinyl group, a pyridazinyl group, a triazinyl group, a quinolinyl group, and an isoquinolinyl group;

$R_1$ is one of the groups represented by Formulae 4-1(3), 4-2(1), 4-4(2), 4-4(3), 4-6(1), and 4-6(2):

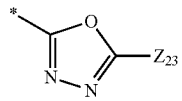

Formula 4-1(1)

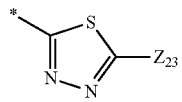

Formula 4-1(2)

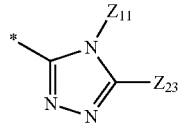

Formula 4-1(3)

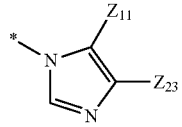

Formula 4-2(1)

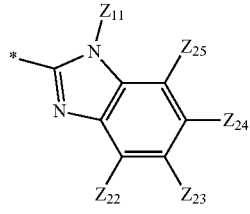

Formula 4-4(1)

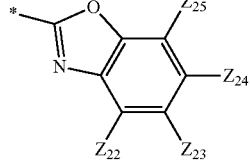

Formula 4-4(2)

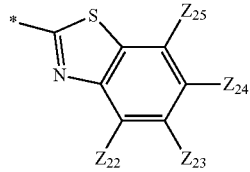

Formula 4-4(3)

-continued

Formula 4-6(1)

Formula 4-6(2)

Formula 4-8(1)

wherein, in Formulae 4-1(3), 4-2(1), 4-4(2), 4-4(3), 4-6(1), and 4-6(2), $Z_{11}$ and $Z_{21}$ and $Z_{21}$ to $Z_{26}$ are each independently selected from a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group, a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof, a phenyl group, a naphthyl group, an anthryl group, a fluorenyl group, a pyridinyl group, a pyrimidinyl group, a pyrazinyl group, a pyridazinyl group, a triazinyl group, a quinolinyl group, and an isoquinolinyl group, a phenyl group, a naphthyl group, an anthryl group, a fluorenyl group, a pyridinyl group, a pyrimidinyl group, a pyrazinyl group, a pyridazinyl group, a triazinyl group, a guinolinyl group, and an isoguinolinyl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a pyridinyl group, a pyrimidinyl group, a pyrazinyl group, a pyridazinyl group, a triazinyl group, a quinolinyl group, and an isoquinolinyl group, and —Si($Q_{13}$)($Q_{14}$)($Q_{15}$) (where $Q_{13}$ to $Q_{15}$ are each independently a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a pyridinyl group, a pyrimidinyl group, a pyrazinyl group, a pyridazinyl group, a triazinyl group, a quinolinyl group, or an isoquinolinyl group);

$R_2$ is selected from a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group, a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof, a phenyl group, a naphthyl group, an anthryl group, a fluorenyl group, a pyridinyl group, a pyrimidinyl group, a pyrazinyl group, a pyridazinyl group, a triazinyl group, a quinolinyl group, an isoquinolinyl group, a quinoxalinyl group, a phenyl group, a naphthyl group, an anthryl group, a fluorenyl group, a pyridinyl group, a pyrimidinyl group, a pyrazinyl group, a pyridazinyl group, a triazinyl group, a quinolinyl group, an isoquinolinyl group, a quinoxalinyl group, a dibenzopuranyl group, and a dibenzothiophenyl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a pyridinyl group, a pyrimidinyl group, a pyrazinyl group, a pyridazinyl group, a triazinyl group, a quinolinyl group, and an isoquinolinyl group, and $^-$Si($Q_3$)($Q_4$)($Q_5$), wherein $Q_3$ to $Q_5$ are each independently a $C_1$-$C_{20}$ alkyl group, a alkoxy group, a phenyl group, a naphthyl group, an anthryl group, a fluorenyl group, a dimethylfluorenyl group, a diphenylfluorenyl group, a pyridinyl group, a pyrimidinyl group, a pyrazinyl group, a pyridatinyl group, a triatinyl group, a quinolinyl group, or an isoquinolinyl group;

a1 and b1 are each independently an integer from 1 to 5; and a2 and b2 are each independently an integer from 0 to 5.

2. The pyrene-based compound of claim 1, wherein L1 and L2 are each independently one of the groups represented by the following Formulae below:

Formula 2-1

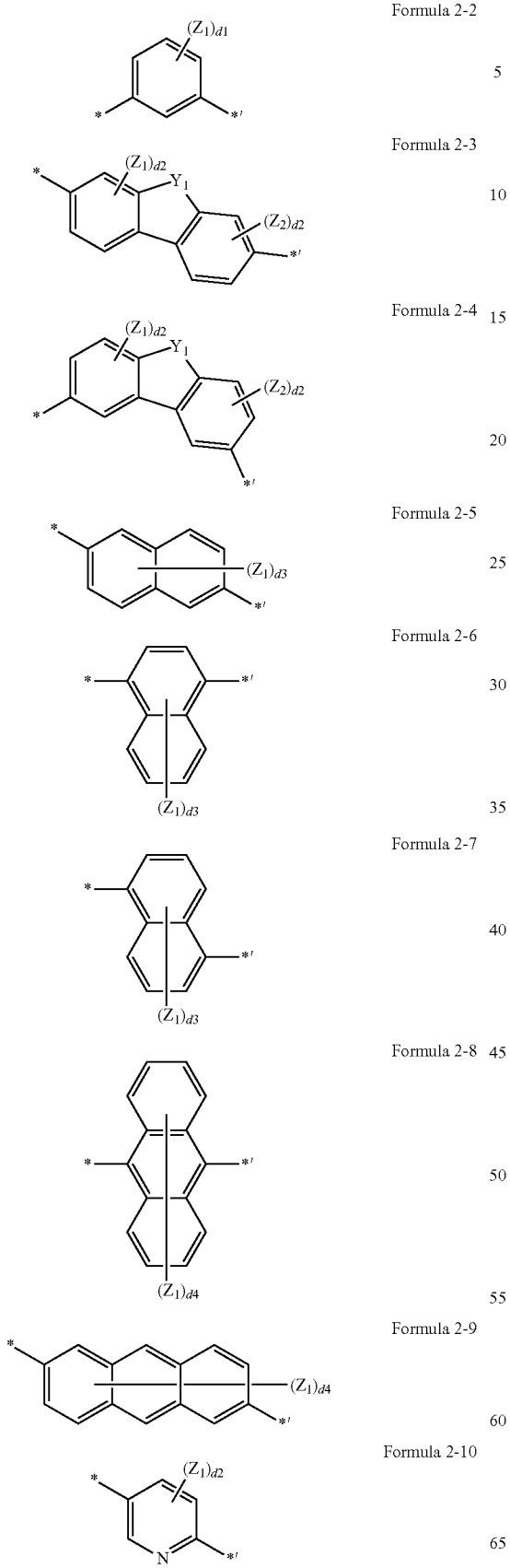
Formula 2-2
Formula 2-3
Formula 2-4
Formula 2-5
Formula 2-6
Formula 2-7
Formula 2-8
Formula 2-9
Formula 2-10
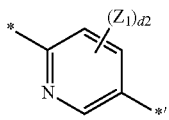 Formula 2-11
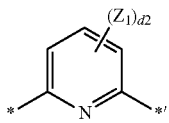 Formula 2-12
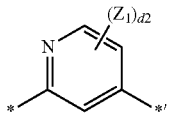 Formula 2-13
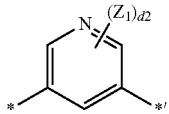 Formula 2-14
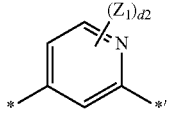 Formula 2-15
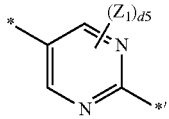 Formula 2-16
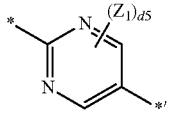 Formula 2-17
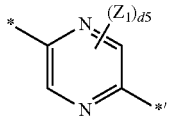 Formula 2-18
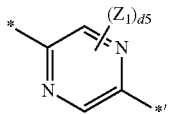 Formula 2-19
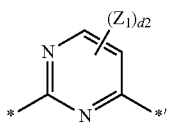 Formula 2-20
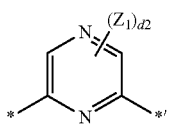 Formula 2-21
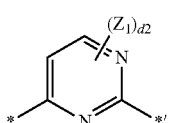 Formula 2-22

Formula 2-23

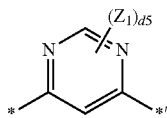

Formula 2-24

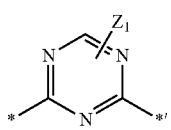

Formula 2-25

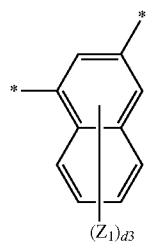

wherein,
$Y_1$ is $C(Z_3)(Z_4)$;
$Z_1$ to $Z_5$ are each independently selected from
a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group,
a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof,
a $C_6$-$C_{20}$ aryl group and a $C_2$-$C_{20}$ heteroaryl group,
a $C_6$-$C_{20}$ aryl group and a $C_2$-$C_{20}$ heteroaryl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group,
a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a pyridinyl group, a pyrimidinyl group, a pyrazinyl group, a pyridazinyl group, a triazinyl group, a quinolinyl group, and an isoquinolinyl group, and
—Si$(Q_{13})(Q_{14})(Q_{15})$ (where $Q_{13}$ to $Q_{15}$ are each independently a $C_1$-$C_{20}$ alkyl group, a $C_1$-$C_{20}$ alkoxy group, a $C_6$-$C_{20}$ aryl group, or a $C_2$-$C_{20}$ heteroaryl group);
d1 is an integer from 1 to 4;
d2 is an integer from 1 to 3;
d3 is an integer from 1 to 6;
d4 is an integer from 1 to 8;
d5 is 1 or 2;
* indicates a binding site of pyrene in Formula 1 or a binding site of adjacent $L_1$; and
*' indicates a binding site of adjacent Li in Formula 1 or a binding site of $R_1$.

3. The pyrene-based compound of claim 1, wherein L1 and L2 are each independently one of the groups represented by Formulae 3-1 to 3-12 and 3-14 to 3-15 below:

Formula 3-1

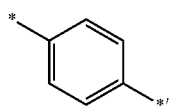

Formula 3-2

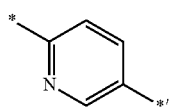

Formula 3-3

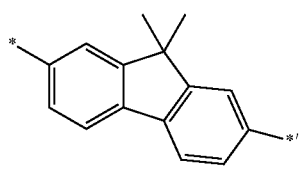

Formula 3-4

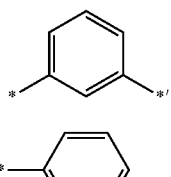

Formula 3-5

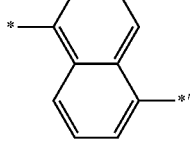

Formula 3-6

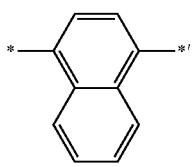

Formula 3-7

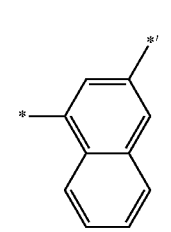

Formula 3-8

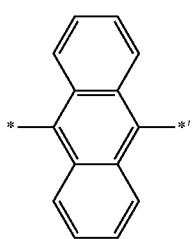

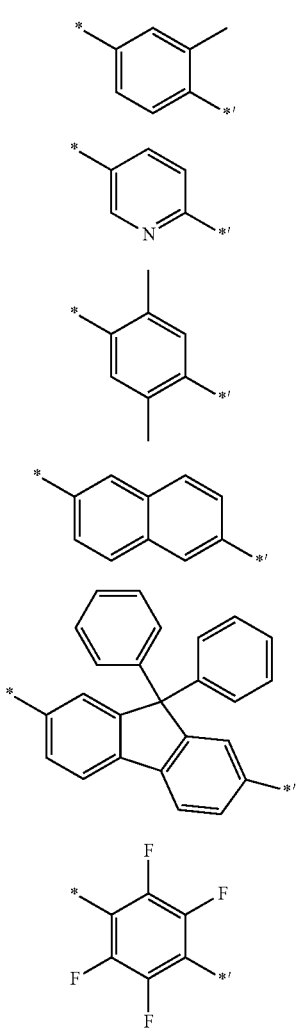

Formula 3-9
Formula 3-10
Formula 3-11
Formula 3-12
Formula 3-14
Formula 3-15 wherein, in Formulae 3-1 to 3-12 and 3-14 to 3-15, * indicate a binding site of pyrene in Formula 1 or a binding site of adjacent $L_1$; and
*' indicates a binding site of adjacent Li in Formula 1 or a binding site of $R_1$.

4. The pyrene-based compound of claim 1, wherein R2 is selected from
a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group,
a $C_1$-$C_{20}$ alkyl group and a $C_1$-$C_{20}$ alkoxy group, each substitute with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof,
groups represented by Formulae 5-1 to 5-10, 5-12, 5-14, 5-21 and 5-22 below, and
—Si($Q_3$)($Q_4$)($Q_5$), wherein $Q_3$ to $Q_5$ are each independently a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a pyridinyl group, a pyrimidinyl group, a pyrazinyl group, a pyridazinyl group, a triazinyl group, a quinolinyl group, or an isoquinolinyl group,

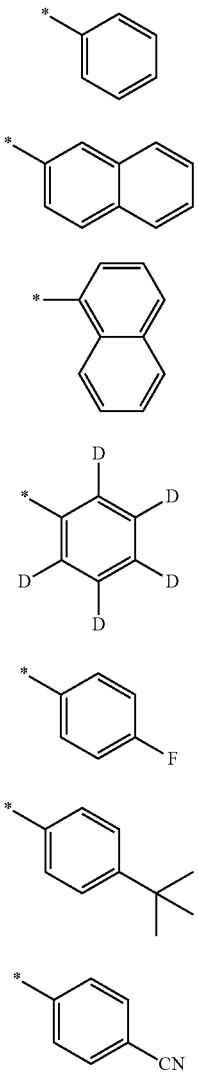

Formula 5-1
Formula 5-2
Formula 5-3
Formula 5-4
Formula 5-5
Formula 5-6
Formula 5-7
Formula 5-8
Formula 5-9

Formula 5-10

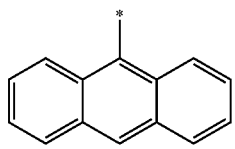

Formula 5-12

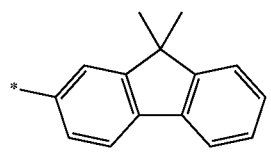

Formula 5-22

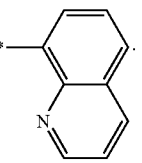

5. The pyrene-based compound of claim 1, wherein $L_1=L_2$, $a1=a2$, and $b1=b2$.

6. A pyrene-based compound having one of the below structures:

8

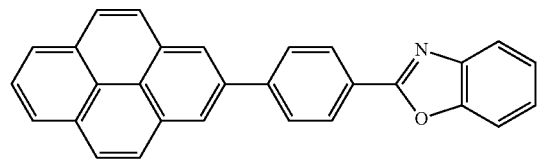

16

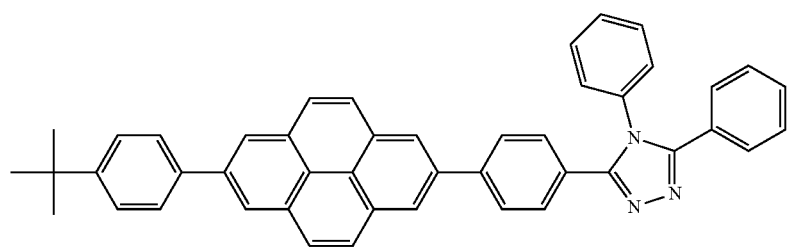

18

19

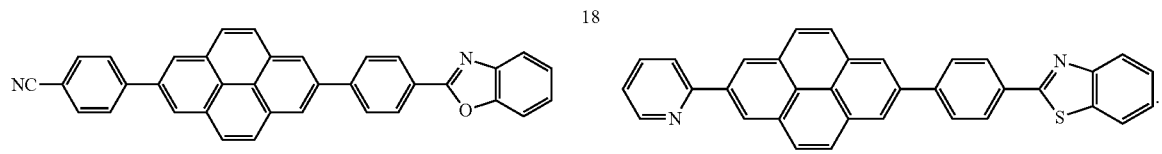

-continued

Formula 5-14

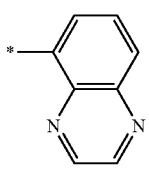

Formula 5-21

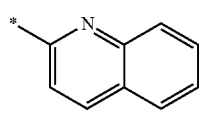

7. An organic light-emitting diode comprising: a first electrode; a second electrode disposed opposite to the first electrode; and an organic layer disposed between the first electrode and the second electrode and comprising an emission layer, wherein the organic layer comprises a hole transport region between the first electrode and the emission layer, and an electron transport region between the emission layer and the second electrode, and the organic layer comprises at least one of the pyrene-based compounds of Formula 1 of claim 1.

8. The organic light-emitting diode of claim 7, wherein the hole transport region comprises at least one of a hole injection layer, a hole transport layer, a functional layer having both hole injection and hole transport capabilities, a buffer layer, and an electron blocking layer; wherein the electron transport region comprises at least one of a hole blocking layer, an electron transport layer, and an electron injection layer; and the pyrene-based compound is in the electron transport region.

9. The organic light-emitting diode of claim 8, wherein the electron transport region comprises an electron transport layer, and the pyrene-based compound is in the electron transport layer.

10. The organic light-emitting diode of claim 9, wherein the electron transport layer further comprises a metal-containing material.

11. The organic light-emitting diode of claim 7, wherein the pyrene-based compound is in the emission layer.

12. The organic light-emitting diode of claim 7, wherein the hole transport region comprises a charge-generating material.

\* \* \* \* \*